United States Patent
Shiozaki et al.

(10) Patent No.: US 6,472,248 B2
(45) Date of Patent: Oct. 29, 2002

(54) MICROCRYSTALLINE SERIES PHOTOVOLTAIC ELEMENT AND PROCESS FOR FABRICATION OF SAME

(75) Inventors: Atsushi Shiozaki; Masafumi Sano; Toshimitsu Kariya, all of Kyoto-fu; Takaharu Kondo, Kyotanabe; Makoto Higashikawa, Nara; Koichi Matsuda, Kyotanabe, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/758,345

(22) Filed: Jan. 12, 2001

(65) Prior Publication Data

US 2001/0051388 A1 Dec. 13, 2001

Related U.S. Application Data

(63) Continuation-in-part of application No. 09/617,226, filed on Jul. 14, 2000, now abandoned.

(30) Foreign Application Priority Data

Jul. 4, 1999 (JP) .......................... 11-0199846
Jun. 12, 2000 (JP) ........................ 2000-175984

(51) Int. Cl.[7] .......................... H01L 21/00; H01L 31/00
(52) U.S. Cl. .......................... 438/97; 136/258
(58) Field of Search ................ 136/252, 255, 136/258, 261; 438/57, 69, 71, 72, 96, 97, 98

(56) References Cited

U.S. PATENT DOCUMENTS

| | | | |
|---|---|---|---|
| 5,336,335 A | 8/1994 | Hall et al. | 136/258 |
| 5,677,236 A | 10/1997 | Saitoh et al. | 437/109 |
| 5,913,986 A | 6/1999 | Matsuyama | 136/255 |
| 6,043,427 A | 3/2000 | Nishimoto | 136/258 |
| 6,111,191 A * | 8/2000 | Hall et al. | |
| 6,177,711 B1 | 1/2001 | Kariya | 257/458 |
| 6,303,945 B1 * | 10/2001 | Saito et al. | |
| 2002/0011264 A1 * | 1/2002 | Saito | |

FOREIGN PATENT DOCUMENTS

EP    0 860 885    8/1998

OTHER PUBLICATIONS

K. Yamamoto, et al., "Enhancement of Optical Absorption for Below 5 μm–Thin Film Poly–Si Solar Cell with STAR Structure on Glass Substrate", 14th Eur. Photovoltaic. Spec. Conf., Barcelona, Spain, pp. 1018–1021 (1997).

K. Yamamoto, et al., "Thin–Film Polycrystalline Si Solar Cell on Glass Substrate Fabricated by a Novel Low Temperature Process", Jpn. J. Appl. Phys., vol. 33, pp. L1751–L1754 (1994).

J. Meier, et al., "On the Way Towards High Efficiency Thin Film Silicon Solar Cells by the 'Micromorph' Concept", Mat. Res. Soc. Symp. Proc., vol. 420, pp. 3–14 (1996).

* cited by examiner

Primary Examiner—Keith Christianson
(74) Attorney, Agent, or Firm—Fitzpatrick, Cella, Harper & Scinto

(57) ABSTRACT

A photovoltaic element having a stacked structure comprising a first semiconductor layer containing no crystalline phase, a second semiconductor layer containing approximately spherical microcrystalline phases, and a third semiconductor layer containing pillar microcrystalline phases which are stacked in this order, wherein said spherical microcrystalline phases of said second semiconductor layer on the side of said third semiconductor layer have an average size which is greater than that of said spherical microcrystalline phases of said second semiconductor layer on the side of said first semiconductor layer.

31 Claims, 12 Drawing Sheets

F I G. 11
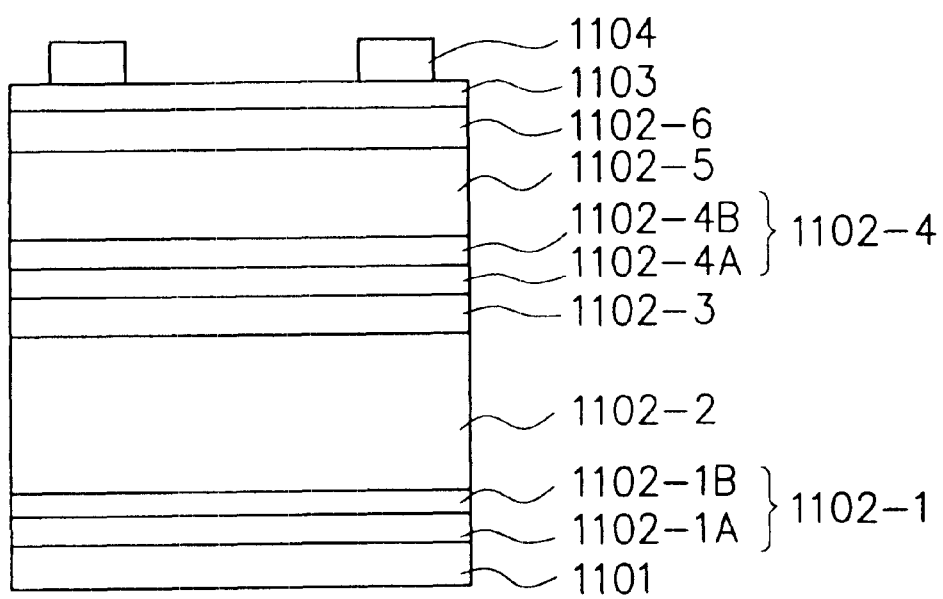

F I G. 12
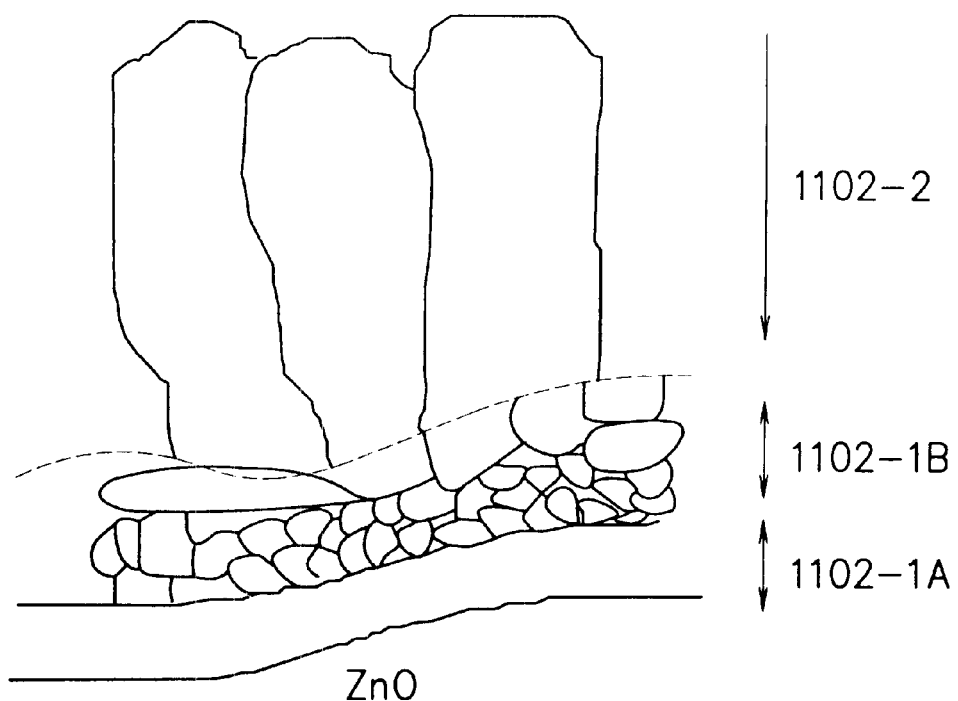

MICROCRYSTALLINE SERIES PHOTOVOLTAIC ELEMENT AND PROCESS FOR FABRICATION OF SAME

This application is a continuation-in-part of application Ser. No. 09/617,226 filed Jul. 14, 2000, now abandoned.

BACKGROUND OF THE INVENTION

1. Field of the Invention

The present invention relates to a microcrystalline series photovoltaic element having a high photoelectric conversion efficiency and which enables one to produce a high performance semiconductor device, representatively such as a high performance solar cells a high performance photosensor, or the like, where particularly said solar cell stably exhibits solar cell characteristics without being deteriorated even when continuously used outdoors over a long period of time. The present invention also relates a process for producing said photovoltaic element. The present invention further relates to a building material in which said photovoltaic element is used and a sunlight power generation apparatus in which said photovoltaic element is used.

2. Related Background Art

Various photovoltaic elements have been using not only as independent power sources of electrical equipments but also as alternate energy sources of daily power supply systems. However, for the photovoltaic elements used as alternate energy sources of daily power supply systems, they are still unsatisfactory particularly in terms of their cost per a unit quantity of generated power. In this connection, various studies have been conducting in order to develop improved photovoltaic elements. For instance, particularly with respect to the materials which play the most important role in photoelectric conversion, technical research and development of crystalline type photovoltaic elements, thin film type photovoltaic elements, and the like have been carrying out. The crystalline type photovoltaic element is meant a photovoltaic element having a photoelectric conversion member comprising a single crystalline silicon semiconductor material or a polycrystalline silicon semiconductor material. The thin film type photovoltaic element is meant a photovoltaic element having a photoelectric conversion member comprising an amorphous silicon-containing semiconductor material such as an amorphous silicon semiconductor material and an amorphous silicon-germanium semiconductor material; a microcrystalline silicon-containing semiconductor material such as a microcrystalline silicon semiconductor material and a microcrystalline silicon-germanium semiconductor material; an amorphous or microcrystalline silicon carbide semiconductor material; or a compound semiconductor material. For such microcrystalline silicon-containing semiconductor material, although various studies have been made, its reduction to practical use has not progressed as in the case of the crystalline or amorphous semiconductor materials.

Now, attention has been focused on a report by J. Meier et als., stating that a photovoltaic element (a solar cell) in which a microcrystalline silicon ($\mu$c-Si) semiconductor material is used exhibits a good photoelectric conversion efficiency and is free of light-induced degradation [see, J. Meier et als., *Mat. Res. Soc. Symp. Proc.,* vol 420. pp. 3–14, 1996 (hereinafter referred to as "document 1")]. In document 1, there are described that said photovoltaic element (solar cell) was prepared by a high frequency plasma CVD process wherein glow discharge is caused in an atmosphere composed of silane gas diluted with a large amount of hydrogen gas ($H_2$) by supplying a VHF (very high frequency) power with a frequency of 70 MHz therein and that the photovoltaic element is structured to have a p-i-n junction where the i-type semiconductor layer comprises a $\mu$c-Si semiconductor material. Document 1 describes that the photovoltaic element afforded a photoelectric conversion efficiency of 7.7%, and no light-induced degradation was observed for the photovoltaic element Document 1 also describes that a stacked type photovoltaic element (solar cell) prepared by stacking a $\mu$c-Si semiconductor material and another $\mu$c-Si semiconductor material was found to have an initial photoelectric conversion efficiency of 13.1% and a relative light-induced degradation of 12.4%.

Besides, in K. Yamamoto et als., *Jpn. J. Appl. Phys.* vol. 33 (1994), pp. L1751–L1754, Part 2, No. 12B, Dec. 15, 1994 (hereinafter referred to as "document 2"), there is described a photovoltaic element (a solar cell) having a polycrystalline layer formed by subjecting a heavily boron-doped a-Si (amorphous silicon) p-type layer to excimer laser annealing and a pillar-like $\mu$c-Si structure formed by way of plasma CVD on said polycrystalline layer.

However, the photovoltaic elements disclosed in documents 1 and 2 have such disadvantages as will be mentioned below.

Particularly, with reference to the description of document 1, it is understood that no light-induced degradation is observed for the microcrystalline photovoltaic elements disclosed therein. However, for the photovoltaic element for which no light-induced degradation was observed, it is understood that the $\mu$c-Si active layer is of a thickness of 3.6 $\mu$m which is relatively thick and that the short-circuit current of the photovoltaic element is 25.4 mA/cm$^2$ and the photoelectric conversion efficiency thereof is 7.7% which is undesirably small. And it is also understood that in the formation of the $\mu$c-Si active layer with such large thickness of 3.6 $\mu$m, since the deposition rate is 1.2 Å/sec which is slow, it takes about 8 hours in order to complete the formation thereof. In addition, for the stacked type microcrystalline photovoltaic element disclosed in document 1, although the initial photoelectric conversion efficiency thereof is 13.1% which is satisfactory, the photovoltaic element unavoidably suffers light-induced degradation upon repeated use where the initial photoelectric conversion efficiency is eventually deteriorated. And it obviously takes a long time for the preparation of the stacked type microcrystalline photovoltaic element.

With reference to the description of document 2, it is understood that the $\mu$c-Si active layer of the photovoltaic element is of a thickness of 2 $\mu$m, the short-circuit current of the photovoltaic element is 14.3 mA/cm$^2$, and the photoelectric conversion efficiency thereof is 2.5% which is extremely small.

Separately, four persons of the group who reported document 2 jointly have developed the technique disclosed in document 2 and reported a thin film polycrystalline photovoltaic element (solar cell) formed by way of plasma CVD in which the active layer has a thickness of 3.5 $\mu$m and which has a short-circuit current of 26.12 mA/cm$^2$ and a photoelectric conversion efficiency of 9.8% (see, Kenji Yamamoto et als., *14th European Photovoltaic Solar Energy Conference,* Barcelona. Spain, Jun. 30–Jul. 4, 1997, pp. 1018–1021). However, the photovoltaic element reported is still insufficient particularly in terms of the photoelectric conversion efficiency and the productivity.

Independently, it is known that a silicon thin film exhibiting crystalline properties may be grown from liquid phase by way of a casting method or the like. However, this method is disadvantageous in that high temperature treatment is required and that the method is not satisfactory particularly in terms of the productivity and production cost.

Besides, Japanese Unexamined Patent publication No. 109638/1993 discloses a method of forming a polycrystalline silicon film by subjecting an amorphous silicon film to a heat treatment so as to cause solid phase epitxaxy. Particularly, this publication describes a method in that a doped amorphous silicon film doped with P and a non-doped amorphous silicon film are sequentially formed on a substrate by means of a plasma CVD method, followed by subjecting to a heat treatment at about 600° C. for several tens hours, where the doped amorphous silicon film is polycrystallized to have a grain size of more than several microns ($\mu$m) and along with this, the non-doped amorphous silicon film is also polycrystallized to have a grain size of more than several microns ($\mu$m), whereby a polycrystalline film is obtained. Japanese Unexamined Patent publication No. 136062/1993 discloses a method of forming a polycrystalline silicon film by repeating a step of forming a silicon film and exposing said amorphous silicon film to hydrogen plasma.

However, any of these methods is disadvantageous. That is, in the method described in the former publication, when a polycrystalline silicon semiconductor film having a thickness of more than several microns ($\mu$m) is intended to form, it is necessary to conduct heat treatment for a long period of time because crystal growth takes place by way of solid phase reaction. Similarly, when a polycrystalline silicon semiconductor film having a thickness of more than several microns ($\mu$m) is intended to form by the method described in the latter publication, the processing time for the formation of said semiconductor film is unavoidably prolonged because the step of forming a silicon film and exposing said amorphous silicon film to hydrogen plasma is repeated many times.

SUMMARY OF THE INVENTION

An principal object of the present invention is to eliminate the foregoing disadvantages in the prior art and to provide an improved microcrystalline series photovoltaic element which generates a large quantity of electric current and exhibits a high photoelectric conversion efficiency and a process for effectively producing said photovoltaic element.

Another object of the present invention is to provide an improved microcrystalline series photovoltaic element which exhibits a satisfactory photoelectric conversion efficiency even when the semiconductor layer is relatively thin and where the semiconductor layer can be formed at a high deposition rate, and which can be efficiently produced at low temperature and at a reasonable production cost, and a process for producing said photovoltaic element.

A further object of the present invention is to provide an improved microcrystalline series photovoltaic element which is stably exhibits excellent photovoltaic characteristics even when continuously used under sever environmental conditions over a long period of time, a process for producing said photovoltaic element, a building material in which said photovoltaic element is used, and a sunlight power generation apparatus in which said photovoltaic element is used.

A further object of the present invention is to provide, as aforesaid photovoltaic element, a microcrystalline series photovoltaic element having a stacked structure comprising a first semiconductor layer containing no crystalline phase therein, a second semiconductor layer containing approximately spherical microcrystalline phases, and a third semiconductor layer containing pillar microcrystalline phases which are stacked in this order, wherein the spherical microcrystalline phases of the second semiconductor layer on the side of the third semiconductor layer have an average size which is greater than that of those on the side of the first semiconductor layer and if necessary, the third semiconductor layer may have a layer region containing approximately spherical microcrystalline phases and pillar microcrystalline phases in a mixed state in the vicinity of the second semiconductor layer.

In the present invention, the term "microcrystalline phase" is meant a microcrystalline particle. The term "approximately spherical microcrystalline phase" is meant a microcrystalline particle shaped in an approximately spherical form including a polyhedral spherical form or the like. The "size of the approximately spherical microcrystalline phase" is meant a diameter of said approximately spherical microcrystalline particle. The term "pillar microcrystalline phase" is meant a microcrystalline particle shaped in a pillar form.

The present invention still makes it an object to provide a photovoltaic element having excellent photo-electric characteristics, which can be formed at a film-forming speed with a processing time of industrially practical level and at a reasonable cost.

A further object of the present invention is to provide a photovoltaic element comprising at least a first transparent electrically conductive layer formed on a substrate, a silicon series semiconductor layer having at least one p-i-n junction stacked on said first transparent electrically conductive layer, and a second transparent electrically conductive layer stacked on said silicon series semiconductor layer, characterized in that said silicon series semiconductor layer has a p-i-n junction structure which comprises a primary layer comprising an amorphous semiconductor layer having a first conduction type and a semiconductor layer containing crystalline phases (hereinafter referred to as "crystalline phase-containing semiconductor layer) and having a first conduction type sequentially stacked, a crystalline phase-containing i-type semiconductor layer, and a non-single crystal semiconductor layer having a second conduction type which are sequentially stacked, wherein the crystalline phase-containing semiconductor layer having the first conduction type contains crystalline phases (crystalline particles) such that their size magnitude is increased toward the crystalline phase-containing i-type semiconductor layer.

A further object of the present invention is to provide a process for producing the above-described photovoltaic element.

The primary layer is preferred to be formed such that a doped amorphous layer (that is, an amorphous layer doped with a prescribed dopant) and a non-doped amorphous layer are sequentially stacked to for a two-layered structure, and the two-layered structure is subjected to crystallization treatment, where part of the amorphous layer of the two-layered structure is crystallized. In this case, it is possible that part of the doped amorphous layer of the two-layered structure is crystallized. The crystallization treatment may be a laser radiation treatment or heat treatment.

In any case, the primary layer is preferred to have a Raman scattering intensity owing to the amorphous component thereof which is smaller than that owing to the crystalline component thereof.

It is preferred that the dopant concentration of the primary layer is decreased toward the crystalline phase-containing i-type semiconductor layer.

It is preferred to make the primary layer such that when the thickness of the crystalline phase-containing semiconductor layer having the first conduction type is made to be "d" and of the crystalline phases (crystalline particles) contained in said semiconductor layer, the length of a crystalline phase portion whose length being the longest is made to be "r", the value of r/d is less than 100.

It is preferred that the silicon series semiconductor layer is formed by means of a plasma CVD method using a high frequency power with a frequency preferably in a range of 10 MHz to 10 GHz.

It is preferred that the substrate comprises an electrically conductive substrate.

BRIEF DESCRIPTION OF THE DRAWINGS

FIG. 11 is a schematic cross-sectional view illustrating a further example of a photovoltaic element according to the present invention.

FIG. 12 is a schematic profile observed by TEM (transmission electron microscope) of an example of a silicon series semiconductor layer in the present invention.

DESCRITION OF THE INVENTION AND PREFERRED EMBODIMENTS

Figure 1:
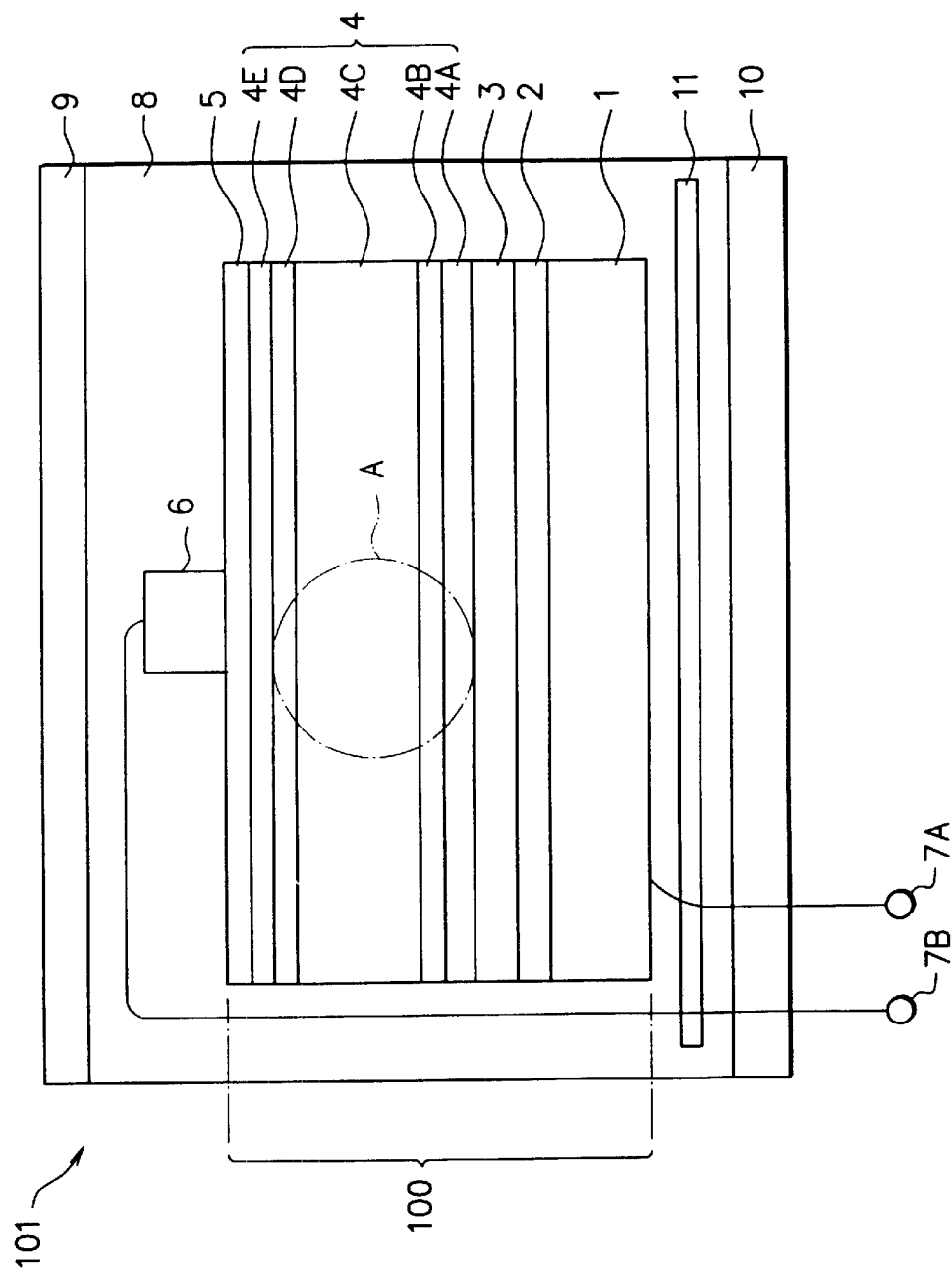
FIG. 1 is a schematic cross-sectional view illustrating an example of a photovoltaic element according to the present invention.

The present invention eliminates the foregoing disadvantages found in the prior art and attains the above described objects.

As previously described, a first aspect of the present invention is to provide a microcrystalline series photovoltaic element which is stably exhibits excellent photovoltaic characteristics even when continuously used under sever environmental conditions over a long period of time.

The photovoltaic element provided according to the present invention typically has a stacked structure comprising a first semiconductor layer containing no crystalline phase, a second semiconductor layer containing approximately spherical microcrystalline phases, and a third semiconductor layer containing pillar microcrystalline phases which are stacked in this order, wherein said spherical microcrystalline phases of said second semiconductor layer on the side of said third semiconductor layer have an average size which is greater than that of said spherical microcrystalline phases of said second semiconductor layer on the side of said first semiconductor layer. If necessary, it is possible for the third semiconductor layer to have a layer region containing approximately spherical microcrystalline phases and pillar microcrystalline phases in a mixed state in the vicinity of the second semiconductor layer.

Any of the semiconductor layer containing no crystalline phase and the semiconductor layer containing microcrystalline phases may principally comprises a hydrogen-containing silicon (Si) material, a hydrogen-containing silicon-germanium (Si—Ge) material, a hydrogen-containing silicon carbide (SiC) material, or a mixture of these.

A second aspect of the present invention is to provide a process for producing said photovoltaic element The process typically comprises the steps of: (a) forming a first semiconductor layer which contains no crystalline phase but contains a desired amount of a doping element on a substrate, (b) forming a second semiconductor layer which contains no crystalline phase and contains no doping element or a trace amount of a doping element on said first semiconductor layer to obtain a layered product, (c) laser-annealing said layered product from the second semiconductor layer side by way of irradiation of laser beam to microcrystallize only the second semiconductor layer so as to contain approximately spherical microcrystalline phases such that said spherical microcrystalline phases situated on the laser-irradiated side have an average size which is greater than that of said spherical microcrystalline phases situated on the first semiconductor layer side, and (d) forming a third semiconductor layer containing pillar microcrystalline phases on said microcrystallized second semiconductor layer.

In the above process, the method of forming the microcrystallized second semiconductor layer by means of the laser-annealing may be replaced by a method wherein the second semiconductor layer is formed by way of plasma CVD using a given raw material gas while diluting said raw material gas with hydrogen gas ($H_2$), and in the course of forming the second semiconductor layer, the dilution ratio of the raw material gas with the hydrogen gas is increased, whereby the second semiconductor layer is formed to contain approximately spherical microcrystalline phases such that said spherical microcrystalline phases situated on the third semiconductor layer side has an average size which is greater than that of said spherical microcrystalline phases situated on the first semiconductor layer side.

Besides, the method of forming the microcrystallized second semiconductor layer by means of the laser-annealing may be replaced by a method wherein the second semiconductor layer is formed by way of plasma CVD using a given raw material gas while diluting said raw material gas with hydrogen gas ($H_2$), and in the course of forming the second semiconductor layer, the substrate temperature is increased, whereby the second semiconductor layer is formed to contain approximately spherical microcrystalline phases such that said spherical microcrystalline phases situated on the third semiconductor layer side has an average size which is greater than that of said spherical microcrystalline phases situated on the first semiconductor layer side.

A third aspect of the present invention is to provide a building material comprising aforesaid photovoltaic element integrally sealed by a sealing material including a back face reinforcing material.

A fourth aspect of the present invention is to provide a sunlight power generation apparatus comprising aforesaid photovoltaic element and a power converting means for converting a power generated by said photovoltaic element into a prescribed power.

In the following, the present invention will be described in more detail with reference to the drawings.

Figure 2:
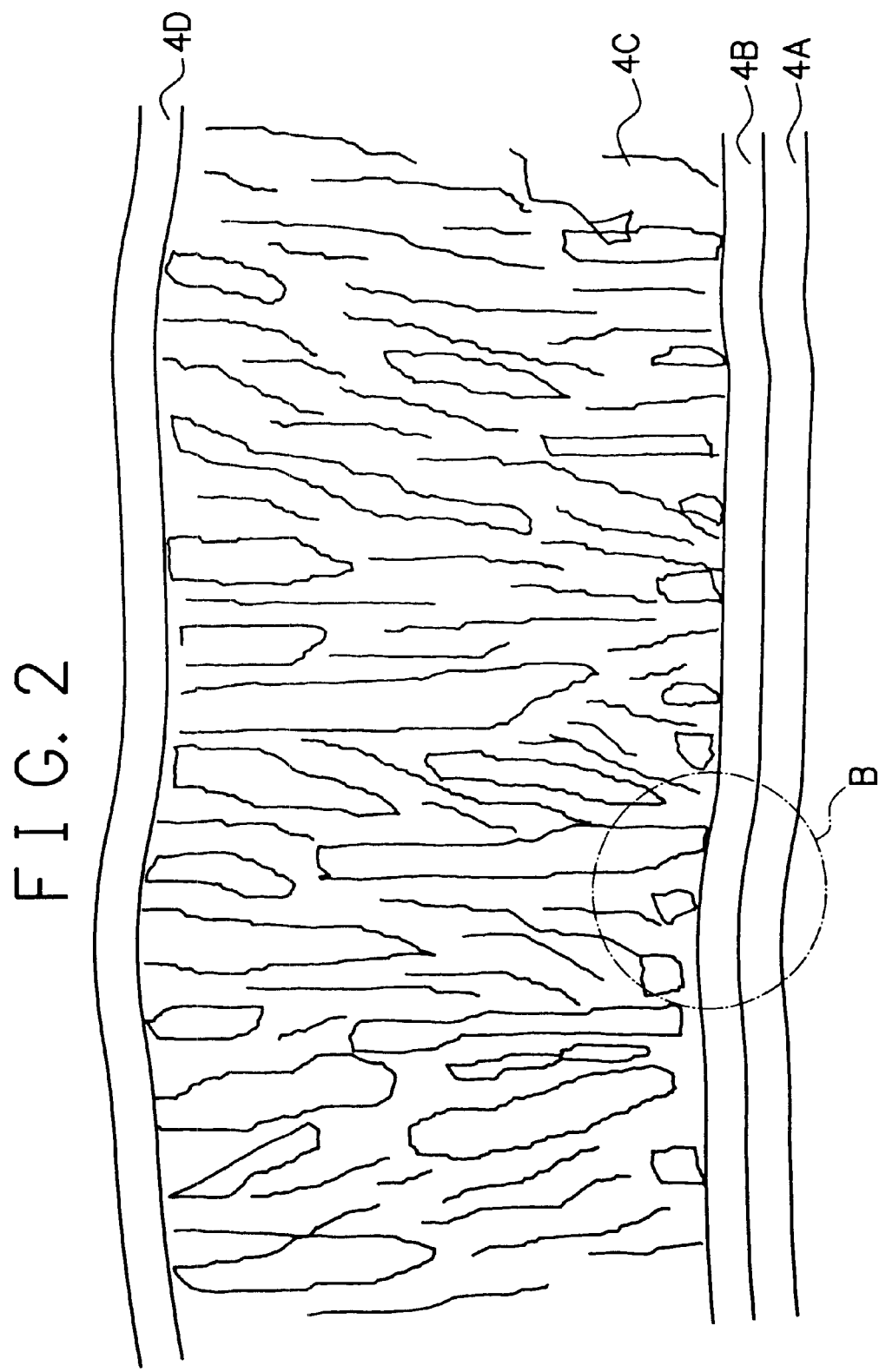
FIG. 2 is a schematically enlarged view of a portion A in FIG. 1.
Figure 3:
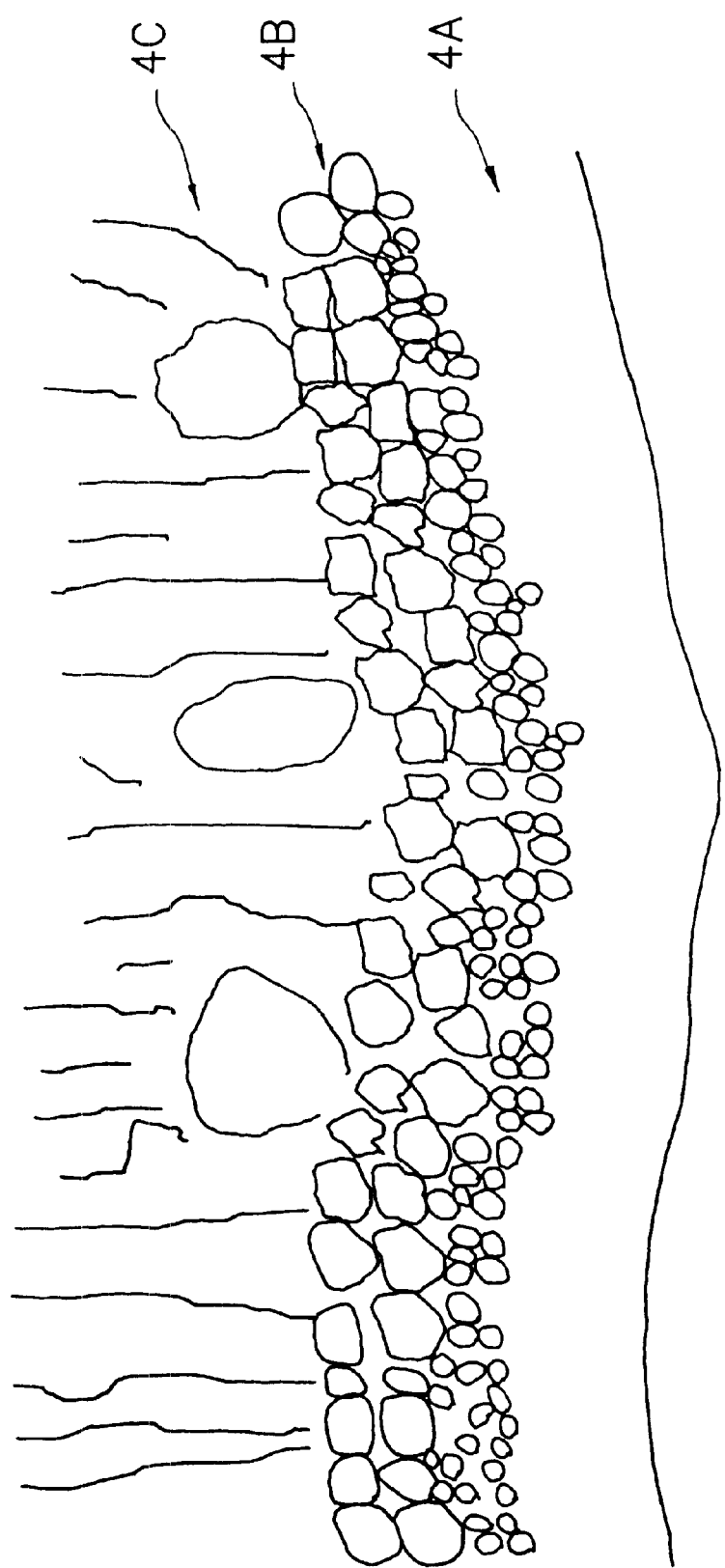
FIG. 3 is a schematically enlarged view of a portion B in FIG. 2.
Figure 4:
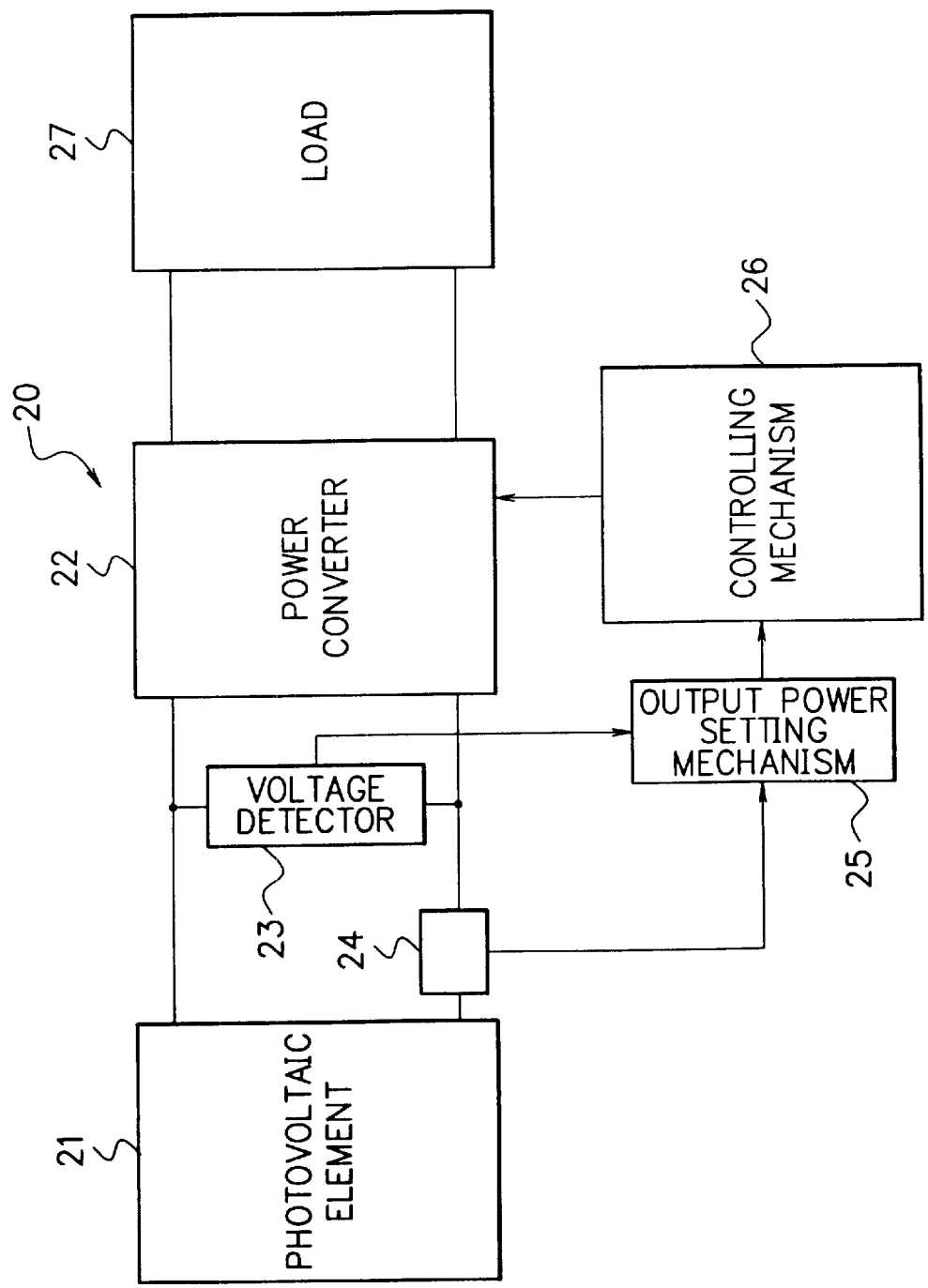
FIG. 4 is a schematic block diagram illustrating an example of a sunlight power generation apparatus according to the present invention.
Figure 5:
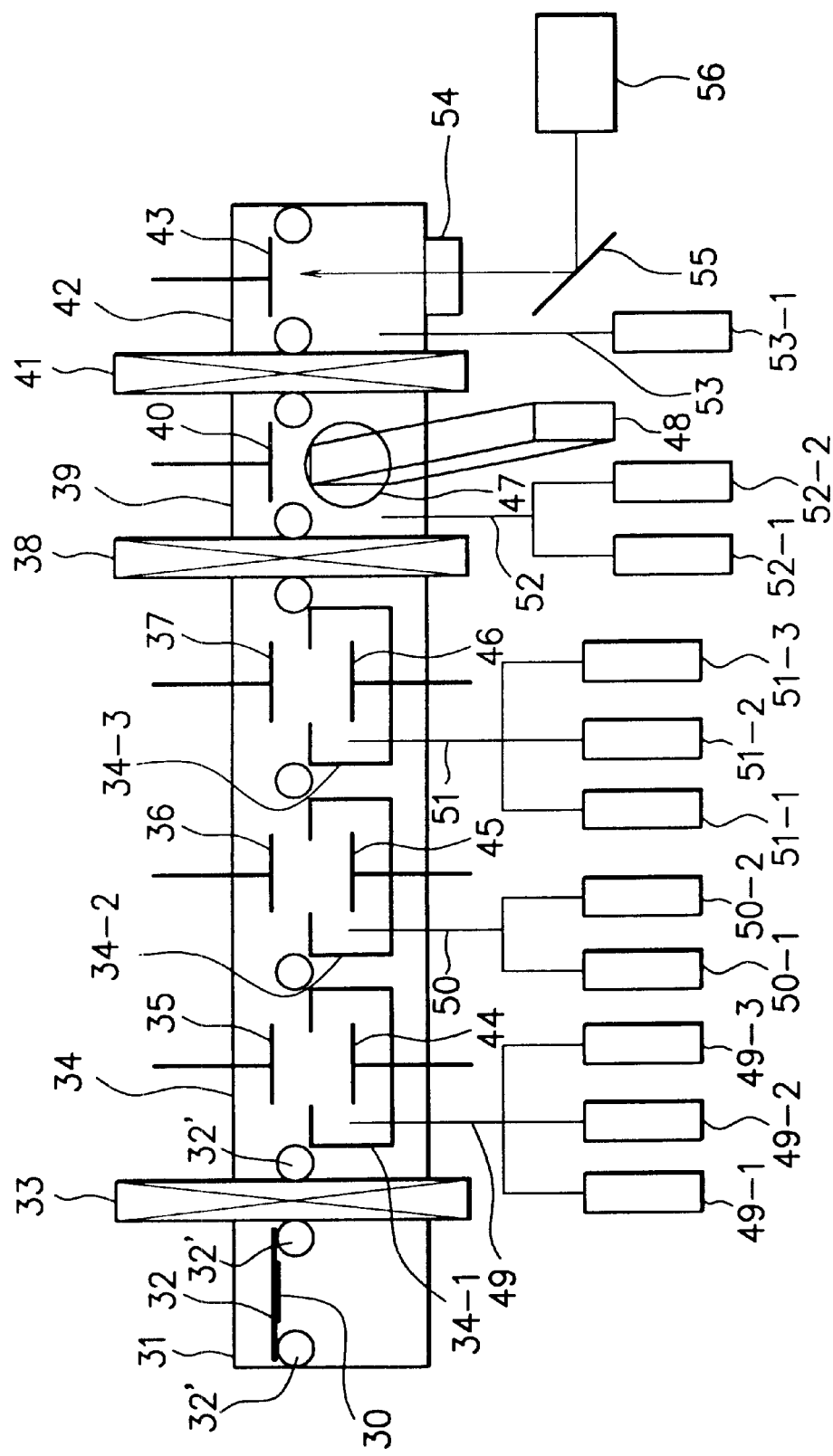
FIG. 5 is a schematic diagram illustrating an example of a film-forming apparatus suitable for forming a semiconductor layer in the production of a photovoltaic element of the present invention.

FIG. 1 is a schematic cross-sectional view illustrating an example of a photovoltaic element according to the present invention. FIG. 2 is a schematically enlarged view of a portion A in FIG. 1 based on an observed cross-section image obtained by means of a transmission electron microscope. FIG. 3 is a schematically enlarged view of a portion B in FIG. 2 based on an observed cross-section image obtained by means of a transmission electron microscope. FIG. 4 is a schematic block diagram illustrating an example of a sunlight power generation apparatus according to the present invention. FIG. 5 is a schematic diagram illustrating an example of a film-forming apparatus suitable for forming a semiconductor layer in the present invention.

Now, in FIG. 1, there is shown a photovoltaic element 100 (or a solar cell) which is sealed into a photovoltaic element module 101 (or a solar cell module) so as to be capable of being used, for instance, as a power generation source. It should be understood that this module is only an embodiment when the photovoltaic element of the present invention is practically used as a power generation source and is not limitative. The photovoltaic element of the present invention may be modularized into other appropriate forms depending upon application purposes. And in FIG. 1, there is shown only one photovoltaic element for simplification purposes. The photovoltaic element 100 in FIG. 1 may comprise a desired number of photovoltaic elements having the same constitution as the photovoltaic element 100 which are electrically connected with each other in series connection or parallel connection so as to obtain a prescribed voltage and electric current.

First, description will be made of the photovoltaic element 100 with reference to FIGS. 1 to 3.

The photovoltaic element 100 comprises a back reflecting layer 2, a transparent electrically conductive layer 3, and a semiconductor layer 4 having a semiconductor junction (this layer will be hereinafter referred to as "semiconductor junction layer") stacked in this order on a substrate 1, where a combination of the substrate, the back reflecting layer 2 and the transparent electrically conductive layer 3 serves as a lower electrode.

Reference numeral 5 indicates a transparent upper electrode layer which is formed on the semiconductor junction layer 4, and reference numeral 6 indicates a collecting electrode (or a grid electrode) which is formed on the upper electrode layer 5.

In the following, description will be made of each constituent of the photovoltaic element 100.

Substrate

As the substrate 1, there can be used metal members, alloy members, composites of these members, carbon sheets, and synthetic resin films. These members can be used in a roll form and therefore, are suitable for continuous production of a photovoltaic element. Besides these members, crystalline substrates such as a silicon wafer, substrates made of glass, and substrates made of ceramics may be used depending upon use purpose of a photovoltaic element produced.

When a transparent member such as a glass plate is used as the substrate 1, it is possible that light is impinged from the side of the substrate 1.

In the case where a magnetic member such as a member made of stainless steel such as SUS 430 stainless steel is used as the substrate 1, for instance, in the process of forming a semiconductor layer, the substrate 1 can be transported while precisely controlling the position of the substrate by means of a roller provided with a magnet therein.

The substrate 1 comprising any of the foregoing members can be used as it is. However, it is possible to grind the surface of the substrate on which a film is to be formed.

Separately, it is possible to use a member having a surface provided with irregularities such as a dull-finished stainless steel member obtained by way of rolling using rollers as the substrate 1. It is also possible to use a steel member whose surface being provided with irregularities obtain by subjecting an iron steel to a surface treatment with nickel or aluminum as the substrate 1.

In the case where the substrate 1 is electrically conductive, it is possible to make the substrate to serve as one of the electrodes for outputting a power from the semiconductor junction.

Back Reflecting Layer

The back reflecting layer 2 is used for reflecting light passed through the semiconductor junction layer 4 to reach thereto toward the semiconductor junction layer.

In the case where the surface of the substrate 1 has a high reflectance, the back reflecting layer 2 may be omitted.

In the case where the substrate 1 is insulative, it is possible to make the back reflecting layer 2 such that it also serves as an electrode layer.

In the case where the substrate 1 comprises a stainless steel member or a carbon member, it is preferred to form a metallic film of Al, Ag or Cu—Mg alloy on the surface of such member by way of sputtering or the like, as the back reflecting layer 2. In this case, It is possible to make said metallic film as the back reflecting layer 2 to have a surface provided with irregularities by forming said metallic film at a relatively large thickness under film-forming conditions of a relatively high film-forming temperature (a relatively high substrate temperature) and a relatively low deposition rate. Alternatively, it is possible that said metallic film as the back reflecting layer 2 is formed by way of sputtering and thereafter, the metallic film is subjected to a surface etching treatment to form irregularities at the surface of the metallic film.

Separately, in the case where light is impinged from the side of the substrate 1, it is preferred that the back reflecting layer 2 is provided on the surface side of the semiconductor junction layer 4 (that is, the non-light receiving side in this case).

Transparent Electrically Conductive Layer

The transparent electrically conductive layer 3 is used for transmitting light reflected by the back reflecting layer 2 into the semiconductor junction layer 4. By the presence of the transparent electrically conductive layer 3, the light absorption efficiency in the semiconductor junction layer 4 is increased. However, the transparent electrically conductive layer 3 is not always necessary to be provided.

The transparent electrically conductive layer 3 may be formed by a conventional film-forming method such as sputtering, vacuum evaporation, CVD (chemical vapor phase deposition), ion plating, ion beam deposition, or ion beam sputtering. Besides, the transparent electrically conductive layer 3 may be formed by means of an electrodeposition method using an aqueous solution containing nitric acid radical, acetic acid radial or ammonium radical, and metal ions, or a dipping method.

The transparent electrically conductive layer 3 is desired to be highly transparent because it serves to transmit light passed through the semiconductor junction layer 4 until the back reflecting layer 2. In addition, the transparent electrically conductive layer 3 is desired to have an appropriate resistance in order to restrain an electric current flown through a defect of the semiconductor junction layer 4. Further in addition, the transparent electrically conductive layer 3 is desired to have a function to prevent the constituent elements of the back reflecting layer 2 from being dispersed into the semiconductor junction layer 4.

The transparent electrically conductive layer 3 is desired to be constituted by a metal oxide material such as zinc oxide (ZnO), indium oxide ($In_2O_3$), tin oxide ($SnO_2$), ITO ($In_2O_3$—$SnO_2$), titanium oxide ($TiO_2$), or a mixture of these.

It is possible for the transparent electrically conductive layer 3 to be formed so as to have a surface provided with irregularities having an average top-to-valley elevation of about 100 nm by controlling the conditions upon forming the transparent electrically conductive layer.

Alternatively, the transparent electrically conductive layer having such uneven surface may be formed by a method wherein a given transparent electrically conductive layer having a flat surface is formed and the layer is subjected to a surface etching treatment by way of wet etching using an aqueous solution of acetic acid or the like.

In the case where a given transparent electrically conductive layer as the transparent electrically conductive layer 3 is formed by means of sputtering, it is possible to make said layer to have a surface provided with irregularities having a large average top-to-valley elevation by forming said layer at a relatively large thickness under film-forming conditions of a relatively high substrate temperature and a relatively low deposition rate. In the case where a given transparent electrically conductive layer as the transparent electrically conductive layer 3 is formed by means of an electrodeposition method using such aqueous solution as above described, it is possible to make said layer to have a surface provided with irregularities having a large average top-to-valley elevation by forming said layer under conditions of increasing the metal ion concentration of the aqueous solution and increasing the thickness of the layer formed.

Semiconductor Junction Layer

The semiconductor junction layer 4 functions to convert incident light into electricity.

For a layered microcrystalline series semiconductor junction structure, the present inventors obtained a finding through experimental studies that the characteristics of the active semiconductor layer in which carriers are generated based on incident light are affected by its conformity with the backing semiconductor layer. In order to overcome this shortcoming, the present inventors conducted experimental studies. As a result, there was obtained a finding that when (a) a semiconductor layer containing no crystalline phase is used as the backing semiconductor layer and (b) a semiconductor layer containing pillar microcrystalline phases is used as the active semiconductor layer where said semiconductor layer (b) is stacked on said semiconductor layer (a), and the boundary region between the two semiconductor layers (a) and (b) is structured to comprise a semiconductor material containing approximately spherical microcrystalline phases having a varied average size distribution such that said spherical microcrystalline phases on the side of said semiconductor layer (b) have an average size which is greater than that of said spherical microcrystalline phases on the side of the semiconductor layer (a), there can be attained a desirable stacked semiconductor junction which is free of such shortcoming as above described and has improved characteristics. The present invention has been accomplished on the basis of this finding.

As a preferable embodiment of the semiconductor junction layer 4 in the present invention, there can be mentioned a semiconductor junction structure comprising a first semiconductor layer 4A, a second semiconductor layer 4B, a third semiconductor layer 4C, a fourth semiconductor layer 4D, and a fifth semiconductor layer 4E stacked in this order as shown in FIGS. 1 to 3.

The semiconductor junction layer 4 in the present invention may be formed by means of a plasma CVD method using, for instance, a plasma CVD apparatus in which a high frequency power of from a radio frequency of 13.56 MHz to a microwave of 2 GHz can be used. Besides, the semiconductor junction layer 4 may be formed by way of a combination a plasma CVD method, an ECR plasma CVD method, or a sputtering method and a film-forming manner using an active hydrogen gas.

Specifically, the semiconductor layers 4A–4E may be separately formed in different film-forming chambers of a film-forming apparatus as shown in FIG. 5. Alternatively, they may be formed in a common film-forming chamber by changing the film-forming conditions upon forming each semiconductor layer.

It is also possible for these semiconductor layers to be continuously formed using a roll-to-roll film-forming apparatus.

In any case, in the formation of the semiconductor junction layer 4, its constituent semiconductor layers are desired to be formed without exposing these semiconductor layers to atmospheric air in the course of their formation.

In the case of forming the semiconductor junction layer 4 by means of a plasma CVD method, $SiH_4$, $SiF_4$, $Si_2H_6$, $GeH_4$, $CH_4$, $C_2H_6$ and the like may be selectively used as the raw material gas. These raw material gases are used by diluting with an appropriate dilution gas. Such dilution gas, $H_2$ gas, He gas, Ar gas, and the like may be selectively used. In order to form an n-type or p-type semiconductor layer, an appropriate gaseous doping material capable of imparting a given doping element is used together with a given raw material gas. Such gaseous doping material can include, for example, $PH_3$, $BH_3$, $BF_3$, and the like.

The junction structure of the semiconductor junction layer 4 typically may be a n-i-p structure or a p-i-n structure.

The junction structure is not limited to these semiconductor junction structures, and it may take other semiconductor junction structures. Specifically, the junction structure may be a $n^+$-$n^-$-$p^+$ structure, a $n^+$-$p^-$-$p^+$ structure, a $p^+$-$p^-$-$n^+$ structure, or a $p^+$-$n^-$-$n^+$ structure.

Besides, it is also possible for the junction structure to be structured such that the conduction type is graded in the thickness direction.

In the formation of a semiconductor layer of n- or p-type, it is preferred to supply a prescribed amount of a gaseous doping material capable of imparting a given doping element in an amount of 0.1 to 10 atomic % versus the atomic number of silicon (Si) atoms, germanium (Ge) atoms or carbon (C) atoms as the main constituent of the semiconductor layer. In the case of slightly doping a substantially intrinsic semiconductor layer, it is preferred to supply a prescribed amount of a gaseous doping material capable of imparting a given doping element in an amount of 0.1 to 10 ppm. It is a matter of course that any gaseous doping material is not necessitated to be used in the formation of an intrinsic semiconductor layer.

The semiconductor junction layer 4 may contains hydrogen atoms in an amount of 1 to 20 atomic %. Incidentally, even when the semiconductor junction layer 4 should contain a trace amount of one or more kinds of atoms selected from a group consisting of oxygen atoms, nitrogen atoms, and fluorine atoms, the principle of the present invention is not hindered.

In the present invention, it is possible that two or more of semiconductor junction layers having the same structure as the semiconductor junction layer 4 are present in the photovoltaic element.

The first semiconductor layer 4A comprises a semiconductor material containing no crystalline phase. The first semiconductor layer 4A is preferred to contain a doping element. For the thickness of the first semiconductor layer 4A, it is preferred to be in a range of from 0.5 to 50 nm.

In the observation by means of a transmission electron microscope, the first semiconductor layer 4A is observed to have an uniform texture without any particle structure with a magnitude of about 5 nm or more.

The second semiconductor layer 4B comprises a semiconductor material containing approximately spherical microcrystalline phases. The second semiconductor layer 4B may be formed by a method of forming a given semiconductor layer containing no crystalline phase by means of a plasma CVD method, and microcrystallizing said semiconductor layer by way of laser-annealing or the like. In the case where the second semiconductor layer 4B is formed by way of laser-annealing in this way, said semiconductor which is subjected to laser-annealing is preferred to contain substantially no doping element in view of making it possible to desirably microcrystallize only the semiconductor layer which becomes the second semiconductor layer 4B. In this case, when the intensity of laser beam used in the laser-annealing is excessively strong or weak, desired microcrystallization of the semiconductor layer does not take place.

When the intensity of said laser beam is made to be in a range of from 100 to 250 $mJ/cm^2$, there can be obtained a desirably microcrystallized semiconductor layer suitable as the second semiconductor layer 4B.

Alternatively, the second semiconductor layer 4B may be formed by a method wherein upon forming a given semiconductor layer as the second semiconductor layer 4B by means of a plasma CVD method, related film-forming conditions including the inner pressure in the film-forming chamber, the wattage of a high frequency power supplied, the flow rate of a raw material gas introduced, the flow rate of a gaseous doping material introduced, the substrate temperature, and the dilution ratio of said raw material gas by hydrogen gas are periodically changed, whereby said semiconductor layer is formed to contain approximately spherical microcrystalline phases having a varied average size distribution in the thickness direction. In this case, particularly by periodically changing the substrate temperature and the dilution ratio of the raw material gas by hydrogen gas, there can be formed approximately spherical microcrystalline phases having a varied average size distribution in the thickness direction.

For the thickness of the second semiconductor layer 4B, it is preferred to be in a range of from 5 to 60 nm.

In the observation by means of a transmission electron microscope, the second semiconductor layer 4B is observed to have approximately spherical microcrystalline phases with an average size in a range of from about 1 to about 10 nm on the side of the first semiconductor layer 4A and have approximately spherical microcrystalline phases with an average size in a range of from about 5 to about 20 nm on the side of the third semiconductor layer 4C. The approximately spherical microcrystalline phases in either side are not necessary to be uniform with respect to their magnitude.

As previously described, the term "microcrystalline phase" is meant a microcrystalline particle. The term "approximately spherical microcrystalline phase" is meant to a microcrystalline particle shaped in an approximately spherical form including a polyhedral spherical form or the like. The "size of the approximately spherical microcrystalline phase" is meant a diameter of said approximately spherical microcrystalline particle.

The third semiconductor layer 4C comprises a semiconductor material containing pillar microcrystalline phases. For the thickness of the third semiconductor layer 4C, it is preferred to be in a range of from 500 to 5000 nm.

In the observation by means of a transmission electron microscope, the third semiconductor layer 4C is observed to have (a) pillar microcrystalline phases having a relatively long length in the thickness direction and (b) pillar microcrystalline phases having a relatively short length in the thickness direction in a mixed state. The pillar microcrystalline phase (a) has a length nearly the same as the thickness of the third semiconductor layer 4C and a width of less than 500 nm in a direction perpendicular to the thickness direction.

The third semiconductor layer 4C may have a region additionally containing approximately spherical microcrystalline phases having an average size of about 10 to about 50 nm mingled therein in the vicinity of the second semiconductor layer 4B. In this case, the spherical microcrystalline phases mingled account for a proportion of 10 to 80% in a plane in parallel to the second semiconductor layer 4B.

The fourth semiconductor layer 4D comprises a buffer layer which serves to provide an improved joining state between the third semiconductor layer 4C and the fifth semiconductor layer 4E. The fourth semiconductor layer 4D is not always necessary to be provided. The buffer layer as the fourth semiconductor layer 4D is preferred to comprise a semiconductor material containing no crystalline phase and no doping element. For the thickness thereof, it is preferred to be in a range of from 0.5 to 50 nm.

The fifth semiconductor layer 4E is preferred to comprise a semiconductor material containing a prescribed doping element and containing crystalline phases capable of providing an effect of improving light transmittance. For the thickness of the fifth semiconductor layer 4E, it is preferred to be in a range of from 0.1 to 20 nm.

Each of the fourth semiconductor layer 4D and the fifth semiconductor layer 4E is preferred to be formed at a substrate temperature which is lower than that upon forming each of the first to third semiconductor layers 4A–4C. In the case where the fourth semiconductor layer 4D and the fifth semiconductor layer 4E are formed respectively at a relatively high substrate temperature, they do not have characteristics required for them. The reason for this is considered such that occurrence of diffusion of the dopant and occurrence of release of hydrogen atoms compensating dangling bonds in the semiconductor layer would be chiefly contributed.

As above described, the semiconductor junction layer 4 has a stacked structure comprising the first semiconductor layer 4A containing no crystalline phase, the second semiconductor layer 4B containing such approximately spherical microcrystalline phases as above described, and the third semiconductor layer 4C containing such pillar microcrystalline phases as above described which are stacked in this order. And as shown in FIG. 3, the approximately spherical microcrystalline phases are contained in the second semiconductor layer 4B such that part of them situated on the side of the third semiconductor layer 4C have an average size which is greater than that of those situated on the side of the first semiconductor layer 4A. And the third semiconductor layer 4C may have a region containing approximately spherical microcrystalline phases mingled together with the pillar microcrystalline phases in the vicinity of the second semiconductor layer 4B.

In the semiconductor junction layer 4 thus structured, it is considered that the approximately spherical microcrystalline phases having a relatively small average size of the second semiconductor layer 4B function to establish an improved junction between the second semiconductor layer 4B and the first semiconductor layer 4A containing no crystalline phase and the pillar microcrystalline phases of the third semiconductor layer 4C are grown from the approximately spherical microcrystalline phases having a relatively large average size of the second semiconductor layer 4B so as to establish an improved junction between the second semiconductor layer 4B and the third semiconductor layer 4C. This situation in the semiconductor junction layer 4 is considered to provide such effects as will be described in the following. That is, the proportion for carriers, which are generated based on incident light, to be extinguished at the junction interface is decreased, and the proportion of an electric current to be outputted to the outside is increased. In addition, the stress and distortion which will be occurred due to a structural difference are relaxed.

In accordance with the foregoing structure of the junction semiconductor layer 4, even when the third semiconductor layer 4C is formed to be relatively thin at a high deposition rate, a large quantity of electric current is generated in the junction semiconductor layer 4.

Transparent Upper Electrode Layer

The transparent upper electrode layer 5 is formed on the semiconductor junction layer 4. The electrode layer 5 functions to take up a power generated in the semiconductor junction layer 4. The electrode layer 5 is situated to oppose the substrate 1 side through which a power generated in the semiconductor junction layer is also outputted.

The electrode layer 5 is desired to be constituted by a material having a low resistance Such material can include, for example, zinc oxide (ZnO), indium oxide ($In_2O_3$), tin oxide ($SnO_2$), ITO ($In_2O_3$—$SnO_2$), titanium oxide ($TiO_2$), or a mixture of these.

The electrode layer 5 may be formed by means of resistance heating evaporation, ion beam deposition, vacuum evaporation, sputtering, CVD (chemical vapor phase deposition), spraying, and dipping.

In the case where light is impinged from the side of the electrode layer 5, in order for the electrode layer 5 to provide a good reflection preventive effect for incident light, it is preferred that the electrode layer 5 is made to have a thickness corresponding to a value obtained by dividing the wavelength of light mainly intended to be prevented from being reflected by a value corresponding to 4 times the refractive index of the electrode layer 5. Specifically, for instance, supposing that the refractive index of the electrode layer 5 is 2 and the wavelength of light which is most intended to pass through the electrode layer is 500 nm, a value of about 63 nm which is calculated from the equation 500/(2×4) is a preferred thickness for the electrode layer 5.

The electrode layer 5 may be a layered material comprising a plurality of materials having a different refractive index.

In the above, description has been made of the photovoltaic element having an integrated structure comprising the lower electrode, the semiconductor junction layer 4 and the upper electrode layer 5 as an embodiment of a photovoltaic element according to the present invention. The present invention is not limited such structure.

Collecting Electrode

It is possible that a collecting electrode 6 in a grid form is provided on the upper electrode layer 5 in order to efficiently collect the electric current generated by virtue of a photoelectromotive force on the upper electrode layer 5.

The collecting electrode 6 may be formed by means of sputtering, resistance heating evaporation, or CVD, using a mask pattern. Besides, the collecting electrode 6 may be also formed by a method of firstly forming a metallic film over the entire surface of the upper electrode layer 5 and patterning the metallic film by way of etching to remove unnecessary portions thereof, a method of directly forming a grid electrode pattern on the surface of the upper electrode layer 5 by way of photo CVD, a method of firstly forming a negative patterning mask having a grid electrode pattern on the surface of the upper electrode 5 and performing plating thereon, a method of screen-printing an electrically conductive paste to form a grid electrode pattern on the surface of the upper electrode 5, or a method wherein a copper wire applied with a carbon paste thereon is bonded on the surface of the upper electrode 5 by way of thermocompression bonding to form a grid electrode.

If necessary, in order to output an electromotive force, it is possible that a power output terminal 7A is electrically connected to the substrate 1 and a power output terminal 7A is electrically connected to the collecting electrode 6 as shown in FIG. 1.

Description will be made of the photovoltaic element module 101.

The photovoltaic element module 101 specifically comprises a body comprising the photovoltaic element 100 structured as above described which is encapsulated by a sealing material 8, a surface protective film 9 laminated on the light receiving side of said body and a back face reinforcing member 10 which is laminated on the non-light receiving side of said body. Reference numeral 11 indicates an insulating member which is provided between the substrate 1 of the photovoltaic element 100 and the back face reinforcing member 10.

In the following, description will be made of each constituent of the photovoltaic element module, except for the photovoltaic element for which description already has been made in the above.

Sealing Material

The sealing material 8 is used to seal the photovoltaic element 100 in order to protect the photovoltaic element from surrounding environments such as temperature changes, moisture, external shock, and the like. The sealing material 8 also serves to ensure the adhesion of the body comprising the sealing material 8 in which the photovoltaic element 100 is enclosed with the surface protective film 9 and also the adhesion of said body with the back face reinforcing member 10.

The sealing material 8 is desired to comprise a resin which has adhesion properties and filling properties and excels particularly in weatherability, heat resistance, cold resistance, and shock resistance. Specific preferable examples of such resin are polyolefin series resins, urethane resins, silicone resins, and fluororesins.

The sealing material 8 may contain a cross-liking agent comprising an organic peroxide. In this case, in vacuum lamination treatment for the production of the photovoltaic element, module, thermocompression bonding of & the sealing material can be performed while the sealing material being crosslinked. Besides, the sealing material 8 may also contain one or more materials selected from a group consisting of a crosslinking assistant, an UV absorber, a photo stabilizer, an antioxidant, a silane coupling agent, and an organic titanate compound in order to improve the properties of the sealing material.

In any case, the sealing material 8 is required to be transparent in order to prevent the quantity of incident light to reach the semiconductor junction layer 4 of the photovoltaic element 100 from being diminished as much as possible. In view of this, the sealing material 8 is desired to have a light transmittance of preferably more than 80% or more preferably more than 90% with respect to visible light having a wavelength of 400 to 800 nm.

Further, the sealing material 8 is desired to have a refractive index preferably in a range of from 1.1 to 2.0 or more preferably in a range of from 1.1 to 1.6 at 25° C. in order to facilitate the incidence of light from atmospheric air.

Surface Protective Film

The surface protective film 9 is positioned at the outermost surface of the photovoltaic element module 101 and because of this, it is required to excel in transparency, weatherablity, water repellency, heat resistance, pollution resistance, and physical strength. The surface protective film 9 is desired to comprise a resin film which satisfies these requirements. Specific preferable examples of such resin film are fluororesin films, and acrylic resin films.

The face of the surface protective film 9 which is contacted with the sealing material 8 is desired to be applied with a surface treatment by way of corona treatment, plasma treatment, ozone treatment, UV irradiation treatment, electron beam irradiation treatment, or flame treatment, in order to improve the adhesion of the surface protective film 9 with the sealing material 8.

Not only the surface protective film 9 but also the sealing material 8 may have irregularities at their surface. Such irregularities may be formed during the vacuum lamination treatment for the production of the photovoltaic element module or may be formed after the vacuum lamination treatment by way of press working.

Back Face Reinforcing Member

The back face reinforcing member 10 is disposed at the back face of the photovoltaic element module 101 for the purposes of improving the mechanical strength of the photovoltaic element module and preventing the photovoltaic element module from being distorted or warped due to a change in the environmental temperature.

The back face reinforcing member 10 may comprise a nylon sheet, a PET (polyethylene terephthalate) sheet, a steel plate, a plastic plate, or a fiberglass reinforced plastic plate (or so-called FRP plate).

In the case where the back face reinforcing member 10 comprises a member having a large mechanical strength, the photovoltaic element module 101 can be used as a building material such as a roofing material. In this case, the photovoltaic element module can be designed into a building material integral type photovoltaic element module (or a building material integral type solar cell module).

Insulating Member

In the case where the back face reinforcing member 10 is electrically conductive, in order to ensure electrical isolation of the substrate 1 of the photovoltaic element 100 from the back face reinforcing member 10, the insulating member 11 is provided between the substrate 1 and the back face reinforcing member 10. The insulating member may comprise an insulating film such as a nylon film or the like.

In the following, description will be made of an embodiment of a power generation apparatus according to the present invention while referring to FIG. 4.

A power generation apparatus 20 shown in FIG. 4 is for supplying a power to a load 27, and it is provided with a photovoltaic element 21, a power converter 22, a voltage detector 23, an electric current detector 24, an output power setting mechanism 25, and a controlling mechanism 26.

In the power generation apparatus 20, a DC power generated by the photovoltaic element 21 is inputted into the power converter 22 where the D.C. power is converted into an adequate power, followed by supplying to the load 27.

The output voltage and output electric current of the photovoltaic element 21 are detected respectively by the voltage detector 23 and the electric current detector 24, signals detected by these detectors 23 and 24 are inputted into the output power setting mechanism 25 where said signals are processed, and the controlling mechanism 26 controls the power converter 22 based on a signal transmitted thereto from the output power setting mechanism 25.

As the photovoltaic element 21, the foregoing photovoltaic element module 101 can be used. In this case, it is desired for the photovoltaic element 100 of the photovoltaic element module 101 to comprise a plurality of photovoltaic elements each structured in the same way as the photovoltaic element 100 which are electrically connected so as to obtain desired voltage and electric current.

The power converter 22 may comprise a DC/DC converter using a self-turning off type switching element such as a power transistor, a power FET, or an IGBT, or a self-commutated DC/AC inverter. The power converter 22 controls power tidal current, input and output voltage, output frequency, and the like based on the ON/OFF duty ratio (so-called conduction ratio) and the frequency of a gate pulse transmitted from the controlling mechanism 26.

As the load 27, there are various things including electric heating loads, electric motor lords, and the like.

In the case where the power supplied is an A.C. power, the load 27 may be a commercial A.C. power supply system. In the case where the power supplied is an D.C. power, the load 27 may be a rechargeable battery. In this case, it is desired that the capacity of the rechargeable battery is sufficiently increased and supervision of the rechargeable battery in a charged state is conducted. In the case where the power supplied is an D.C. power, the power converter 22 comprises the foregoing DC/DC converter.

In the voltage detector 23, for instance, the output voltage of the photovoltaic element 21 is divided by means of a resistor, followed by being A/D-converted into a digital value, which is transmitted into the output power setting mechanism 25. In this case, in order to avoid invasion of a noise, it is desired that an power output circuit (not shown) of the photovoltaic element 21 and a transmitting circuit (not shown) for a signal detected by the voltage detector are insulated by a photocoupler or the like capable of performing complete insulation between input and output.

In the electric current detector 24, for instance, the output electric current of the photovoltaic element 21 is converted into a voltage by means of a Hall element or a standard resistor, followed by making it into a digital value in the same manner as in the voltage detector 23, which is transmitted into the output power setting mechanism 25.

In each of the voltage detector 23 and the electric current detector 24, it is desired to use a sufficiently high speed and highly precise A/D converter. Specifically, it is desired to use an A/D converter having a resolution of more than 10 bits and a sampling speed of more than 50 kHz. According such A/D converter, it is possible to establish a control system whose error is less than 0.1% and which provides a response within less than 1 second.

The output power setting mechanism 25 perform calculation based on detected signals transmitted from the voltage detector 23 and the electric current detector 24 to decide a set value for output voltage whereby controlling the conduction ratio and the like of the gate circuit so that the photovoltaic element 21 has a set value for the output voltage thereof. The output power setting mechanism 25 is concretized as a controlling microcomputer, and it is provided with a CPU, a RAM, a ROM, an input-output port, a numerical computing unit and the like.

The controlling mechanism 26 comprises a so-called gate driving circuit which generates a gate pulse by way of comparison of momentary current values, a comparison equation of sine wave/chopping wave, or the like. Based on the gate pulse generated by the controlling mechanism 26, the power converter 22 is controlled so that the output voltage of the photovoltaic element 21 is in agreement with the output of the output power setting mechanism 25. The controlling mechanism 26 may comprise an analog circuit or a digital circuit. Besides, the controlling mechanism 26 may comprise a digitalized mechanism provided with a CPU or a DSP (digital signal processor) as a high speed CPU. In this case, the constitution of the controlling mechanism 26 is similar to that of the output power setting mechanism 25. In this connection, it is possible to use an adequate circuit which functions as both the output power setting mechanism 25 and the controlling mechanism 26.

As previously described, the present invention also provides a photovoltaic element comprising at least a first transparent electrically conductive layer formed on a substrate, a silicon series semiconductor layer having at least one p-i-n junction stacked on said first transparent electrically conductive layer, and a second transparent electrically conductive layer stacked on said silicon series semiconductor layer, characterized in that said silicon series semiconductor layer has a p-i-n junction structure which comprises a primary layer comprising an amorphous semiconductor layer having a first conduction type and a semiconductor layer containing crystalline phases (hereinafter referred to as "crystalline phase-containing semiconductor layer) and having a first conduction type sequentially stacked, a crystalline phase-containing i-type semiconductor layer, and a non-single crystal semiconductor layer having a second conduction type which are sequentially stacked, wherein the crystalline phase-containing semiconductor layer having the first conduction type contains crystalline phases (crystalline particles) such that their size magnitude is increased toward the crystalline phase-containing i-type semiconductor layer.

This photovoltaic element have such advantages as will be described in the following. That is, the crystalline phase-containing i-type semiconductor layer can be desirably formed on the primary layer without damaging the primary layer such that the i-type semiconductor layer comprises high quality crystalline particles having a large average size in a state with a diminished defect density, while improving the property of the interface between the i-type semiconductor layer and the primary layer In addition, the adhesion of the silicon series semiconductor layer with the substrate is improved. Thus, the photovoltaic element has improved photoelectric conversion characteristics and excels in environmental resistance.

In the following, description will be made of the above-described photovoltaic element.

Incidentally, the method of forming a crystalline phase-containing silicon series semiconductor layer (that is, a silicon series semiconductor layer containing crystalline particles) by a plasma CVD method using a high frequency power is more advantageous in comparison with that of forming said silicon series semiconductor layer by way of solid phase reaction, because in the former method, it is possible that the processing time is shortened and the processing temperature is lowered, and therefore, the silicon series semiconductor layer can be formed at a reasonable cost. This situation becomes significant particularly when the plasma CVD method is adopted in the production of a photovoltaic element having a p-i-n junction structure, where the i-type semiconductor layer is formed to have a large thickness.

When the i-type semiconductor layer which substantially functions as the light absorbing layer in the photovoltaic element is made to comprise a crystalline phase-containing i-type semiconductor layer, there is a merit in that the light degradation phenomenon due to the Staebler-Wronski effect which becomes problematic in the case of a photovoltaic element whose light absorbing layer comprising an amorphous material can be restrained. Incidentally, for such crystalline phase-containing i-type semiconductors layer, it is known that the grain boundary is influenced to both the majority carrier and the minority carrier to deteriorate the performance of the i-type semiconductor, layer In order to restrain the influence of the grain boundary, there is considered it an effective manner that the crystalline phases (crystalline particles) constituting the i-type semiconductor layer are made to have a large average particle size so that the i-type semiconductor layer has a small grain boundary density. In this case, it is a particularly important factor to form a high quality crystalline phase having a small grain boundary density from the initial stage in the formation of the i-type semiconductor layer.

Here, in the case where the primary layer is constituted by the amorphous semiconductor layer having the first conduction type only and a crystalline phase in order to form the crystalline phase-containing i-type semiconductor layer is directly formed thereon, there is a disadvantage in that an amorphous film having an inferior property tends to form as an initial film. The reason for the occurrence of this phenomenon is considered such that the arrangement of silicon atoms at the initial stage of the film formation greatly depends on the arrangement of dangling bonds present on the surface of the amorphous semiconductor layer to draw the amorphous structure of the primary layer. The amorphous film thus formed as the initial film is a low quality film having a high defect density in which the hydrogen content is not optimized and the structure is not relaxed. Because of the presence of such low quality initial film, the crystalline phase-containing i-type semiconductor layer finally formed becomes to have greatly inferior characteristics.

In the region in contact with such crystalline phase-containing i-type semiconductor layer, by additionally using the crystalline phase-containing semiconductor layer having the first conduction type as the primary layer, it is, possible to form a desirable crystalline phase-containing i-type semiconductor layer as the crystalline phase-containing i-type semiconductor layer without the foregoing problem of drawing the amorphous structure.

The results obtained through experimental studies by the present inventors revealed that when the primary layer is formed such that a Raman scattering intensity (of near 480 $cm^{-1}$ as a typical example) owing to the amorphous component thereof is smaller than a Raman scattering Intensity (of near 520 $cm^{-1}$ as a typical example) owing to the crystalline component thereof, the foregoing advantages of the photovoltaic element of the present invention become remarkable.

Now, in the case where the silicon series semiconductor layer of the photovoltaic element of the present invention is formed by a plasma CVD method using a high frequency power, in comparison of the film-forming conditions for the formation of the amorphous semiconductor layer with those for the formation of the crystalline phase-containing semiconductor layer, the hydrogen dilution ratio and the high frequency power for the formation of the crystalline phase-containing semiconductor layer are relatively higher than those for the formation of the amorphous semiconductor layer, and the formation of the crystalline phase-containing semiconductor layer is conducted in a highly reductive atmosphere. Thus, in the case where the crystalline phase-containing semiconductor layer having the first conduction type is directly formed on the first transparent electrically conductive layer, when the first transparent electrically conductive layer contains an oxide material, there is a fear that elimination of oxygen would be occurred to deteriorate the transmittance of the transparent electrically conductive layer, resulting in a reduction In the back reflecting function. This fear is eliminated by providing the amorphous semiconductor layer having the first conduction type in the region in contact with the first transparent electrically conductive layer, where the transmittance of the first transparent electrically conductive layer is prevented from being deteriorated. Separately, in the case where the first transparent electrically conductive layer comprises a crystalline phase-containing material, when the amorphous semiconductor layer having the first conduction type and which comprises an amorphous semiconductor material whose mechanical strength characteristic being more isotropic is sandwiched between the crystalline phase-containing semiconductor layer having the first conduction type and the first transparent electrically conductive layer is adopted, the adhesion between the first transparent electrically conductive layer and the primary layer is more improved.

Further in the case where the photovoltaic element has a plurality of p-i-n junctions (that is, a plurality of p-i-n junction structures stacked) where the p-i-n junction which is not adjacent to the substrate contains the crystalline phase-containing i-type semiconductor layer, by providing the amorphous semiconductor layer having the first conduction type in a lower region in contact with said p-i-n junction, there is provided an advantage in that in the p-n junction structure comprising the n-type semiconductor layer of said p-i-n junction and the p-type semiconductor layer of other p-i-n junction situated under said p-i-n junction, the adjacent two semiconductor layers involved are prevented so that the dopant of one semiconductor layer is not diffused into the other semiconductor layer.

Thus, by adopting the constitution in that the crystalline phase-containing i-type semiconductor layer is formed on the primary layer comprising the amorphous semiconductor layer having the first conduction type and the crystalline phase-containing semiconductor layer having the first conduction type sequentially stacked, pronounced advantages are provided such that the first transparent electrically conductive layer is prevented from being deteriorated with respect to its transmittance, dopant diffusion in the p-n junction structure of adjacent two p-i-n junctions is prevented, and the crystalline phase-containing i-type semiconductor layer can be formed in a desirable state without forming an initial film having an inferior property.

As previously described, for a crystalline phase-containing i-type semiconductor, it is known that the grain boundary is influenced to both the majority carrier and the minority carrier to deteriorate the performance of the i-type semiconductor layer. In order to restrain the influence of the grain boundary, there is considered it an effective manner that the crystalline phases (crystalline particles) constituting the i-type semiconductor layer are made to have a large average particle size so that the i-type semiconductor layer has a small grain boundary density. In view of this, it is considered to be particularly preferred that the crystalline phase-containing semiconductor layer having the first conduction type is made to comprise crystalline phases (crystalline particles) whose size magnitude being increased in a region in contact with the crystalline phase-containing i-type semiconductor layer so that the i-type semiconductor layer which is successively formed can be formed from the initial formation stage so as to comprise high quality crystalline phases having a low grain boundary density. On the other hand, in a region in contact with the amorphous semiconductor layer having the first conduction type, it is considered to be preferred that the crystalline phase-containing semiconductor layer having the first conduction type is made to have a structure having a high affinity with the amorphous structure of the amorphous semiconductor layer in order to restrain the detect density due to structural discontinuity between the two layers. These aims can be attained by making the crystalline phase-containing semiconductor layer having the first conduction type contain crystalline phases (crystalline particles) such that their size magnitude is increased toward the crystalline phase-containing i-type semiconductor layer.

Separately, as previously described, the silicon series semiconductor layer of the photovoltaic element of the present invention has the specific p-i-n junction structure which comprises the primary layer comprising the amorphous semiconductor layer having the first conduction type and the crystalline phase-containing semiconductor layer having the first conduction type sequentially stacked, the crystalline phase-containing i-type semiconductor layer, and the non-single crystal semiconductor layer having the second conduction type which are sequentially stacked, wherein the crystalline phase-containing semiconductor layer having the first conduction type contains crystalline phases such that their size magnitude is increased toward the crystalline phase-containing i-type semiconductor layer. Thus, in the p-i-n junction structure of the photovoltaic element of the present invention, occurrence of dangling bonds at the grain boundaries is prevented and occurrence of distortion not only at the grain boundaries but also in the crystal grains is prevented. In addition, the potential barriers within and outside the crystal grains are decreased to diminish the series resistance components. Further, because the primary layer contains the amorphous semiconductor layer, the shunt current which flows along the grain boundaries is restrained to prevent a reduction in the parallel resistance components.

The primary layer comprising the amorphous semiconductor layer having the first conduction type and the crystalline phase-containing semiconductor layer having the first conduction type sequentially stacked may be formed, for instance, in the following manner. That is, an doped amorphous layer is first formed by doping a given amorphous layer with a prescribed dopant capable of imparting a conductivity of the first conduction type. The doped amorphous layer thus formed is subjected to a crystallization treatment by way of an adequate crystallization method, where part of the doped amorphous layer is crystallized. By this, there is formed a two-layered structure as the primary layer which comprises an amorphous semiconductor layer having the first conduction type and a crystalline phase-containing semiconductor layer containing crystalline phases (crystalline particles) such that their size magnitude is increased toward the crystalline phase-containing i-type semiconductor layer which is formed on the primary layer. As the crystallization method in this case, it is possible to adopt a crystallization method by means of laser radiation or heat treatment in which crystallization takes place via a crystal growth step in a liquid phase state. Particularly, in the crystallization treatment by this crystallization method, by making a prescribed surface layer region of the doped amorphous layer which is opposite the substrate to be in a high temperature state by properly adjusting the intensity of the laser radiated or the temperature of the heat applied, it is possible to form the two-layered structure as the primary layer, comprising the amorphous semiconductor layer having the first conduction type and the crystalline phase-containing semiconductor layer containing crystalline phases such that their size magnitude is increased toward the crystalline phase-containing i-type semiconductor layer which is formed on the primary layer.

The laser radiation is preferred to be radiation of ultraviolet pulse laser by excimer laser or the like. The excimer laser can include ArF laser (oscillation wavelength: 193 nm), KrF laser (oscillation wavelength: 248 nm), XeCl laser (oscillation wavelength: 308 nm), and XeF laser (oscillation wavelength: 351 nm). The pulse energy is preferred to be 100 to 500 J/cm$^2$.

The heat treatment is preferred to be a heat Us treatment by a halogen lamp heater or a resistance heating means.

Now, the crystal growth takes place by way of a crystalline nucleus generation step and a crystal growth step, wherein it is considered that in a region where the doping concentration is relatively high, the dopant involved serves as a factor of generating the crystalline nucleus and because of this, the crystalline nucleus generation function becomes dominant; and in a region where the doping concentration is relatively small, the crystal growth function becomes dominant. Thus, when a doped semiconductor layer having the first conduction type which has a dopent concentration gradient to decrease in the thickness direction is subjected to the foregoing crystallization treatment, it is possible to readily form a semiconductor layer containing crystalline phases such that their size magnitude is continuously changed, as the primary layer. For the primary layer, when a crystalline phase-containing i-type semiconductor layer is formed on the surface of a side thereof containing the crystalline phases whose size magnitude being relatively large, a constitution of the present invention can be realized.

Here, it is possible that the region in which the dopant concentration is relatively small is made to be a non-doped layer region. Specifically, for instance, there is provided a stacked body comprising an amorphous semiconductor layer doped with a prescribed dopant capable of imparting a conductivity of the first conduction type and an amorphous i-type semiconductor layer, and the stacked body is subjected to a crystallization treatment by means of the foregoing laser radiation or heat treatment from the i-type semiconductor layer side. In this crystallization treatment, in the crystal growth step in the liquid phase state, the dopant contained in the doped semiconductor layer having the first conduction type is partly transferred into the i-type semiconductor layer to make the i-type semiconductor layer such that it exhibits a conductivity of the first conduction type. Thus, a dopant concentration gradient is established in the stacked body, where based on the dopant concentration gradient, there is formed a layered structure containing crystalline phases whose size magnitude being continuously changed in the thickness direction as the primary layer in the present invention. That is, by subjecting the stacked body comprising the amorphous semiconductor layer having the first conduction type and the amorphous i-type semiconductor layer to a crystallization treatment, the primary layer in the present invention which comprises the amorphous semiconductor layer having the first conduction type and the crystalline phase-containing semiconductor layer sequentially stacked can be readily formed.

In the above crystallization treatment, it is possible that part of the semiconductor layer having the first conduction type is converted into a liquid phase to transfer the dopant contained therein into the i-type semiconductor layer whereby establishing the dopant concentration gradient in the stacked body. Alternatively, it is possible that without converting part of the semiconductor layer having the first conduction type into the liquid phase, the dopant contained in the semiconductor layer is diffused into the i-type semiconductor layer to establish the dopant concentration gradient in the stacked body.

And when a crystalline phase-containing i-type semiconductor layer is formed on the surf ace of a side of the primary layer thus formed where the crystalline phases whose size magnitude being relatively large are contained, a constitution of the present invention can be realized.

In the case where the stacked body as the primary layer is made have a dopant concentration gradient which is decreased toward the crystalline phase-containing i-type semiconductor layer which is formed on the primary layer, the crystalline phases in the entire crystallized region are made such that their size magnitude is more continuously changed in the thickness direction while improving the crystallization ratio.

Here, the crystalline phase size (that is, the crystalline particle size or the grain size) and the crystallization ratio are separate factors which are distinguished one from the other. These two factors cannot be unconditionally determined at the same time by determining one of them.

In order to increase the crystalline phase-generating region independently from the crystallization ratio, there can mentioned a method wherein the dopant concentration which serves as a crystalline nucleus generation factor is heightened in a region where crystalline phases (crystalline particles) having a relatively large size are intended to generate, and it is lessened in a region where crystalline phases (crystalline particles) having a relatively small size are intended to generate.

Now, it is considered that by adopting a method wherein the crystalline phase size is changed in the thickness direction while increasing the crystallization ratio in a crystallized region, namely, more diminishing an amorphous region in other words, the i-type semiconductor layer which is successively formed is made possible to have a good crystalline property from a film formed at an initial stage as the i-type semiconductor layer.

In the formation of the primary layer, when the entire layer region of the primary layer is crystallized in accordance with such method as above described, the effect of the crystallization treatment in this case is directly influenced also to the first transparent electrically conductive layer on which the primary layer is formed. Because of this, when the first transparent electrically conductive layer contains an oxide material, there is a fear that elimination of oxygen would be occurred to deteriorate the transmittance of the first transparent electrically conductive layer, resulting In a reduction in the back reflection performance. This fear can be desirably eliminated by crystallizing not the entire region of but a partial region of the amorphous semiconductor layer which is situated on the opposite side to the first transparent electrically conductive layer by properly adjusting the related conditions upon the crystallization treatment.

The formation of the primary layer comprising the amorphous semiconductor layer having the first conduction type and the crystalline phase-containing semiconductor layer sequentially stacked in the present invention may be also formed by the following manner. That is, after an amorphous semiconductor layer doped with a prescribed dopant capable of imparting a conductivity of the first conduction type is formed by a plasma CVD method using a high frequency power, a crystalline phase-containing semiconductor layer doped with a prescribed dopant capable of imparting a conductivity of the first conduction type is formed by a plasma CVD method using a high frequency power. In the film formation process in order to form the crystalline phase-containing semiconductor layer, by properly changing the related parameters including the amount of the dopant introduced, the hydrogen dilution ratio, the gas pressure, and the high frequency power applied, it is possible to form the crystalline phase-containing semiconductor layer containing crystalline phases (crystalline particles) which are controlled to have a size magnitude distribution (that is, a particle size distribution) which is continuously increased in the thickness direction.

The silicon series semiconductor layer such p-i-n Junction as above described in the present invention is featured to be formed by a plasma CVD method using a high frequency power with a frequency in a range of 10 MHz to 10 GHz.

In comparison with the case where the conventional film-forming method by way of growing from liquid phase is adopted, the film-forming method by means of the plasma CVD method is more advantageous in that the silicon series semiconductor layer can be efficiently formed at a relatively low temperature and at a reasonable production cost.

The primary layer in the photovoltaic element of the present invention is preferred to be made such that when the thickness of the crystalline phase-containing semiconductor layer having the first conduction type is made to be "d" and of the crystalline phases (crystalline particles) contained in said semiconductor layer, the length of a crystalline phase portion whose length being the longest is made to be "r"; the value of r/d is less than 100.

The results obtained through experimental studies by the present inventors revealed that when the value of r/d is beyond 100, a stress is liable to occur at the crystalline phase-containing semiconductor layer having the first conduction type in a direction of the surface thereof, where layer peeling is liable to occur at the interface between the first transparent electrically conductive layer and the primary layer. The control of the value of r/d may be conducted by a manner in that the concentration profile of the dopant contained in the crystalline phase-containing semiconductor layer having the first conduction type is continuously controlled as required or by a manner in that in the case of using the crystallization treatment by way of crystal growth in the liquid phase state, the temperature involved is promptly changed as required.

Description will be made of the photovoltaic element of the present invention with reference to FIG. 6.

Figure 6:
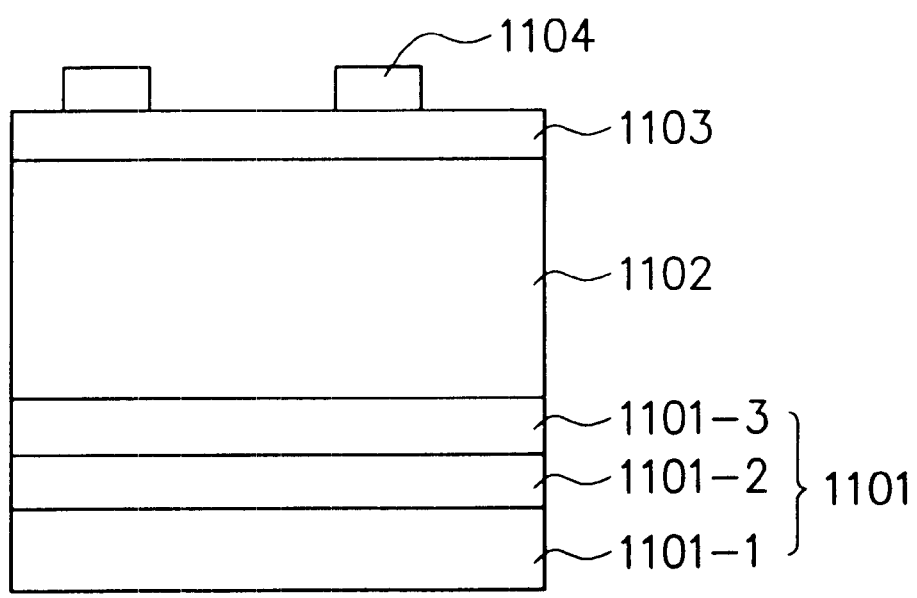
FIG. 6 is a schematic cross-sectional view illustrating another example of a photovoltaic element according to the present invention.

FIG. 6 is a schematic cross-sectional view illustrating an example of a photovoltaic element of the present invention. In FIG. 6, reference numeral 1101 indicates a base member comprising a substrate 1101-1, a metal layer 1101-2 and a first transparent electrically conductive layer 1101-3, where the metal layer 1101-2 and the first transparent electrically conductive layer 1101-3 are formed in this order on the substrate 1101-1. Reference numeral 1102 indicates a semiconductor layer (corresponding to the foregoing silicon series semiconductor layer in the present invention) which is formed on the first transparent electrically conductive layer 1101-3. Reference numeral 1103 indicates a second transparent electrically conductive layer which is formed on the semiconductor layer 1102, and reference numeral 1104 a collecting electrode (comprising a grid electrode).

In the following, description will be made of each constituent of the photovoltaic element shown in FIG. 6.

Substrate:

As the substrate 1101-1, there can be used plate members and sheet-like members, respectively comprising a metallic material, synthetic resin, glass, ceramic, or semiconductor bulk. The substrate 1101-1 may have an uneven surface provided with minute irregularities.

In the case where the substrate 1101-1 comprises a transparent member such as a glass plate, it is possible that light is impinged from the side of the substrate 1101-1.

The substrate 1101-1 may be formed in an elongated web form which is suitable for continuous film formation by means of a roll-to-roll film-forming method. In this case, a flexible web member made of a stainless steel or a synthetic resin such as polyimide or the like is used as the substrate 1101-1.

Metal Layer:

The metal layer 1101-2 serves as a lower electrode and it also serves as a back reflecting layer which functions to reflect light which reaches the substrate 101-1 into the semiconductor layer 1102 so as to reuse therein.

The metal layer 1101-2 may be constituted by a metallic material such as Al, Cu, Ag, Au, CuMg, or AlSi.

The metal layer 1101-2 is preferred to have an uneven surface provided with minute irregularities in order that light which reaches the substrate 101-1 is efficiently reflected into the semiconductor layer 1102 to elongate the optical path length therein whereby increasing the short-circuit current.

The metal layer 1101-2 may be omitted in the case where the substrate 1101 is electrically conductive.

The metal layer 1101-2 may be formed by means of vacuum evaporation, sputtering, electro-deposition, or screen printing.

First Transparent Electrically Conductive Layer:

The first transparent electrically conductive layer 1101-3 functions to irregularly reflect not only incident light which reaches there but also light reflected by the metal layer 1101-2 into semiconductor layer 1102 thereby to elongate the optical path length in the semiconductor layer whereby increasing the short-circuit current. Besides, the first transparent electrically conductive layer 1101-3 also functions to prevent the elements of the metal layer 1101-2 from being diffused or migrated into the semiconductor layer 1102 to .make the photovoltaic element shunted. In addition, by making the first transparent electrically conductive layer 1101-3 have an adequate electric resistance, the first transparent electrically conductive layer functions to prevent the photovoltaic element from being short-circuited due to defects such as pinholes and the like present in the semiconductor layer 1102.

As well as the metal layer 1101-2, the first transparent electrically conductive layer 1101-3 is preferred to have an uneven surface, provided with minute irregularities.

The first transparent electrically conductive layer 1101-3 is preferred to comprise an electrically conductive oxide material such as zinc oxide (ZnO), indium oxide ($In_2O_3$), ITO ($In_2O_3$—$SnO_2$), or a mixture of these oxide materials. Any of these electrically conductive oxide materials may contain a material capable of changing the conductivity.

The first transparent electrically conductive layer 1101-3 may be formed by means of vacuum evaporation, sputtering, CVD (chemical vapor phase deposition), or electro-deposition, method using an aqueous solution containing nitric acid radical, acetic acid radial or ammonium radical, and metal ions, or a dipping method.

Base Member:

The base member 1101 may be formed by stacking the metal layer 1101-2 if necessary and the first transparent electrically conductive layer 1101-3 on the substrate 1101-1. For the purpose of facilitating integration of elements, it is possible to provide an insulating layer as an intermediate layer on the substrate 1101.

Semiconductor Layer:

The principal constituent of the semiconductor layer 1102 includes an amorphous phase-containing silicon (Si) material, a crystalline phase-containing silicon (Si) material, and a mixed phase (comprising amorphous phases and crystalline phases)-containing silicon (Si) material. The silicon in any of these materials may be an alloy of silicon (Si) and carbon (C) or germanium (Ge). The semiconductor layer 1102 also contains hydrogen atoms (H) and/or halogen atoms (X) The amount of H or X or the sum amount of H and X contained in the semiconductor layer 1102 is preferably in a range of 0.1 to 40 atomic %. The semiconductor layer 1102 may additionally contain oxygen atoms (O) or/and nitrogen atoms (N).

The semiconductor layer 1102 includes an n-type semiconductor layer incorporated with an element belonging to group V of the periodic table, an i-type semiconductor layer, and a p-type semiconductor layer incorporated with an element belonging to group III of the periodic table.

Each of the n-type semiconductor layer and the p-type semiconductor layer is preferred to have an activation energy which is preferably 0.2 eV or less or most preferably 0.1 eV or less and a resistivity which is preferably 100 Ωcm or less or most preferably 1 Ωcm or less.

In the case where the semiconductor layer 1102 comprises a stacked cell having a plurality of p-i-n junctions, it is preferred to be designed such that the i-type semiconductor layer in the p-i-n junction which is situated in the vicinity of the light incident side has a relatively large band gap and the i-type semiconductor layer in the p-i-n junction which is distant from the light incident side has a relatively small band gap. And the i-type semiconductor layer in each p-i-n junction is preferred to have a band gap graded in the i-type semiconductor layer such that it has a minimum value at a position which is sided toward the p-type semiconductor layer from the center in the thickness direction of the i-type semiconductor layer.

The doped layer (the p-type semiconductor layer or the n-type semiconductor layer) which is situated on the light incident side is preferred to comprise a crystalline semiconductor material whose light absorptiveness is small or a semiconductor material having a large band gap.

As a specific example of a stacked cell comprising two p-i-n junctions stacked, there can be mentioned a stacked structure comprising two combinations each having such i-type silicon-containing semiconductor layer as above described, a first combination comprising an amorphous semiconductor layer and a crystalline phase-containing semiconductor layer and a second combination comprising a crystalline phase-containing semiconductor layer and a crystalline phase-containing semiconductor layer in this order from the light incident side As a specific example of a stacked cell comprising three p-i-n junctions stacked, there can be mentioned a stacked structure comprising three combinations each having such i-type silicon-containing semiconductor layer as above described, a first combination comprising an amorphous semiconductor layer, an amorphous semiconductor layer and a crystalline phase-containing semiconductor layer, a second combination comprising an amorphous semiconductor layer, a crystalline phase-containing semiconductor layer and a crystalline phase-containing semiconductor layer, and a third combination comprising a crystalline phase-containing semiconductor layer, a crystalline phase-containing semiconductor layer and a crystalline phase-containing semiconductor layer in this order from the light incident side. In any case, the i-type semiconductor layer is preferred to have an absorption coefficient ($\alpha$) of 5000 $cm^{-1}$ or more for light having a wavelength of 630 nm, a photoconductivity ($\sigma p$) of more than $10 \times 10^{-5}$ S/cm under irradiation of pseudo sunlight by a solar simulator (AM 1.5, 100 $mW/cm^2$), a dark conductivity ($\sigma d$) of less than $10 \times 10^{-6}$ S/cm, and an Urbach energy of less than 55 meV by CPM (constant photocurrent method) The i-type semiconductor layer may have a slightly p- or n-type property.

Figure 8:
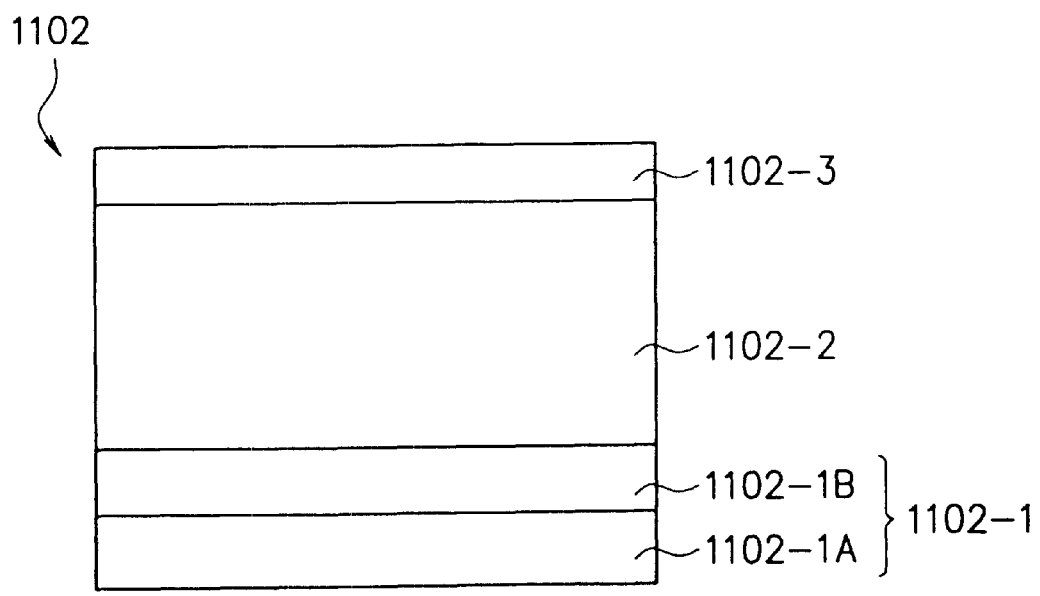
FIG. 8 is a schematic cross-sectional view illustrating an example of the constitution of a semiconductor layer used in a photovoltaic element according to the present invention.

Description in more detail will be made of the semiconductor layer 1102 with reference to FIG. 8. FIG. 8 is a schematic cross-sectional view illustrating an example of a semiconductor layer having a p-i-n junction as the semiconductor layer 1102. In FIG. 8, reference numeral 1102-1A indicates an amorphous semiconductor layer having a first conduction type, and reference numeral 1102-1B a crystalline phase-containing semiconductor layer containing crystalline phases (crystalline particles) and having a first conduction type. Reference numeral 1102-1 indicates a primary layer comprising the amorphous semiconductor layer 1102-

1A and the crystalline phase-containing semiconductor layer 1102-1B which are stacked in this order. Reference numeral 1102-2 indicates a crystalline phase-containing i-type semiconductor layer containing crystalline phases (crystalline particles) formed on the primary layer 1102-1, and reference numeral 1102-3 a non-single crystal semiconductor layer having a second conduction type which is formed on the i-type semiconductor layer 1102-2. In the case where the semiconductor layer (1102) has a plurality of p-i-n junctions, it is preferred that at least one of the p-i-n junctions is structured as above described.

The amorphous semiconductor layer 1102-1A having the first conduction type is preferred to have a thickness in a range of 2.0 nm to 100 nm. The crystalline phase-containing semiconductor layer 1102-1B having the first conduction type is preferred to have a thickness in a range of 2.0 nm to 100 nm. And the crystalline phase-containing semiconductor layer 1102-1B having the first conduction type is preferred to designed such that when the thickness of the crystalline phase-containing semiconductor layer 1102-1B is made to be "d" and of the crystalline phases (the crystalline particles) contained in said semiconductor layer, the length of a crystalline phase portion whose length being the longest is made to be "r" the value of r/d is less than 100.

Formation of Semiconductor Layer:

As previously described, the semiconductor layer 1102 is preferred to be formed by means of a high frequency plasma CVD method using a high frequency power.

The formation of the semiconductor layer 1102 by means of the high frequency plasma CVD may be conducted, for example, in the following manner using a plasma CVD apparatus having at least a deposition chamber (a vacuum chamber) capable of being evacuated to bring the inside thereof to a reduced pressure, a high frequency power introduction means (which is electrically connected to a high frequency power source) for introducing a high frequency power into the deposition chamber, and a raw material gas introduction means for introducing a raw material gas into the deposition chamber.

(1) A given substrate is arranged in the deposition chamber of the plasma CVD apparatus. The inside of the deposition chamber is evacuated to a prescribed vacuum.

(2) Prescribed raw material gas including dilution gas is introduced into the deposition chamber through the raw material gas introduction means. The deposition chamber is evacuated by means of a vacuum pump to bring the inside thereof to a prescribed inner pressure (gas pressure) and the inside of the deposition chamber is maintained at this inner pressure.

(3) The substrate is heated to and maintained at a prescribed temperature by means of a heater.

(4) A high frequency power with a prescribed frequency from the high frequency power source is introduced into the deposition chamber through the high frequency power introduction means. The high frequency power Introduction means may comprise a waveguide (which is extending from the high frequency power source) and a dielectric window made of ceramics or the like (which is connected to the waveguide and is hermetically provided at the deposition chamber) where the high frequency power from the high frequency power source is guided by the waveguide, followed by being introduced into the deposition chamber through the dielectric window. Besides, the high frequency power introduction means may comprises a coaxial cable (which is extending from the high frequency power source) and a high frequency power application electrode (which is electrically connected to the coaxial cable) which is arranged in the deposition chamber where the high frequency power from the high frequency power source is guided by the coaxial cable, followed by being introduced into the deposition chamber through the high frequency power application electrode.

(5) In the above, when the high frequency power is introduced into the deposition chamber, plasma is generated to decompose the raw material gas in the deposition chamber, whereby a deposited film is formed on the substrate arranged in the deposition chamber.

The above film-forming procedures are repeated prescribed times. In this way, a layered semiconductor layer as the semiconductor layer 1102 can be formed.

Preferable conditions for forming the semiconductor layer 1102 are that the substrate temperature is in a range of 100 to 450° C., the inner pressure is in a range of 0.5 mTorr to 100 Torr, and the wattage of the high frequency power is in a range of 0.001 to 2 W/cm$^2$.

As raw material gas suitable for the formation the semiconductor layer 1102, there can be mentioned gaseous or easily gasifiable silicon (Si)-containing compounds such as $SiH_4$, $Si_2H_6$, $SiF_4$, and the like. In the case where an alloy series semiconductor layer as a constituent of the semiconductor layer 1102 is intended to form, gaseous or easily gasifiable germanium (Ge) or carbon (C)-containing compounds such as $GeH_4$, $CH_4$, and the like is preferred to be selectively used in addition to the above-mentioned silicon (Si)-containing compound.

These raw material gases are preferred to be introduced into the deposition chamber by diluting with an appropriate dilution gas. Such dilution gas, $H_2$ gas, He gas, Ar gas, and the like may be selectively used. Further, it is possible to use gaseous or easily gasifiable nitrogen (N) or/and oxygen (O)-containing compounds as the raw material gas or the dilution gas.

In order to make the semiconductor layer involved to be of n-type or p-type, an appropriate gaseous doping material capable of imparting a given doping element is used together with a given raw material gas used upon forming the semiconductor layer Such gaseous doping material capable of imparting a doping element of p-type can include, for example, $BH_3$, $BF_3$, and the like. Similarly, such gaseous doping material capable of imparting a doping element of n-type can include, for example, $PH_3$, $PF_3$, and the like.

In the case of forming a crystalline-phase containing semiconductor layer or a semiconductor layer comprising, for example, silicon carbide (SiC) and which is slightly light-absorptive but has a large band gap as a constituent of the semiconductor layer 1102, it is preferred that the proportion of the dilution gas to the raw material gas is increased and the high frequency power of a relatively high wattage is introduced.

Formation of Primary Layer:

The primary layer 1102-1 (See, FIG. 8) may be formed by means of a plasma CVD method using a high frequency power, for example, in the following manner. That is, an amorphous semiconductor layer 1102-1A having a first conduction type is formed, and on the amorphous semiconductor layer 1102-1A, a crystalline phase-containing semiconductor layer 1102-1B having a first conduction type is formed such that the semiconductor layer 1102-1B contains crystalline phases (crystalline particles) having a size magnitude distribution which is continuously changed in the thickness direction.

The primary layer 1102-1 may be also formed by means of a plasma CVD method using a high frequency power, for example, In the following manner. That is, a doped amorphous semiconductor layer having a first conduction type and a non-doped amorphous i-type semiconductor layer are sequentially formed to obtain a stacked body, and the stacked body is subjected to a crystallization treatment from the i-type semiconductor layer side to crystallize part of the i-type semiconductor layer, where the dopant contained in the doped semiconductor layer is dispersed into the i-type semiconductor layer to establish a dopant concentration gradient is in the stacked body, and based on the dopant concentration gradient, there is formed a layered structure containing crystalline phases whose size magnitude being continuously changed in the thickness direction Besides, the primary layer 1102-1 may be formed by a method wherein a doped amorphous semiconductor layer having a dopant concentration gradient, and the doped amorphous semiconductor layer is subjected to a crystallization treatment, where part of the doped amorphous semiconductor layer is crystallized.

Second Transparent Electrically Conductive Layer:

The second transparent electrically conductive layer 1103 is formed on the semiconductor layer 1102. The transparent electrically conductive layer 1103 functions as an electrode on the light incident side. It is possible to make the transparent electrically conductive layer 1103 to function also as a reflection preventive film by making the transparent electrically conductive layer 1103 have a prescribed thickness. The transparent electrically conductive layer 1103 is required to have a high transmittance for light having a wavelength which is capable of being absorbed by the semiconductor layer 1102 and a low resistance. The transmittance is preferably more than 80% or more preferably 85% for light having a wavelength of 550 nm. The low resistance is preferably less than $5 \times 10^{-3}$ Ωcm or more preferably less than $1 \times 10^{-3}$ Ωcm.

The transparent electrically conductive layer 1103 is preferred to be constituted by a material having a low resistance such as zinc oxide (ZnO), indium oxide ($In_2O_3$), ITO ($In_2O_3$—$SnO_2$), or a mixture of these. These materials may contain a material capable of changing the conductivity.

The transparent electrically conductive layer 1103 may be formed by means of vacuum evaporation, CVD (chemical vapor phase deposition), sputtering, spraying, spin coating, or dipping.

Collecting Electrode:

The collecting electrode 1104 is provided on the transparent electrically conductive layer 1103 in order to efficiently collect the electric current generated by virtue of a photoelectromotive force on the transparent electrically conductive layer 1103.

The collecting electrode 1104 may be formed by a method of forming an electrode pattern comprising a metal by means of sputtering, using a mask pattern, a method of screen-printing an electrically conductive paste or a solder paste using a mask pattern, or a method of bonding a metal wire using an electrically conductive paste.

Independently, if necessary, a protective layer may be formed on each of the opposite sides of the photovoltaic element. Separately, it is possible to provide a reinforcing member such as a steel plate or the, like at the back face (opposite to the light incident side) of the photovoltaic element.

In the following, the present invention will be described in more detail with reference examples. It should be understood that these examples are only for illustration purposes and not intended to restrict the scope of the present invention to these examples.

EXAMPLE 1

In this example, a plurality of photovoltaic elements having such constitution of the photovoltaic element 100 shown in FIGS. 1 to 3 were prepared while conducting evaluation depending upon necessity, and using these photovoltaic elements, a plurality of photovoltaic element modules having such constitution of the photovoltaic element module 101 shown in FIG. 1.

1. Preparation of Photovoltaic Element:

Each photovoltaic element was prepared in the following manner.

As the substrate 1, there were provided a plurality of dull-finished stainless steel SUS 430 plates having an uneven surface and having a square form of 45 mm×45 mm and, a thickness of 0.15 mm. These stainless steel plates as the substrate 1 were subjected to alkali-washing, hot-water washing, and air-dried. The stainless steel plates thus cleaned were arranged in a deposition chamber of a D.C. magnetron sputtering apparatus, where the inside of the deposition chamber was evacuated until the inner pressure became less than 2 mTorr. Thereafter, Ar gas was introduced into the deposition chamber of the sputtering apparatus at a flow rate of 30 sccm, and the inner pressure of the deposition chamber was maintained at 2 mTorr. Thereafter, each of the substrates 1 (that is, the stainless steel plates) was heated to and maintained at 400° C., and a D.C. power of 1 Kw was applied to an Ag target of 6 inches (15.24 cm) in diameter for 90 seconds to form an about 600 nm thick Ag-layer as the back reflecting layer 2 on the uneven surface of each substrate 1. At this time, one of the substrates 1 each having the Ag-layer as the back reflecting layer 2 formed thereon was taken out from the sputtering apparatus and it was observed by means of a scanning electron microscope with respect to its surface state. As a result, it was found to have an uneven surface provided with irregularities having an average top-to-valley elevation of about 100 nm. Thereafter the electrical connection to the Ag target was switched to a ZnO target of 6 inches (15.24 cm) in diameter, and each of the remaining substrates in the deposition chamber of the sputtering apparatus was heated to maintained at 450° C. where a D.C. power of 1 Kw was applied to the ZnO target for 180 seconds to form an about 1000 nm thick ZnO layer as the transparent electrically conductive layer 3 on the back reflecting layer 2 of each substrate. After this, all the substrates each having the back reflecting layer 2 and the transparent electrically conductive layer 3 formed in this order thereon were taken out from the sputtering apparatus. One of these substrates was observed by means of the scanning electron microscope with respect to its surface state. As a result, the surface of the transparent electrically conductive layer 3 of the substrate was found to have irregularities with an average top-to-valley elevation of about 200 nm which is greater than that of the back reflecting layer 2.

On the transparent electrically conductive layer 3 of each of the substrates having the back reflecting layer 2 and the transparent electrically conductive layer 3 formed in this order thereon, the semiconductor junction layer 4 was formed using the film-forming apparatus shown in FIG. 5 as will be described below.

The substrates 1 having the back reflecting layer 2 and the transparent electrically conductive layer 3 formed in this order thereon were spacedly arranged on a transportation jig 32 in a load and unload chamber 31 of the film-forming apparatus shown in FIG. 5. The transportation jig 32 comprises a substrate holder (not shown) structured so that it can hold thereon a specimen (a substrate) so as to face in a downward direction and it can be moved up and down. And the substrate holder is provided with an opening through which the specimen held thereon is exposed to a film-forming space of a film-forming chamber, where a desired film can be formed on the specimen by the film-forming chamber.

The film-forming apparatus is structured so that the transportation jig 32 can be moved by means of conveying means 32' therein.

Formation of Semiconductor Layer 4A:

After the load and unload chamber 31 was evacuated until $10^{-4}$ Torr by means of a vacuum pump (not shown) connected to an exhaust pipe (not shown) communicated with the inside of the load and unload chamber 31, a gate valve 33 was opened, and the transportation jig 32 having the substrate holder with the substrates 1 (each having the back reflecting layer 2 and the transparent electrically conductive layer 3 formed in this order thereon) held thereon was moved to a position above an n-type layer-forming space 34-1 of a first film-forming chamber 34 which is situated under a substrate temperature controlling means 35. The gate valve 33 was closed, the substrate holder was press-descended by means of the substrate temperature controlling means 35 such that a distance between each substrate and a counter electrode 44 situated on the lower side of the n-type layer-forming space 34-1 was 30 mm, and the surface of each substrate was controlled to have a temperature of 250° C. by means of the substrate temperature controlling means 35. In this case, a gate valve 38 situated to opposite the gate valve 33 through the film-forming chamber 34 was also closed. Then, after the film-forming chamber 34 including the R-type layer-forming space 34-1 was sufficiently evacuated by means of a vacuum pump (not shown) connected to an exhaust pipe (not shown) which is communicated with the inside of the film-forming chamber 34 and is provided with a throttle valve (not shown), $Si_2H_6$ gas, $PH_3/H_2$ gas ($PH_3$ diluted by $H_2$ to 2%) and $H_2$ gas were introduced into the n-type layer-forming space 34-1 through a gas feed pipe 49 extending from a raw material gas supply system comprising a gas reservoir 49-1 containing $Si_2H_6$ gas, a gas reservoir 49-2 containing $PH_3/H_2$ gas ($PH_3$ diluted by $H_2$ to 2%) and a gas reservoir 49-3 containing $H_2$ gas at respective flow rates of 1 sccm, 0.5 sccm and 48 sccm. Then, the opening of the throttle valve provided at the exhaust pipe connected to the film-forming chamber 34 was adjusted to maintain the inner pressure of the n-type layer-forming space 34-1 at 1 Torr, and a high frequency power (13.56 MHz) of 1.8 W from a high frequency power source with an oscillation frequency of 13.56 MHz (not shown) was supplied to the counter electrode 44 to cause glow discharge in the n-type layer-forming space 34-1 for 3 minutes. By this, there was formed an about 20 nm thick n-type semiconductor layer containing no crystalline phase as the first semiconductor layer 4A on the transparent electrically conductive layer 3 of each substrate 1.

Formation of Semiconductor Layer 4B:

After the formation of the semiconductor layer 4A, the operation of the substrate temperature controlling means 35, the introduction of the raw material gases and the application of the high) frequency power were terminated And the substrate temperature controlling means 35 was lifted and the film-forming chamber 34 was sufficiently evacuated by means of the vacuum pump. Then, the transportation jig 32 having the substrate holder with the substrates 1 having the first semiconductor layer 4A formed thereon was moved to a position right above an i-type layer-forming space 34-2 of the first film-forming chamber 34 which is situated under a substrate temperature controlling means 36. The substrate holder was press-descended by means of the substrate temperature controlling means 36 such that a distance between each substrate and a counter electrode 45 situated on the lower side of the i-type layer-forming space 34-2 was 30 mm, and the surface of each substrate was controlled to have a temperature of 270° C. by means of the substrate temperature controlling means 36. Then, after the film-forming chamber 34 including the i-type layer-forming space 34-2 was sufficiently evacuated by means of the vacuum pump, $Si_2H_6$ gas and $H_2$ gas were introduced into the i-type layer-forming space 34-2 through a gas feed pipe 50 extending from a raw material gas supply system comprising a gas reservoir 50-1 containing $Si_2H_6$ gas and a gas reservoir 50-2 containing $H_2$ gas at respective flowrates of 4 sccm, and 100 sccm. Then, the opening of the throttle valve provided at the exhaust pipe connected to the film-forming chamber 34 was adjusted to maintain the inner pressure of the i-type layer-forming space 34-2 at 0.5 Torr, and a high frequency power (13.56 MHz) of 2 W from a high frequency power source with an oscillation frequency of 13.56 MHz (not shown) was supplied to the counter electrode 45 to cause glow discharge in the i-type layer-forming space 34-2 for 80 seconds. By this, there was formed an about 25 nm thick i-type semiconductor layer containing no crystalline phase, which becomes to be the second semiconductor layer 4B, on the first semiconductor layer 4A of each substrate 1.

After the formation of the i-type semiconductor layer on each substrate, the operation of the substrate temperature controlling means 36, the introduction of the raw material gases and the application of the high frequency power were terminated. And the substrate temperature controlling means 36 was lifted and the film-forming chamber 34 was sufficiently evacuated by means of the vacuum pump. Then, the gate valve 38 and a gate valve 41 were opened, and the transportation jig 32 having the substrate holder with the substrates 1 having the i-type semiconductor layer formed thereon was moved into a laser processing chamber 42 while passing through a second film-forming chamber 39, where the substrate holder was positioned right under a substrate temperature controlling means 43 which is structured so that it can be moved in a direction for the substrate holder to be transported. After the gate valve 41 was closed, the substrate holder was press-descended until a prescribed position by means of the substrate temperature controlling means 43, and the surface of each substrate (that is, the surface of the i-type semiconductor layer of each substrate) on the substrate holder was controlled to have a temperature of 200° C. by means of the substrate temperature controlling means 43. After the laser processing chamber 42 was sufficiently evacuated by means of a vacuum pump (not shown) connected to an exhaust pipe (not shown) which is communicated with the inside of the laser processing chamber 42 and is provided with a throttle valve (not shown), $H_2$ gas was introduced into the laser processing chamber 42 through a gas feed pipe 53 connected to a raw material gas supply system comprising a gas reservoir 53-1 containing $H_2$ gas at a flow rate of 500 sccm. After this, the inner pressure of the laser processing chamber 42 was maintained at about 10 Torr by adjusting the opening of the throttle valve provided at the exhaust pipe connected to the laser processing chamber 42. Then, using a conventional xenon-chlorine type excimer laser 56, laser beam with a wavelength of about 308 nm, a pulse width of 13 nsec and 30 pulses per sec was irradiated from the lower side of the laser processing chamber 42 through a quartz glass window 54 applied with non-reflection treatment to the surface thereof, while controlling the energy density at 150 mJ/cm$^2$. Particularly, by adjusting the optical system so that an irradiation region at each substrate surface per one pulse became to be of a dimension of about 3 mm (length)×3 mm (width) and traveling a reflection mirror 55 in a direction perpendicular to the transportation direction of the substrate holder with the substrates, the laser beam was irradiated to the surface of each substrate (that is, the surface of the i-type semiconductor layer of each substrate) on the substrate holder at a scanning speed of 9 mm/sec, where the irradiation position was shifted little by little so that about 90% of a given irradiation region was overlapped with the successive irradiation region In this case, the reflection mirror 55 was moved in aforesaid direction by 2.2 mm for every scanning using a stepping motor. By performing the laser beam irradiation scanning 20 times, the substantially entire surface of each substrate could be laser-processed.

In the above, the commencement and termination of the laser irradiation, the scanning of the reflection mirror, and the transportation of the substrate holder with the substrates were controlled using a personal computer.

By the manner described in the above, substantially only the i-type semiconductor layer of each substrate could be microcrystallized to have a structure containing approximately spherical microcrystalline phases having a varied average size distribution such that said spherical microcrystalline phases on the laser irradiated side have an average size which is greater than that of said spherical microcrystalline phases on the side of the first semiconductor layer 4A, whereby the second semiconductor layer 4B was formed on the first semiconductor layer 4A of each substrate.

For confirmation purposes, one substrate prior to subjecting to the laser processing and another substrate subjected to the laser processing were taken out from the film-forming apparatus. And each of them was subjected to analysis using a conventional argon laser Raman spectroscopic ultramicroanalyzer. As a result, the i-type semiconductor layer prior to subjecting to the laser processing was found to be a non-crystalline layer having a Raman spectrum broadened centering at about 480/cm. On the other hand, the layer obtained by subjecting the i-type semiconductor layer to the laser processing was found to have a Raman spectrum with a sharp peak of about 520/cm Based on this result, it was confirmed that the layer obtained by subjecting the i-type semiconductor layer to the laser processing was microcrystallized.

Formation of Third Semiconductor Layer 4C:

For the remaining substrates having the second semiconductor layer 4B formed thereon situated on the substrate holder, the third semiconductor layer 4C was formed on the second semiconductor layer 4B of each substrate as will be described below.

After the formation of the second semiconductor layer 4B, the operation of the substrate temperature controlling means 43, the operation of the excimer laser 56 and the introduction of the H$_2$ gas were terminated. And the substrate temperature controlling means 43 was lifted, and the laser processing chamber 42 was sufficiently evacuated by means of the vacuum pump. After this, the gate valve 41 was opened. Then, the transportation jig 32 having the substrate holder with the substrates having the second semiconductor layer 4B formed thereon was moved into the second film-forming chamber 39, where the substrate holder was positioned right under a substrate temperature controlling means 40. Thereafter, the gate valves 38 and 41 were closed, and the substrate holder was press-descended by means of the substrate temperature controlling means 40 until a prescribed position. Then, the surface of each substrate (that is, the surface of the second semiconductor layer 4B of each substrate) was controlled to have a temperature of 350° C. by means of the substrate temperature controlling means 40. Then, after the film-forming chamber 39 was sufficiently evacuated by means of a vacuum pump (not shown) connected to an exhaust pipe (not shown) which is communicated with the inside of the film-forming chamber 39 and is provided with a throttle valve (not shown), SiF$_4$ gas and H$_2$ gas were introduced into the film-forming chamber 39 through a gas feed pipe 52 extending from a raw material gas supply system comprising a gas reservoir 52-1 containing SiF$_4$ gas and a gas reservoir 52-2 containing H$_2$ gas at respective flow rates of 80 sccm and 240 sccm. Then, the opening of the throttle valve provided at the exhaust pipe connected to the film-forming chamber 39 was adjusted to maintain the inner pressure of the film-forming chamber 39 at 0.1 Torr, and a microwave power of 200 W was introduced into the film-forming chamber 39 through an applicator 47 electrically connected to a microwave power source of 2.45 GHz (not shown) through a waveguide 48 to cause glow discharge in the film-forming chamber 39 for 20 minutes. By this, there was formed an about 1000 nm thick i-type semiconductor layer containing pillar microcrystalline phases as the third semiconductor layer 4C on the second semiconductor layer 4B of each substrate.

After the formation of said i-type semiconductor layer as the third semiconductor layer 4C on the second semiconductor layer 4B of each substrate, the operation of the substrate temperature controlling means 40, the introduction of the raw material gases and the introduction of the microwave power were terminated.

For confirmation purposes, one of the substrates situated on the substrate holder way taken out from the film-forming apparatus, and the i-type semiconductor layer formed thereon as the third semiconductor layer 4C was subjected to X-ray diffraction analysis. As a result, there was observed a peak at a region of about 47.5° which is corresponding to (220) plane of Si. Similarly, it was subjected to analysis using the foregoing Raman spectroscopic ultramicroanalyzer. As a result, there was observed a peak at a region of about 516/cm. These results indicate that the i-type semiconductor layer contains microcrystalline phases.

Further, a cross section of the layered structure of the substrate was examined by means of a transmission electron microscope. As a result, there were obtained the following facts. That is, the first semiconductor layer 4A was found to comprise a semiconductor material with no crystalline phase in which any microcrystalline phase with a size of 5 nm or more is not observed at all. For the second semiconductor layer 4B, it was found that the approximately spherical microcrystalline phases situated on the side of the first semiconductor layer 4A have an average size of about 5 nm and the approximately spherical microcrystalline phases situated on the side of the third semiconductor layer 4C have an average size of about 10 nm. For the pillar microcrystalline phases of the third semiconductor layer 4C, it was found that longer ones of them have a length which is near the layer thickness and a width of about 50 nm. Further, it was found that a layer region of the third semiconductor layer 4C in the vicinity of the second semiconductor layer 4B contains also approximately spherical microcrystalline phases having an average size of about 50 nm mingled together with the pillar microcrystalline phases.

Formation of Fourth Semiconductor Layer 4D:

For remaining substrates having the third semiconductor layer 4C formed thereon situated on the substrate holder, the fourth semiconductor layer 4D was formed on the third semiconductor layer 4C of each substrate as will be described below.

After the substrate temperature controlling means 40 was lifted and the second film-forming chamber 39 was sufficiently evacuated by means of the vacuum pump, the gate valve 38 was opened. Then, the transportation jig 32 having the substrate holder with the substrates having the third semiconductor layer 4C formed thereon was moved to return to a position right above the i-type layer-forming space 34-2 of the first film-forming chamber 34 which is situated under the substrate temperature controlling means 36. After this, the gate valve 38 was closed. Then, the substrate holder was press-descended by means of the substrate temperature controlling means 36 such that a distance between each substrate and the counter electrode 45 situated on the lower side of the i-type layer-forming space 34-2 was 30 mm, and the surface of each substrate (that is, the surface of the third semiconductor layer 4C of each substrate) was controlled to have a temperature of 270° C. by means of the substrate temperature controlling means 36. Then, after the film-forming chamber 34 including the i-type layer-forming space 34-2 was sufficiently evacuated by means of the vacuum pump, $Si_2H_6$ gas and $H_2$ gas were introduced into the i-type layer-forming space 34-2 through the gas feed pipe 50 at respective flow rates of 4 sccm and 100 sccm. Then, the opening of the throttle valve provided at the exhaust pipe connected to the film-forming chamber 34 was adjusted to maintain the inner pressure of the i-type layer-forming space 34-2 at 0.5 Torr, and a high frequency power (13.56 MHz) of 2 W from the high frequency power source with an oscillation frequency of 13.56 MHz (not shown) was supplied to the counter electrode 45 to cause glow discharge in the i-type layer-forming space 34-2 for 2 minutes. By this, there was formed an about 40 nm thick i-type semiconductor layer as the fourth semiconductor layer 4D on the third semiconductor layer 4C of each substrate.

After the formation of the fourth semiconductor layer 4D on the third semiconductor layer 4C of each substrate, the operation of the substrate temperature controlling means 36, the introduction of the raw material gases and the application of the high frequency power were terminated.

Formation of Fifth Semiconductor Layer 4E:

The substrate temperature controlling means 36 was lifted and the film-forming chamber 34 was sufficiently evacuated by means of the vacuum pump. Then, the transportation jig 32 having the substrate holder with the substrates having the fourth semiconductor layer 4D formed thereon was moved to a position right above a p-type layer-forming space 34-3 of the first film-forming chamber 34 which is situated under a substrate temperature controlling means 37. The substrate holder was press-descended by means of the substrate temperature controlling means 37 such that a distance between each substrate and a counter electrode 46 situated on the lower side of the p-type layer-forming space 34-3 was 30 mm, and the surface of each substrate (that is, the surface of the fourth semiconductor layer 4D of each substrate) was controlled to have a temperature of 165° C. by means of the substrate temperature controlling means 37. Then, after the film-forming chamber 34 including the p-type layer-forming space 34-3 was sufficiently evacuated by means of the vacuum pump, $H_2$ gas was introduced into the p-type layer-forming space 34-3 through a gas feed pipe 51 extending from a raw material gas supply system comprising a gas reservoir 51-1 containing $SiH_4/H_2$ gas ($SiH_4$ diluted by $H_2$ to 10%), a gas reservoir 51-2 containing $BF_3/H_2$ gas ($BF_3$ diluted by $H_2$ to 2%) and a gas reservoir 51-3 containing $H_2$ gas at a flow rate of 85 sccm, and the opening of the throttle valve provided at the exhaust pipe connected to the film-forming chamber 34 was adjusted to maintain the inner pressure of the p-type layer-forming space 34-3 at 2 Torr. When the inner pressure of the p-type layer-forming space 34-3 became stable at this vacuum value, a high frequency power (13.56 MHz) of 33 W from a high frequency power source with an oscillation frequency of 13.56 MHz (not shown) was supplied to the counter electrode 46 to cause glow discharge in the p-type layer-forming space 34-3 for 30 seconds, whereby the surface of the fourth semiconductor layer 4D of each substrate was plasma-processed After the application of the high frequency power was suspended, $SiH_4/H_2$ gas ($SiH_4$ diluted by $H_2$ to 10%), $BF_3/H_2$ gas ($BF_3$ diluted by $H_2$ to 2%) and $H_2$ gas were introduced into the p-type layer-forming space 34-3 at respective flow rates of 0.25 sccm, 1 sccm and 35 sccm through the gas feed pipe 51. Then, the opening of the throttle valve provided at the exhaust pipe connected to the film-forming chamber 34 was adjusted to maintain the inner pressure of the p-type layer-forming space 34-3 at 2 Torr. When the inner pressure of the p-type layer-forming space 34-3 became stable at this vacuum value, a high frequency power (13.56 MHz) of 44 W from the high frequency power source with an oscillation frequency of 13.56 MHz (not shown) was supplied to the counter electrode 46 to cause glow discharge in the p-type layer-forming space 34-3 for 150 seconds. By this, there was formed an about 10 nm thick p-type semiconductor layer containing crystalline materials as the fifth second semiconductor layer 4E on the fourth semiconductor layer 4D of each substrate. Thus, the semiconductor junction layer 4 was formed on each substrate.

After the formation of the fifth semiconductor layer 4E on each substrate, the operation of the substrate temperature controlling means 37, the introduction of the raw material gases and the application of the high frequency power were terminated.

The thickness of each of the constituent layers was obtained by a manner wherein for a layered product whose constituent layers having been formed respectively under prescribed conditions, a step formed when a part of each constituent layer is removed is measured by a stylus type film thickness-measuring device and the measured result is converted in terms of a time spent for the formation thereof.

After the formation of the fifth semiconductor layer 4E on each substrate, the substrate temperature controlling means 37 was lifted and the gate valve 33 was opened. Then, the transportation jig 32 having the substrate holder with the substrates having the back reflecting layer 2, the transparent electrically conductive layer 3 and the semiconductor junction layer 4 formed in this order thereon was moved into the load and unload chamber 31, where the substrates were unloaded from the transportation jig 32 and they were taken out from the film-forming chamber.

Thus, there were obtained a plurality of layered products each comprising the back reflecting layer 2, the transparent electrically conductive layer 3 and the semiconductor junction layer 4 (comprising the first to fifth semiconductor layers 4A–4E) stacked in this order on the substrate 1.

Formation of Upper Electrode Layer:

On the fifth semiconductor 12 layer 4E of each of the layered products obtained in the above, the upper electrode layer 5 was formed using a DC magnetron sputtering apparatus as will be described below.

Each layered product was fixed onto the surface of an anode of the DC magnetron sputtering apparatus and the surrounding of the layered product was shielded by a stainless steel mask such that a central area of the surface of the fifth semiconductor layer 4E was exposed, and film formation was conducted using an ITO (comprising 10% by weight of $SnO_2$ and 90% by weight of $In_2O_3$) under conditions of 170° C. for the substrate temperature, 50 sccm for the flow rate of inert gas comprising Ar gas, 0.5 sccm for the flow rate of oxygen gas, 3 mtorr for the inner pressure of the deposition chamber, 0.2 W/cm² for the an electric power applied per a unit are of the target, and 100 seconds for the deposition time, whereby an about 70 nm thick ITO film as the upper electrode layer 5 was deposited on said exposed central area of the surface of the fifth semiconductor layer 4E. The conditions for the thickness of the ITO film to be formed were based on a previously established calibration curve.

Thus, there were obtained a plurality of photovoltaic elements having such constitution as shown in the photovoltaic element 100 (see, FIGS. 1 to 3).

For each of the resultant photovoltaic elements, there was formed a collecting electrode 6 (a grid electrode) on the upper electrode layer 5 thereof by arranging a copper wire coated by a carbon paste over the surface of the upper electrode layer 5, followed by subjecting to thermocompression bonding.

Then, a tin foil tape as the positive power output terminal 7B was fixed to the collecting electrode 6 using an electrically conductive adhesive. And a copper tub as the negative power output terminal 7A was fixed to the substrate 1.

Here, for each of the photovoltaic elements thus prepared, in order to facilitate power output wiring in the preparation of a photovoltaic element module which will be described later, the positive power output terminal 7B was extended to the rear face side of the photovoltaic element through an insulating member so that it can be extended together with the negative power output terminal 7A to the outside through an opening formed at a back face reinforcing member 10 which will be described later.

2. Preparation of Photovoltaic Element Module:

Using each of the photovoltaic elements obtained in the above, there were prepared a plurality of photovoltaic element modules having such configuration as shown in FIG. 1.

Each photovoltaic element module was prepared as will be described below.

On the light receiving face side of the photovoltaic element, a 460 μm thick EVA sheet having a thickness of (trademark name: PHOTOCAP, produced by Spring Born Laboratories Company) as the sealing material 8 and a 50 μm thick non-oriented ETFE film having a corona-discharged surface (trademark name: TEFZEL, produced by Du Pont company) as the surface protective film 9 were laminated in this order, followed by laminating a 460 μm thick EVA sheet having a thickness of (trademark name: PHOTOCAP, produced by Spring Born Laboratories Company) as the sealing material 8, a 63.5 in thick nylon film (trademark name: DARTEK, produced by Du Pont Company) as the insulating member 11, and a 0.27 mm thick galvanized steel plate (Zn-plated steel plate) (which is provided with an opening through which a pair of power output terminals of the photovoltaic element can be extended to the outside after the completion of production of a photovoltaic element module) as the back face reinforcing member 10 in this order on the non-light receiving face side of the photovoltaic element, whereby a stacked body comprising the ETFE film/the EVA sheet/the photovoltaic element/the EVA sheet/the nylon film/the galvanized steel plate was obtained. In this case, an aluminum mesh member of 16×18 meshes [line diameter: 0.11 inch (0.27 mm)] was arranged on the outside of the ETFE film as the surface protective film through a 50 μm thick Teflon film (trademark name: Teflon PFA film, produced by Du Pont Company) which facilitates removal of the aluminum mesh member from a protruded portion of the EVA which will be occurred in successive vacuum lamination treatment.

The stacked body was subjected to thermocompression bonding at 150° C. for 30 minutes using a vacuum laminater, followed by cooling. After this, the aluminum mesh member was removed together with the Teflon film. And the pair of the power output terminals of the photovoltaic element were together extended to the outside through the opening of the back face reinforcing member. By this, there was obtained a photovoltaic element module having a front surface provided with irregularities based on the aluminum mesh member. In this way, there were prepared a plurality of photovoltaic element modules.

The above mentioned EVA sheet is one which has been widely using as a sealing material for a solar cell (a photovoltaic element). The EVA sheet is an EVA sheet comprised of an EVA resin (vinyl acetate content: 33%) incorporated with 1.5 parts by weight of a crosslinking agent, 0.3 part by weight of an UV absorber, 0.1 part by weight of a photo stabilizer, 0.2 part by weight of an antioxidant, and 0.25 part by weight of a silane coupling agent respectively versus 100 parts by weight of the EVA resin.

Evaluation

For the resultant photovoltaic element modules, their I–V characteristics under irradiation of pseudo sunlight of AM 1.5 (100 mW/cm²) were measured. Based on the measured I–V characteristics, there were obtained a open-circuit voltage (Voc), a short-circuit current (Jsc), a fill factor (F.F.), and a photoelectric conversion efficiency ($\eta$) for each photovoltaic element module. And for all the photovoltaic element modules, their average open-circuit voltage (Voc), average short-circuit current (Jsc), average fill factor (F.F.), and average photoelectric conversion efficiency ($\eta$) were obtained And their average open-circuit voltage (Voc), average short-circuit current (Jsc), average fill factor (F.F), and average photoelectric conversion efficiency ($\eta$) were 0.96, 1.16, 0.99 and 1.11, which are normalized values when those of the photovoltaic elements modules obtained in Comparative Example 1A which will be described later are respectively set at 1.00.

Separately, their average open-circuit voltage (Voc), average short-circuit current (Jsc), average fill factor (F.F.), and average photoelectric conversion efficiency ($\eta$) after having subjected to irradiation of pseudo sunlight of AM 1.5 (100 mW/cm²) for 1000 hours were 0.96, 1.15, 0.99, and 1.16.

The evaluated results obtained are collectively shown in Table 1.

Based on the above results, it is understood that the characteristics of any of the photovoltaic element modules of this example are not substantially deteriorated even when exposed to irradiation of light over a long period of time.

Hence, it is understood that for the photovoltaic element modules obtained in this example, their short-circuit current and fill factor are improved, their short-circuit voltage is satisfactory, their light deterioration is slight, and thus, they excel in total viewpoints with respect to characteristics.

Further, the photovoltaic element modules of this example were subjected to environmental test for 1000 hours using an environmental test box with temperature of 85° C. and humidity of 85%. As a result, their photoelectric conversion efficiency was decreased only by 0.02%, which is not problematic in practice.

EXAMPLE 2

The procedures of Example 1 were repeated, except that the energy density of the laser beam in the formation of the second semiconductor layer 4B was changed to 200 mJ/cm$^2$, to obtain a plurality of photovoltaic element modules.

In the course of forming the semiconductor junction layer 4, as well as in the case of Example 1, cross section observation by means of the transmission electron microscope was conducted. As a result, there were obtained results which are substantially the same as those obtained in Example 1. That is, no crystalline phase was observed in the first semiconductor layer 4A. For the second semiconductor layer 4B, it was found to have approximately spherical microcrystalline phases on the side of the third semiconductor layer 4C which have an average size which is greater than that of approximately spherical microcrystalline phases situated on the side of the first semiconductor layer 4A. For the third semiconductor layer 4C, it was found to have a pillar microcrystalline structure.

For the photovoltaic element modules obtained in this example, evaluation was conducted with their characteristics in the same manner as in Example 1. As a result, their average open-circuit voltage (Voc), average short-circuit current (Jsc), average fill factor (F.F.), and average photoelectric conversion efficiency ($\eta$) on the basis of their I–V characteristics under irradiation of pseudo sunlight of AM 1.5 (100 mW/cm$^2$) were 0.95, 1.13, 1.00, and 1.08, which are normalized values when those of the photovoltaic elements modules obtained in Comparative Example 1A which will be described later are respectively set at 1.00.

These characteristics of the photovoltaic element modules of this example were not substantially changed even when the photovoltaic element modules were subjected to irradiation of pseudo sunlight of AM 1.5 (100 mW/cm$^2$) for 1000 hours.

The evaluated results obtained are collectively shown in Table 1.

Further, the photovoltaic element modules of this example were subjected to environmental test for 1000 hours using an environmental test box with temperature of 85° C. and humidity of 85%. As a result, their photoelectric conversion efficiency was decreased only by 0.01%, which is not problematic in practice.

COMPARATIVE EXAMPLE 1A

The procedures of Example 1 were repeated, except that in the formation of the second semiconductor layer 4B, the i-type semiconductor layer was not subjected to laser annealing treatment, to obtain a plurality of photovoltaic element modules.

In the course of forming the semiconductor junction layer 4, at the stage where the formation of the second semiconductor layer 4B was conducted, one substrate was taken out and the second semiconductor layer 4B formed thereon was examined by way of X-ray diffraction analysis. As a result, there was not observed any peak corresponding to a silicon crystalline phase. Further, as a result of having examined by way of Raman spectroscopic analysis, there was observed merely a smooth mountain at a region of 480/cm. Based on this, the second semiconductor layer 4B was found to have no crystalline phase. In addition, one substrate for which were formed until the fifth semiconductor layer 4E was taken out, and its cross section was examined using a transmission electron microscope. As a result, presence of pillar microcrystalline phases was observed in the third semiconductor layer 4C but no crystalline phase was observed for the second semiconductor layer 4B. It is a matter of course that no spherical microcrystalline phase was not observed for the second semiconductor layer 4B.

For the photovoltaic element modules obtained in this comparative example, evaluation was conducted with their characteristics in the same manner as in Example 1. As a result, their average open-circuit voltage (Voc), average short-circuit, current (Jsc), average fill factor (F.F.), and average photoelectric conversion efficiency ($\eta$) on the basis of their I–V characteristics under irradiation of pseudo sunlight of AM 1.5 (100 mW/cm$^2$) were made to be 1.00, 1.00, 1.00, and 1.00, respectively. The evaluated results are collectively shown in Table 1.

And their average short-circuit current (Jsc), average fill factor (F.F.), and average photoelectric conversion efficiency ($\eta$) after having subjected to irradiation of pseudo sunlight of AM 1.5 (100 mW/cm$^2$) for 1000 hours were 1.00, 1.02, 0.94, and 0.95.

COMPARATIVE EXAMPLE 1B

The procedures of Example 1 were repeated, except that the energy density of the laser beam in the formation of the second semiconductor layer 4B was changed to 300 mJ/cm$^2$, to obtain a plurality of photovoltaic element modules.

During the preparation of the photovoltaic element, one substrate for which were formed until the fifth semiconductor layer 4E was taken out, and its cross section was examined using a transmission electron microscope. As a result, no clear distinction was observed for the first and second semiconductor layers 4A–4B and presence of large crystalline particles having a magnitude of exceeding about 20 nm was observed in both the first semiconductor layer 4A and the second semiconductor layer 4B. It is considered that this situation would be occurred as a result of the matching between the two semiconductor layers having been deteriorated due to excessive annealing for the i-type semiconductor layer in the formation of the second semiconductor layer 4B.

For the photovoltaic element modules obtained in this comparative example, evaluation was conducted with their characteristics in the same manner as in Example 1. As a result, their average open-circuit voltage (Voc), average short-circuit current (Jsc), average fill factor (F.F.), and average photoelectric conversion efficiency ($\eta$) on the basis of their I–V characteristics under irradiation of pseudo sunlight of AM 1.5 (100 mW/cm$^2$) were 0.99, 1.05, 1.01, and 1.05, which are normalized values when those of the photovoltaic elements modules obtained in Comparative Example 1A are respectively set at 1.00.

And their average short-circuit current (Jsc), average fill factor (F.F.), and average photoelectric conversion efficiency ($\eta$) after having subjected to irradiation of pseudo sunlight of AM 1.5 (100 mW/cm$^2$) for 1000 hours were 0.85, 0.96, 0.80, and 0.65, which are markedly inferior to the initial characteristics.

The evaluated results obtained ate collectively shown in Table 1.

EXAMPLE 3

The procedures of Example 1 were repeated, except that the second semiconductor layer 4B was formed by changing the deposition time (80 seconds in Example 1) for the i-type semiconductor layer in the formation of the second semiconductor layer 4B to 32 seconds, 145 seconds, and 180 seconds, to obtain a plurality of photovoltaic element modules.

For the photovoltaic element modules obtained in this example, evaluation was conducted with their characteristics in the same manner as in Example 1. The evaluated results obtained are collectively shown in Table 2.

COMPARATIVE EXAMPLE 2A

The procedures of Example 1 were repeated, except that without forming the i-type semiconductor layer for the second semiconductor layer 4B, the first semiconductor layer 4A was subjected to laser-annealing in the same manner as in the case of forming the second semiconductor layer 4B in Example 1, to obtain a plurality of ac plurality of photovoltaic element modules.

For the photovoltaic element modules obtained in this comparative example, evaluation was conducted with their characteristics in the same manner as in Example 1. The evaluated results obtained are collectively shown in Table 2.

COMPARATIVE EXAMPLE 2B

The procedures of Example 1 were repeated, except that the second semiconductor layer 4B was formed by changing the deposition time (80 seconds in Example 1) for the i-type semiconductor layer in the formation of the second semiconductor layer 4B to 215 seconds, to obtain a plurality of photovoltaic element modules.

For the photovoltaic element modules obtained in this comparative example, evaluation was conducted with their characteristics in the same manner as in Example 1. The evaluated results obtained are collectively shown in Table 2.

EXAMPLE 4

The procedures of Example 1 were repeated, except that the second semiconductor layer 4B was formed in a manner as will be described in the following, to obtain a plurality of photovoltaic element modules.

In Example 1, after the formation of the about 20 nm thick n-type semiconductor layer containing no crystalline phase as the first semiconductor layer 4A on the transparent electrically conductive layer 3 of each substrate by the n-type layer forming space 34-1, the operation of the substrate temperature controlling means 35, the introduction of the raw material gases and the application of the high frequency power were terminated. Thereafter, the film-forming chamber 34 was sufficiently evacuated by means of the vacuum pump. And the surface of each substrate (that is, the surface of the first semiconductor layer 4A of each substrate) on the substrate holder was controlled to have a temperature of 310° C. by means of the substrate temperature controlling means 35. Then, after the film-forming chamber 34 including the n-type layer-forming space 34-1 was sufficiently evacuated by means of the vacuum pump, SiH$_4$/H$_2$ gas (SiH$_4$ diluted by H$_2$ to 10%), PH$_3$/H$_2$ gas (PH$_3$ diluted by H$_2$ to 2%) and H$_2$ gas were introduced into the n-type layer-forming space 34-1 through the gas feed pipe 49 extending from the raw material gas supply system comprising the gas reservoir 49-1 containing SiH$_4$/H$_2$ gas (SiH$_4$ diluted by H$_2$ to 10%), the gas reservoir 49-2 containing PH$_3$/H$_2$ gas (PH$_3$ diluted by H$_2$ to 2%) and the gas reservoir 49-3 containing H$_2$ gas at respective flow rates of 4 sccm, 0.5 sccm and 50 sccm. Then, the opening of the throttle valve provided at the exhaust pipe connected to the film-forming chamber 34 was adjusted to maintain the inner pressure of the n-type layer-forming space 34-1 at 1 Torr, and a high frequency power (13.56 MHz) of 15 W from the high frequency power source with an oscillation frequency of 13.56 MHz (not shown) was supplied to the counter electrode 44 to cause glow discharge in the n-type layer-forming space 34-1 for 80 seconds. By this, there was formed an about 13 nm thick n-type semiconductor layer containing small approximately spherical microcrystalline phases on the first semiconductor layer 4A of each substrate.

Then, the introduction of the raw material gases and the application of the high frequency power were suspended, and the film-forming chamber 34 including the n-type layer-forming space 34-1 was sufficiently evacuated by means of the vacuum pump. Thereafter, SiH$_4$/H$_2$ gas (SiH$_4$ diluted by H$_2$ to 10%), PH$_3$/H$_2$ gas (PH$_3$ diluted by H$_2$ to 2%) and H$_2$ gas were introduced into the n-type layer-forming space 34-1 through the gas feed pipe 49 at respective flow rates of 4 sccm, 0.5 sccm and 100 sccm. Then, the opening of the throttle valve provided at the exhaust pipe connected to the film-forming chamber 34 was adjusted to maintain the inner pressure of the n-type layer-forming space 34-1 at 1 Torr, and a high frequency power (13.56 MHz) of 15 W from the high frequency power source with an oscillation frequency of 13.56 MHz (not shown) was supplied to the counter electrode 44 to cause glow discharge in the n-type layer-forming space 34-1 for 120 seconds. By this, there was formed an about 13 nm thick n-type semiconductor layer containing large approximately spherical microcrystalline phases on the previously formed n-type semiconductor layer of each substrate.

For the resultant two-layered semiconductor layer comprising the above two n-type semiconductor layers, such laser-annealing as in Example 1 was not conducted.

Thus, the second semiconductor layer 4B comprising the above two n-type semiconductor layers was formed on the first semiconductor layer 4A of each substrate.

In this example, in the course of forming the second semiconductor layer 4B, by increasing the hydrogen dilution ratio, the two-layered microcrystalline layer as the second semiconductor layer 4B was made such that the two constituent microcrystalline layers were different one from the other in terms of the average size for their constituent microcrystalline phases.

For confirmation purposes, one substrates for which were formed until the second semiconductor layer 4B taken out from the film-forming apparatus, and it was subjected to analysis using a conventional argon laser Raman spectroscopic ultramicroanalyzer. As a result, the the second semiconductor layer 4B was found to have a Raman spectrum with a sharp peak of about 520/cm. Based on this result, it was confirmed that the second semiconductor layer 4B contains microcrystalline phases.

After the formation of the second semiconductor layer 4B on each substrate, the transportation jig 32 having the substrate holder with the remaining substrates for which were formed until the second semiconductor layer 4B was moved into the second film-forming chamber 39, where the third semiconductor layer 4C was formed on the second semiconductor layer 4B of each substrate in the same manner as in Example 1.

For confirmation purposes, one of the substrates situated on the substrate holder was taken out from the film-forming apparatus, and the third semiconductor layer 4C was subjected to X-ray diffraction analysis. As a result, there was observed a peak at a region of about 47.5° which is corresponding to (220) plane of Si. Similarly, it was subjected to analysis using the foregoing Raman spectroscopic ultramicroanalyzer. As a result, there was observed a peak at a region of about 516/cm. These results indicate that the third semiconductor layer 4C contains microcrystalline phases.

Further, a cross section of the layered structure of the substrate was examined by means of a transmission electron microscope. As a result, there were obtained the following facts. That is, the first semiconductor layer 4A was found to comprise a semiconductor material with no crystalline phase in which any microcrystalline phase with a size of 5 nm or more is not observed at all. For the second semiconductor layer 4B, it was found that the approximately spherical microcrystalline phases situated on the side of the first semiconductor layer 4A have an average size of about 5 nm and the approximately spherical microcrystalline phases situated on the side of the third semiconductor layer 4C have an average size of about 10 nm. For the pillar microcrystalline phases of the third semiconductor layer 4C, it was found that longer ones of them have a length which is near the layer thickness and a width of about 50 nm. Further, it was found that a layer region of the third semiconductor layer 4C in the vicinity of the second semiconductor layer 4B contains also approximately spherical microcrystalline phases having an average size of about 50 nm mingled together with the pillar microcrystalline phases.

For the photovoltaic element modules obtained in this example, evaluation was conducted with their characteristics in the same manner as in Example 1. As a result, their average open-circuit voltage (Voc), average short-circuit current (Jsc), average fill factor (F.F.), and average photoelectric conversion efficiency (η) on the basis of their I–V characteristics under irradiation of pseudo sunlight of AM 1.5 (100 mW/cm$^2$) were 0.97. 1.11, 0.99, and 1.08, which are normalized values when those of the photovoltaic elements modules obtained in Comparative Example 1A are respectively set at 1.00.

And their average short-circuit current (Jsc), average fill factor (F.F.), and average photoelectric conversion efficiency (η) after having subjected to irradiation of pseudo sunlight of AM 1.5 (100 mW/cm$^2$) for 1000 hours were 0.97, 1.10, 0.99, and 1.10, which are almost the same as the initial characteristics.

Further, the photovoltaic element modules of this example were subjected to environmental test for 1000 hours using an environmental test box with temperature of 85° C. and humidity of 85%. As a result, their photoelectric conversion efficiency was decreased only by 0.02%, which is not problematic in practice.

EXAMPLE 5

The procedures of Example 1 were repeated, except that the second semiconductor layer 4B was formed in a manner as will be described in the following, to obtain a plurality of photovoltaic element modules.

In Example 1, after the formation of the about 20 nm thick n-type semiconductor layer containing no crystalline phase as the first semiconductor layer 4A on the transparent electrically conductive layer 3 of each substrate by the n-type layer forming space 34-1, the operation of the substrate temperature controlling means 35, the introduction of the raw material gases and the application of the high frequency power were terminated. Thereafter, the film-forming chamber 34 was sufficiently evacuated by means of the vacuum pump. And the surface of each substrate (that is, the surface of the first semiconductor layer 4A of each substrate) on the substrate holder was controlled to have a temperature of 270° C. by means of the substrate temperature controlling means 35. Then, after the film-forming chamber 34 including the n-type layer-forming space 34-1 was sufficiently evacuated by means of the vacuum pump, SiH$_4$/H$_2$ gas (SiH$_4$ diluted by H$_2$ to 10%), PH$_3$/H$_2$ gas (PH$_3$ diluted by H$_2$ to 2%) and H$_2$ gas were introduced into the n-type layer-forming space 34-1 through the gas feed pipe 49 extending from the raw material gas supply system comprising the gas reservoir 49-1 containing SiH$_4$/H$_2$ gas (SiH$_4$ diluted by H$_2$ to 10%), the gas reservoir 49-2 containing PH$_3$/H$_2$ gas (PH$_3$ diluted by H$_2$ to 2%) and the gas reservoir 49-3 containing H$_2$ gas at respective flow rates of 4 sccm, 0.5 sccm and 100 sccm. Then, the opening of the throttle valve provided at the exhaust pipe connected to the film-forming chamber 34 was adjusted to maintain the inner pressure of the n-type layer-forming space 34-1 at 1 Torr, and a high frequency power (13.56 MHz) of 15 W from the high frequency power source with an oscillation frequency of 13.56 MHz (not shown) was supplied to the counter electrode 44 to cause glow discharge in the n-type layer-forming space 34-1 for 80 seconds. By this, there was formed an about 13 nm thick n-type semiconductor layer containing small approximately spherical microcrystalline phases on the first semiconductor layer 4A of each substrate.

Then, the surface of each substrate (that is, the surface of the previously formed n-type semiconductor layer of each substrate) on the substrate holder was controlled to have a temperature of 350° C. by means of the substrate temperature controlling means 35 while maintaining the above film-forming conditions except for suspending the application of the high frequency power. Successively, a high frequency power (13.56 MHz) of 15 W from the high frequency power source with an oscillation frequency of 13.56 MHz was supplied to the counter electrode 44 to cause glow discharge in the n-type layer-forming space 34-1 for 120 seconds. By this, there was formed an about 13 nm thick n-type semiconductor layer containing large approximately spherical microcrystalline phases on the previously formed n-type semiconductor layer of each substrate.

For the resultant two-layered semiconductor layer comprising the above two n-type semiconductor layers, such laser-annealing as in Example 1 was not conducted.

Thus, the second semiconductor layer 4B comprising the above two n-type semiconductor layers was formed on the first semiconductor layer 4A of each substrate.

In this example, in the course of forming the second semiconductor layer 4B, by increasing the hydrogen dilution ratio, the two-layered microcrystalline layer as the second semiconductor layer 4B was made such that the two constituent microcrystalline layers were different one from the other in terms of the average size for their constituent microcrystalline phases.

For confirmation purposes, one substrates for which were formed until the second semiconductor layer 4B taken out from the film-forming apparatus and it was subjected to analysis using the conventional argon laser Raman spectroscopic ultramicroanalyzer. As a result, the the second semiconductor layer 4B was found to have a Raman spectrum with a sharp peak of about 520/cm. Based on this result, it was confirmed that the second semiconductor layer 4B contains microcrystalline phases.

After the formation of the second semiconductor layer 4B on each substrate, the transportation jig 32 having the substrate holder with the remaining substrates for which were formed until the second semiconductor layer 4B was moved into the second film-forming chamber 39, where the third semiconductor layer 4C was formed on the second semiconductor layer 4B of each substrate in the same manner as in Example 1.

For confirmation purposes, one of the substrates situated on the substrate holder was taken out from the film-forming apparatus, and the third semiconductor layer 4C was subjected to X-ray diffraction analysis. As a result, there was observed a peak at a region of about 47.5° which is corresponding to (220) plane of Si. Similarly, it was subjected to analysis using the foregoing Raman spectroscopic ultramicroanalyzer. As a result, there was observed a peak at a region of about 516/cm. These results indicate that the third semiconductor layer 4C contains microcrystalline phases.

Further, a cross section of the layered structure of the substrate was examined by means of a transmission electron microscope. As a result, there were obtained the following facts. That is, the first semiconductor layer 4A was found to comprise a semiconductor material with no crystalline phase in which any microcrystalline phase with a size of 5 nm or more is not observed at all. For the second semiconductor layer 4B, it was found that the approximately spherical microcrystalline phases situated on the side of the first semiconductor layer 4A have an average size of about 5 nm and the approximately spherical microcrystalline phases situated on the side of the third semiconductor layer 4C have an average size of about 10 nm. For the pillar microcrystalline phases of the third semiconductor layer 4C, it was found that longer ones of them have a length which is near the layer thickness and a width of about 50 nm. Further, it was found that a layer region of the third semiconductor layer 4C in the vicinity of the second semiconductor layer 4B contains also approximately spherical microcrystalline phases having an average size of about 50 nm mingled together with the pillar microcrystalline phases.

For the photovoltaic element modules obtained in this example, evaluation was conducted with their characteristics in the same manner as in Example 1. As a result, their average open-circuit voltage (Voc), average short-circuit current (Jsc), average fill factor (F.F.), and average photoelectric conversion efficiency (η) on the basis of their I–V characteristics under irradiation of pseudo sunlight of AM 1.5 (100 mW/cm$^2$) were 98, 1.10, 0.99, and 1.07, which are normalized values when those of the photovoltaic elements modules obtained in Comparative Example 1A are respectively set at 1.00.

And their average short-circuit current (Jsc), average fill factor (F.F.), and average photoelectric conversion efficiency (η) after having subjected to irradiation of pseudo sunlight of AM 1.5 (100 mW/cm$^2$) for 1000 hours were 0.98, 1.09, 0.99, and 1.06, which are almost the same as the initial characteristics.

Further, the photovoltaic element modules of this example were subjected to environmental test for 1000 hours using an environmental test box with temperature of 85° C. and humidity of 85%. As a result, their photoelectric conversion efficiency was decreased only by 0.02%, which is not problematic in practice.

As will be understood from the above description, according to the present invention, there can be attained a high performance photovoltaic element (solar cell) in which a large quantity of an electric current is generated even when its semiconductor junction layer is relatively thin and which exhibits an improved photoelectric conversion efficiency whose rate of change is a little over a long period, of time.

The use of this photovoltaic element (solar cell) enables one to establish a desirable building material and a desirable sunlight power generation apparatus which have characteristics whose rate of change is a little over a long period of time.

Further, because even when the semiconductor junction layer is relatively thin, there can be attained a desirable photovoltaic element (solar cell), the time required for the formation of the semiconductor junction layer in the production of a photovoltaic element (solar cell), a desirable photovoltaic element (solar cell) can be produced at a reasonable production cost.

EXAMPLE 6-1

Figure 7:
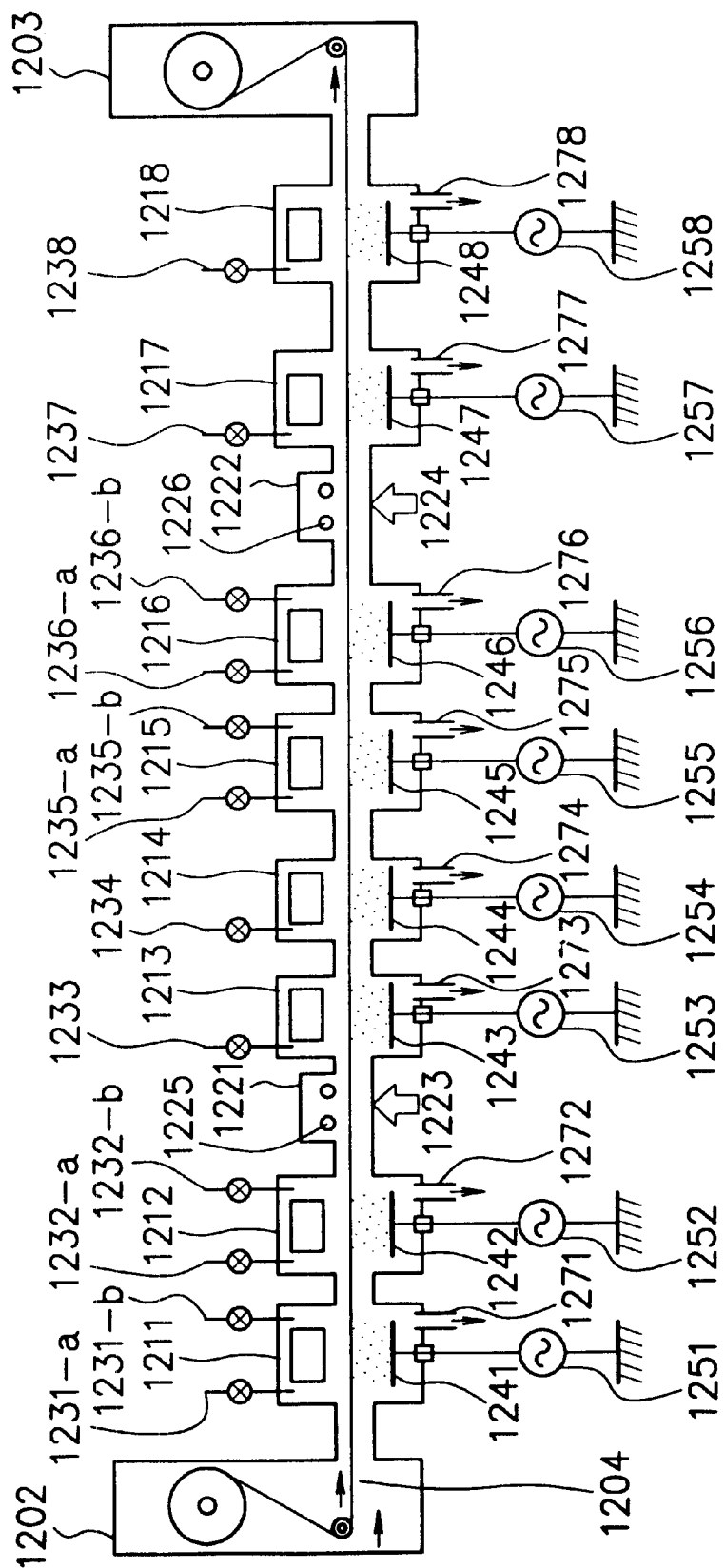
FIG. 7 is a schematic diagram illustrating another example of a film-forming apparatus suitable for forming a semiconductor layer in the production of a photovoltaic element of the present invention.

In this example, there was formed a multi-layered semiconductor film using a roll-to-roll type continuous film-forming apparatus shown in FIG. 7.

The film-forming apparatus shown in FIG. 7 comprises a substrate delivery vacuum vessel 1202 for delivering a web substrate 1204 on which a film is to be formed, semiconductor layer-forming vacuum vessels 1211–1218, and a substrate take-up vacuum vessel 1203 for taking up the web substrate 1204. The substrate delivery vacuum vessel 1202, the semiconductor layer-forming vacuum vessels 1211–1218 and the substrate take-up vacuum vessel 1203 are communicated with each other through gas gates (not shown). In the substrate delivery vacuum vessel 1202, there is provided a pay-out bobbin having the web substrate 1204 wound thereon in a roll form. From the pay-out bobbin in the substrate delivery vacuum vessel 1202, the web substrate 1204 is paid out and delivered through a steering roll, followed by being transported to sequentially pass through the semiconductor layer-forming vacuum vessels 1211–1218, and the web substrate enters in the substrate take-up vacuum vessel 1203 where it is taken up and wound on a take-up bobbin in a roll form. During the web substrate web 1204 is transported from the substrate delivery vacuum vessel 1202 toward the substrate take-up vacuum vessel 1203, on the web substrate 1204, there are continuously a desired semiconductor layer by each of the semiconductor layer-forming vacuum vessels 1211–1218.

Each of the semiconductor layer-forming vacuum vessels 1211–1218 has a discharge space in which a high frequency power application electrode (1241, 1242, 1243, 1244, 1245, 1246, 1247, 1248) which is electrically connected to a high frequency power source (1251, 1252, 1253, 1254, 1255, 1256, 1257, 1258) is provided to generate glow discharge by applying a high frequency power from the high frequency power source through the high frequency power application electrode in the presence of a raw material gas whereby decomposing the raw material gas to form a desired semiconductor layer on a surface of the web substrate 1204 which is exposed to the discharge space. Each of the semiconductor layer-forming vacuum vessels 1211–1218 has a heating unit which is provided above the passage of the web substrate 1204 in order to control the temperature of the web substrate. Each of the semiconductor layer-forming vacuum vessels 1211–1218 is provided with an exhaust pipe (1271, 1272, 1273, 1274, 1275, 1276, 1277, 1278) which is provided a throttle valve (not shown) and is connected to a vacuum pump (not shown).

Each of the semiconductor layer-forming vacuum vessels 1211, 1212, 1215, and 1216 is provided with an upstream gas introduction pipe (1231-*a*, 1232-*a*, 1235-*a*, 1236-*a*) on the upstream side with respect to the transportation direction of the web substrate 1204 and a downstream gas introduction pipe (1231-*b*, 1232-*b*, 1235-*b*, 1236-*b*) on the upstream side with respect to the transportation direction of the web substrate, where these gas introduction pipes are extending from a raw material gas supply system (not shown). Similarly, each of the semiconductor layer-forming vacuum vessels 1213, 1214, 1217 and 1218 is provided with a gas introduction pipe (1233, 1234, 1237, 1238) which is extending from a raw material gas supply system (not shown).

Between the semiconductor layer-forming vacuum vessels 1212 and 1213, there is provided a crystallization vacuum vessel 1221 having an infrared lamp heater unit 1225 and an excimer laser apparatus 1223 as a crystallization means. Similarly, between the semiconductor layer-forming vacuum vessels 1216 and 1217, there is provided a crystallization vacuum vessel 1222 having an infrared lamp heater unit 1226 and an excimer laser apparatus 1224 as a crystallization means. Each of the crystallization vacuum vessels 1221 and 1222 is provided with an exhaustion system comprising an exhaust pipe connected to a vacuum pump (not shown). Each of the substrate delivery vacuum vessel 1202 and the substrate take-up vacuum vessel 1203 is also provided with an exhaustion system comprising an exhaust pipe connected to a vacuum pump (not shown).

The film-forming apparatus shown in FIG. 7 has the eight semiconductor layer-forming vacuum vessels. It is not always necessary to generate glow discharge in all the semiconductor layer-forming vacuum vessels, but it is possible to select the presence or absence of glow discharge in the respective semiconductor layer-forming vacuum vessels depending upon the layer constitution of a photovoltaic element to be produced. Separately, in each semiconductor layer-forming vacuum vessels 1211–1218, there is provided a film-forming area-adjusting member (not shown) capable of adjusting a contact area of the web substrate 1204 with the discharge space in the semiconductor layer-forming vacuum vessel. By adjusting a contact area of the web substrate 1204 with the discharge space by means of the film-forming area-adjusting member, it is possible to adjust the thickness of a semiconductor layer formed in the corresponding semiconductor layer-forming vacuum vessel.

Now, a substrate roll comprising a well-cleaned web substrate made of stainless steel SUS430BA having a thickness of 0.125 mm, a width of 40 cm and a length of 200 m was set to a conventional roll-to-roll type film-forming apparatus by means of sputtering (not shown), where on the web substrate Delivered from the substrate roll while being taken up by a bobbin, there were sequentially formed a 100 nm thick Al film as a metal layer using an Al target and a 1200 nm thick zinc oxide (ZnO) film as a transparent electrically conductive layer using a ZnO target.

The bobbin having the web substrate (having the Al film and the ZnO film thereon) as a web substrate 1204 which is wound thereon in a roll form was arranged in the substrate delivery vacuum vessel 1202 of the film-forming apparatus shown in FIG. 7. From the bobbin (that is, the pay-out bobbin in the substrate delivery vacuum vessel 1202), the web substrate 1204 was paid out and delivered from the substrate delivery vacuum vessel 1202, followed by passing through the gas gate on the carrying-in side, the semiconductor layer-forming vacuum vessel 1211, the gas gate, the semiconductor layer-forming vacuum vessel 1212, the gas gate, the crystallization vacuum vessel 1225, the gas gate, the semiconductor layer-forming vacuum vessel 1213, the gas gate, the semiconductor layer-forming vacuum vessel 1214, the gas gate, the semiconductor layer-forming vacuum vessel 1215, the gas gate, the semiconductor layer-forming vacuum vessel 1216, the gas gate, the crystallization vacuum vessel 1226, the gas gate, the semiconductor layer-forming vacuum vessel 1217, the gas gate, the semiconductor layer-forming vacuum vessel 1218, and the gas gate on the carrying-out side, to enter in the substrate take-up vacuum vessel 1203 where the beginning portion of the web substrate 1204 was fixed to and wound on the take-up bobbin. And the transportation system of the web substrate 1204 was adjusted so that the web substrate could be continuously and smoothly transported from the substrate delivery vacuum vessel 1202 to the substrate take-up vacuum vessel 1203 without being distorted or warped.

Each of the substrate delivery vacuum vessel 1202, the semiconductor layer-forming vacuum vessels 1211–1218, the crystallization vacuum vessels 1221 and 1222, and the substrate take-up vacuum vessel 1203 was evacuated until the inner pressure reached to less than $5 \times 10^{-6}$ Torr by actuating the exhaustion system.

While continuing this evacuation, prescribed raw material gas and dilution gas (see, Table 3) were introduced into each of the semiconductor layer-forming vacuum vessels 1211–1213 through the gas introduction pipes 1231-*a* and 1231-*b* for the semiconductor layer-forming vacuum vessel 1211, the gas introduction pipes 1232-*a* and 1232-*b* for the semiconductor layer-forming vacuum vessel 1212, and the gas introduction pipe 1233 for the semiconductor layer-forming vacuum vessel 1213 under conditions shown in Table 3. In this case, $H_2$ gas was introduced into the remaining semiconductor layer-forming vacuum vessels at a flow rate of 200 sccm through the corresponding gas introduction pipe(s). At the same time, $H_2$ gas as a gate gas was flown into each gas gate at a flow rate of 500 sccm through agate gas introduction pipe (not shown). While maintaining this state, the inner pressure of each of the semiconductor layer-forming vacuum vessels 1211, 1212 and 1213 was adjusted to and maintained at a prescribed pressure (see, Table 3). In addition, the heating unit in each of the semiconductor layer-forming vacuum vessels 1211, 1212 and 1213 was regulated so that the web substrate 1204 became to have a prescribed substrate temperature therein (see, Table 3). After the inner pressure of each of the semiconductor layer-forming vacuum vessels 1211, 1212 and 1213 became stable at aforesaid pressure, the web substrate 1204 was started moving from the substrate delivery vacuum vessel 1202 toward the substrate take-up vacuum vessel 1203, where the lamp heater unit 1225 in the crystallization vacuum vessel 1221 was regulated so that the web substrate 1204 became to have a substrate temperature of 650° C. therein.

Then, a high frequency power with a frequency of 13.56 MHz and having a wattage of 5 $mW/cm^3$ from the high frequency power source 1251 was introduced into the discharge space of the semiconductor layer-forming vacuum vessel 1211 through the high frequency power application electrode 1241 to generate glow discharge whereby forming an n-type amorphous silicon semiconductor layer having a thickness of 30 nm on the web substrate 1204, and a high frequency power with a frequency of 13.56 MHz and having a wattage of 5 $mW/cm^3$ from the high frequency power source 1252 was introduced into the discharge space of the semiconductor layer-forming vacuum vessel 1212 through the high frequency power application electrode 1242 to generate glow discharge thereby forming an i-type amorphous silicon semiconductor layer having a thickness of 30 nm on the web substrate 1204 having the n-type amorphous silicon semiconductor layer formed thereon, where a two-layered structure comprising the n-type amorphous silicon semiconductor layer and the i-type amorphous silicon semiconductor layer stacked in this order was formed on the web substrate 1204. Then, in the crystallization vacuum vessel 1221, the two-layered structure formed on the web substrate 1204 was subjected to a heat treatment by means of the lamp heater unit 1225 to crystallize part of the two-layered structure on the web substrate to form a layered structure having an n-type semiconductor layer and a crystalline phase-containing semiconductor layer having an n-type conduction type sequentially stacked as a primary layer. Successively, in the semiconductor layer-forming vacuum vessel 1213, a high frequency power with a frequency of 100 MHz and having a wattage of 20 mW/cm, from the high frequency power source 1253 was introduced into the discharge space of the semiconductor layer-forming vacuum vessel through the high frequency power application electrode 1243 to generate glow discharge whereby forming a crystalline phase-containing i-type semiconductor layer having a thickness of 1.5 µm on the primary layer on the web substrate 1204. Thus, there was obtained a silicon-containing semiconductor layer having a stacked structure of Example 6-1.

EXAMPLE 6-2

The procedures of Example 6-1 were repeated, except that for the PH$_3$ gas introduced into the semiconductor layer-forming vacuum vessel 1211, the flow rate thereof in the upstream gas introduction pipe 1231-*a* was made to be different that in the downstream gas introduction pipe 1231-*b* as shown in Table 3, to obtain a silicon-containing semiconductor layer having a stacked structure of Example 6-2.

COMPARATIVE EXAMPLE 3

The procedures of Example 6-1 were repeated, except that the crystallization treatment by the lamp heater unit in the crystallization vacuum vessel 1221 was not conducted, to obtain a silicon-containing semiconductor layer having a stacked structure of Comparative Example 3.

Evaluation

The silicon-containing semiconductor layer obtained in Example 6-1 and that obtained in Comparative Example 3 were evaluated with respect to their crystalline by means of a X-ray diffraction method. As a result, the silicon-containing semiconductor layer obtained in Example 6-1 exhibited a stronger diffraction intensity and a clearly sharpened diffraction line. On the other hand, the silicon-containing semiconductor layer obtained in Comparative Example 3 exhibited neither such diffraction intensity nor such diffraction line.

In addition, there was obtained a Scherrer's radius from a half width of a diffraction peak of (220) reflection for each of the silicon-containing semiconductor layers obtained in Example 6-1 and Comparative Example 3. The silicon-containing semiconductor layer of Example 6-1 was found to have a Scherrer's radius which is as large as 2.5 times that of the silicon-containing semiconductor layer of Comparative Example 3.

Further, for the silicon-containing semiconductor layer of Example 6-1, a cross section thereof was observed by TEM, and the observed cross section is schematically shown in FIG. 12.

As FIG. 12 illustrates, it is understood that a continuous structured comprising an n-type amorphous layer 1102-1A, a crystalline phase-containing n-type layer 1102-1B (converted from the i-type amorphous silicon layer), and a crystalline phase-containing i-type semiconductor layer 1102-2 continuously stacked on a ZnO layer, where the crystalline phase-containing n-type semiconductor layer 1102-1B contains crystalline phases (crystalline particles or crystalline grains) whose size magnitude being gradually increased toward the crystalline phase-containing i-type semiconductor layer 1102-2 and the crystalline phase-containing i-type semiconductor layer 1102-2 contains crystalline phases (crystalline particles or crystalline grains) which are continuously grown from the phase-containing n-type semiconductor layer 1102-1B.

For the initial two-layered structure prior to subjecting to the crystallization treatment, such continuous structure comprising the n-type amorphous layer 1102-1A and the crystalline phase-containing n-type layer 1102-1B continuously stacked as above described was not observed.

In the observation of a cross election of the silicon-containing semiconductor layer of Comparative Example 3 by TEM, the presence of such crystalline phase-containing n-type semiconductor layer as observed in the silicon-containing semiconductor layer of Example 6-1 was not observed.

The silicon-containing semiconductor layer of Example 6-2 was found to have a Scherrer's radius which is as large as 1.15 times that of the silicon-containing semiconductor layer of Comparative Example 3. SIMS analysis was conducted for the silicon-containing semiconductor layer of Example 6-2. As a result, in the primary layer thereof, it was found that the concentration of P is decreased toward the crystalline phase-containing i-type semiconductor layer from the substrate side. In the primary layer of the silicon-containing semiconductor layer of Example 6-1, such concentration gradient of P was not observed.

From the results obtained in the above, it is understood that any of the silicon-containing semiconductor layers obtained in Example 6-1 and Example 6-2 has excellent crystalline and contains crystalline phases having a large size magnitude and which are continuously grown from a region of the primary layer on the substrate side. And in the case of the structure in that the dopant concentration in the primary layer is decreased toward the crystalline phase-containing i-type semiconductor layer from the substrate side, it was found that a pronounced advantage is provided.

EXAMPLE 7

Figure 9:
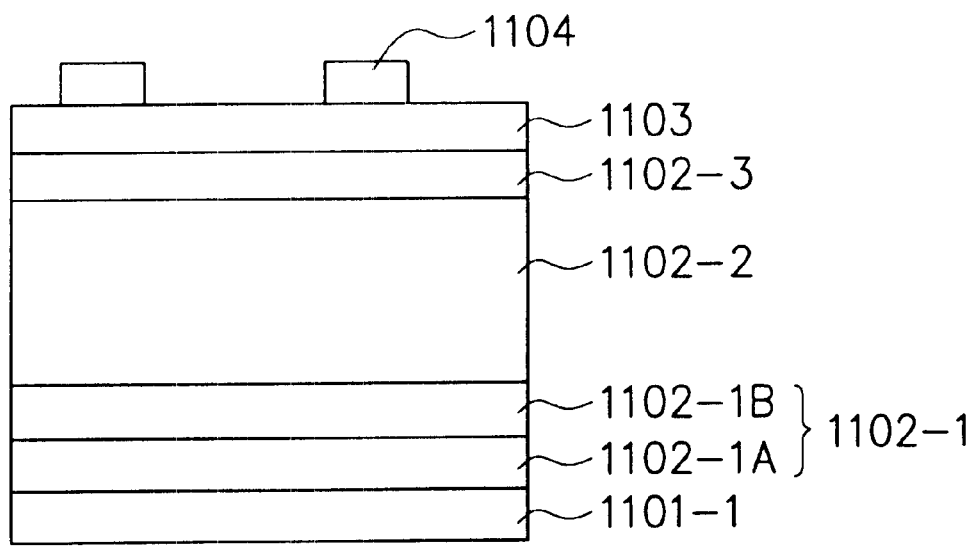
FIG. 9 is a schematic cross-sectional view illustrating a further example of a photovoltaic element according to the present invention.

In this example, there was prepared a photovoltaic element having such configuration as shown in FIG. 9 using the film-forming apparatus shown in FIG. 7. FIG. 9 is a schematic cross-sectional view illustrating an example of a p-i-n junction type photovoltaic element in which the foregoing silicon series semiconductor layer of the present invention is used.

In FIG. 9, reference numeral 1101 indicates a base member comprising a substrates a metal layer and a first transparent electrically conductive layer as well as in the case of FIG. 6. Reference numeral 1102-1 indicates a primary layer stacked on the base member 1101 which comprises an n-type amorphous semiconductor layer 1102-1A and a crystalline-phase containing n-type semiconductor layer 1102-1B stacked, reference numeral 1102-2 a crystalline phase-containing i-type semiconductor layer stacked on the primary layer, and reference numeral 1102-3 a microcrystalline p-type semiconductor layer stacked on the i-type semiconductor layer 1102-2. Reference numeral 1103 indicates a second transparent electrically conductive layer which is formed on the p-type semiconductor layer 1102-3, and reference numeral 1104 a collecting electrode (comprising a grid electrode) which is arranged on the second transparent electrically conductive layer.

In this example, the preparation of the photovoltaic element using the film-forming apparatus shown in FIG. 7 was conducted as will be described below As well as in Example 6-1, there was provided a bobbin having a web substrate 1204 (having a 100 nm thick Al film as a metal layer and a 1200 nm thick zinc oxide (ZnO) film as a transparent electrically conductive layer sequentially formed thereon) wound thereon in a roll form.

The bobbin was arranged in the substrate delivery vacuum vessel 1202 of the film-forming apparatus shown In FIG. 7. As well as in Example 6-1, from the bobbin (that is, the pay-out bobbin in the substrate delivery vacuum vessel 1202), the web substrate 1204 was paid out and delivered from the substrate delivery vacuum vessel 1202, followed by passing through the semiconductor layer-forming vacuum vessels 1211–1218, to enter in the substrate take-up vacuum vessel 1203 where the beginning portion of the web substrate 1204 was fixed to and wound on the take-up bobbin. And the transportation system of the web substrate 1204 was adjusted so that the web substrate could be continuously and smoothly transported from the substrate delivery vacuum vessel 1202 to the substrate take-up vacuum vessel 1203 without being distorted or warped.

Each of the substrate delivery vacuum vessel 1202, the semiconductor layer-forming vacuum vessels 1211–1218, the crystallization vacuum vessels 1221 and 1222, and the substrate take-up vacuum vessel 1203 was evacuated until the inner pressure reached to less than $5 \times 10^{-6}$ Torr by actuating the exhaustion system.

While continuing this evacuation, prescribed raw material gas and dilution gas (see, Table 4) were introduced into each of the semiconductor layer-forming vacuum vessels 1211–1214 through the gas introduction pipes 1231-*a* and 1231-*b* for the semiconductor layer-forming vacuum vessel 1211, the gas introduction pipes 1232-*a* and 1232-*b* for the semiconductor layer-forming vacuum vessel 1212, the gas introduction pipe 1233 for the semiconductor layer-forming vacuum vessel 1213, and the gas introduction pipe 1234 for the semiconductor layer-forming vacuum vessel 1214 under conditions shown in Table 4. In this case, $H_2$ gas was introduced into the remaining semiconductor layer-forming vacuum vessels at a flow rate of 200 sccm through the corresponding gas introduction pipe(s). At the same time, $H_2$ gas as a gate gas was flown into each gas gate at a flow rate of 500 sccm through a gate gas introduction pipe (not shown). While maintaining this state, the inner pressure of each of the semiconductor layer-forming vacuum vessels 1211–1214 was adjusted to and maintained at a prescribed pressure (see, Table 4). In addition, the heating unit in each of the semiconductor layer-forming vacuum vessels 1211–1214 was regulated so that the web substrate 1204 became to have a prescribed substrate temperature therein (see, Table 4). After the inner pressure of each of the semiconductor layer-forming vacuum vessels 1211–1214 became stable at aforesaid pressure, the web substrate 1204 was started moving from the substrate delivery vacuum vessel 1202 toward the substrate take-up vacuum vessel 1203, where the lamp heater unit 1225 in the crystallization vacuum vessel 1221 was regulated so that the web substrate 1204 became to have a substrate temperature of 650° C. therein.

Then, a high frequency power with a frequency of 13.56 MHz and having a wattage of 5 mW/cm$^3$ from the high frequency power source 1251 was introduced into the discharge space of the semiconductor layer-forming vacuum vessel 1211 through the high frequency power application electrode 1241 to generate glow discharge whereby forming an n-type amorphous silicon semiconductor layer having a thickness of 30 nm on the web substrate 1204, and a high frequency power with a frequency of 13.56 MHz and having a wattage of 5 mW/cm$^3$ from the high frequency power source 1252 was introduced into the discharge space of the semiconductor layer-forming vacuum vessel 1212 through the high frequency power application electrode 1242 to generate glow discharge thereby forming an i-type amorphous silicon semiconductor layer having a thickness of 30 nm on the web substrate 1204 having the n-type amorphous silicon semiconductor layer formed thereon, where a two-layered structure comprising the n-type amorphous silicon semiconductor layer and the i-type amorphous silicon semiconductor layer stacked in this order was formed on the web substrate 1204.

Then, in the crystallization vacuum vessel 1221, the two-layered structure formed on the web substrate 1204 was subjected to a heat treatment by means of the lamp heater unit 1225 to crystallize part of the two-layered structure on the web substrate to form a layered structure having an n-type semiconductor layer and a crystalline phase-containing n-type semiconductor layer sequentially stacked as a primary layer. Successively, in the semiconductor layer-forming vacuum vessel 1213, a high frequency power with a frequency of 100 MHz and having a wattage of 20 mW/cm$^3$ from the high frequency power source 1253 was introduced into the discharge space of the semiconductor layer-forming vacuum vessel through the high frequency power application electrode 1243 to generate glow discharge whereby forming a crystalline phase-containing i-type semiconductor layer having a thickness of 1.5 μm on the primary layer on the web substrate 1204. Then, in the semiconductor layer-forming vacuum vessel 1214, a high frequency power with a frequency of 13.56 MHz and having a wattage of 30 mW/cm$^2$ from the high frequency power source 1254 was introduced into the discharge space of the semiconductor layer-forming vacuum vessel through the high frequency power application electrode 1244 to generate glow discharge whereby forming a microcrystalline p-type semiconductor layer having a thickness of 10 nm on the crystalline phase-containing i-type semiconductor layer on the web substrate 1204.

The web substrate 1204 thus treated was taken out from the apparatus, and an ITO film having a thickness of 70 nm as a second transparent electrically conductive layer was formed on the microcrystalline p-type semiconductor layer by a conventional sputtering method.

Thus, a photovoltaic element having such layer constitution as shown in FIG. 9 (without a collecting electrode) was formed on the web substrate 1204.

The web substrate having the photovoltaic element was cut to obtain a plurality of photovoltaic elements having a size of 36 cm×22 cm. Each of the photovoltaic elements was processed into a photovoltaic element module by a conventional method. Thus, there were obtained a plurality of photovoltaic element modules.

COMPARATIVE EXAMPLE 4

The procedures of Example 7 were repeated, except that the crystallization treatment by the lamp heater unit in the crystallization vacuum vessel 1221 was not conducted, to obtain a plurality of photovoltaic element modules.

Evaluation

The photovoltaic element modules obtained in Example 7 respectively were subjected to evaluation of a photoelectric conversion efficiency using a solar simulator (AM 1.5, 100 mW/cm$^2$). And there was obtained an average photoelectric conversion efficiency for all the photovoltaic element modules. Similarly, the photovoltaic element modules obtained in Comparative Example 4 respectively were subjected to evaluation of a photoelectric conversion efficiency using the solar simulator. And there was obtained an average photoelectric conversion efficiency for all the photovoltaic element modules.

The average photoelectric conversion efficiency of Example 7 was compared with the average photoelectric conversion efficiency of Comparative Example 4 by normalizing the former average photoelectric conversion efficiency at 1. As a result, the value of the average photoelectric conversion efficiency of Comparative Example 4 relative to that of Example 7 was found to be 0.85.

From the evaluated result, it is understood that according to the present invention, it is possible to mass-produce a p-i-n junction type photovoltaic element having excellent characteristics.

EXAMPLE 8

In this example, there was prepared a p-i-n type photovoltaic element having such configuration as shown in FIG. 9 wherein the n-type semiconductor layer 1102-1B comprises a microcrystalline phase-containing n-type semiconductor layer, using the film-forming apparatus shown in FIG. 7 in the following manner. In this example, the microcrystalline phase-containing n-type semiconductor layer of the primary layer was formed by adopting prescribed film-forming conditions (see, Table 5) without conducting the crystallization treatment in the crystallization vacuum vessel 1221.

As well as in Example 6-1, there was provided a bobbin having a web substrate 1204 (having a 100 nm thick Al film as a metal layer and a 1200 nm thick zinc oxide (ZnO) film as a transparent electrically conductive layer sequentially formed thereon) wound thereon in a roll form.

The bobbin was arranged in the substrate delivery vacuum vessel 1202 of the film-forming apparatus shown in FIG. 7. As well as in Example 6-1, From the bobbin (that is, the pay-out bobbin in the substrate delivery vacuum vessel 1202), the web substrate 1204 was paid out and delivered from the substrate delivery vacuum vessel 1202, followed by passing through the semiconductor layer-forming vacuum vessels 1211–1218, to enter in the substrate take-up vacuum vessel 1203 where the beginning portion of the web substrate 1204 was fixed to and wound on the take-up bobbin. And the transportation system of the web substrate 1204 was adjusted so that the web substrate could be continuously and smoothly transported from the substrate delivery vacuum vessel 1202 to the substrate take-up vacuum vessel 1203 without being distorted or warped.

Each of the substrate delivery vacuum vessel 1202, the semiconductor layer-forming vacuum vessels 1211–1218, the crystallization vacuum vessels 1221 and 1222, and the substrate take-up vacuum vessel 1203 was evacuated until the inner pressure reached to less than $5 \times 10^{-6}$ Torr by actuating the exhaustion system.

While continuing this evacuation, prescribed raw material gas and dilution gas (see, Table 5) were introduced into the semiconductor layer-forming vacuum vessels 1211–1214 through the gas introduction pipes 1231-*a* and 1231-*b* for the semiconductor layer-forming vacuum vessel 1211, the gas introduction pipes 1232-*a* and 1232-*b* for the semiconductor layer-forming vacuum vessel 1212, the gas introduction pipe 1233 for the semiconductor layer-forming vacuum vessel 1213, and the gas introduction pipe 1234 for the semiconductor layer-forming vacuum vessel 1214 under conditions shown in Table 5. In this case, H$_2$ gas was introduced into the remaining semiconductor layer-forming vacuum vessels at a flow rate of 200 sccm through the corresponding gas introduction pipe(s). At the same time, H$_2$ gas as a gate gas was flown into each gas gate at a flow rate of 500 sccm through a gate gas introduction pipe (not shown). While maintaining this state, the inner pressure of each of the semiconductor layer-forming vacuum vessels 1211–1214 was adjusted to and maintained at a prescribed pressure (see, Table 5) In addition, the heating unit in each of the semiconductor layer-forming vacuum vessels 1211–1214 was regulated so that the web substrate 1204 became to have a prescribed substrate temperature therein (see, Table 4). After the inner pressure of each of the semiconductor layer-forming vacuum vessels 1211–1214 became stable at aforesaid pressure, the web substrate 1204 was started moving from the substrate delivery vacuum vessel 1202 toward the substrate take-up vacuum vessel 1203.

Then, a high frequency power with a frequency of 13.56 MHz and having a wattage of 5 mW/cm$^3$ from the high frequency power source 1251 was introduced into the discharge space of the semiconductor layer-forming vacuum vessel 1211 through the high frequency power application electrode 1241 to generate glow discharge whereby forming an n-type amorphous silicon semiconductor layer having a thickness of 30 nm on the web substrate 1204, and a high frequency power with a frequency of 13.56 MHz and having a wattage of 5 mW/cm$^3$ from the high frequency power source 1252 was introduced into the discharge space of the semiconductor layer-forming vacuum vessel 1212 through the high frequency power application electrode 1242 to generate glow discharge thereby forming a microcrystalline phase-containing n-type semiconductor layer having a thickness of 30 nm on the web substrate 1204 having the n-type amorphous silicon semiconductor layer formed thereon. In the semiconductor layer-forming vacuum vessel 1213, a high frequency power with a frequency of 100 MHz and having a wattage of 20 mW/cm$^3$ from the high frequency power source 1253 was introduced into the discharge space of the semiconductor layer-forming vacuum vessel through the high frequency power application electrode 1243 to generate glow discharge whereby forming a crystalline phase-containing i-type semiconductor layer having a thickness of 1.5 μm on the microcrystalline phase-containing n-type semiconductor layer on the web substrate 1204. In the semiconductor layer-forming vacuum vessel 1214, a high frequency power with a frequency of 13.56 MHz and having a wattage of 30 mW/cm$^3$ from the high frequency power source 1254 was introduced into the discharge space of the semiconductor layer-forming vacuum vessel through the high frequency power application electrode 1244 to generate glow discharge whereby forming a microcrystalline p-type semiconductor layer having a thickness of 10 nm on the crystalline phase-containing i-type semiconductor layer on the web substrate 1204.

The web substrate 1204 thus treated was taken out from the apparatus, and an ITO film having a thickness of 70 mm as a second transparent electrically conductive layer was formed on the microcrystalline p-type semiconductor layer by a conventional sputtering method.

Thus, a photovoltaic element having such layer constitution as previously described (without having a collecting electrode) was formed on the web substrate 1204.

The web substrate having the photovoltaic element was cut to obtain a plurality of photovoltaic elements having a size of 36 cm×22 cm.

Some of the photovoltaic elements were reserved for subjecting to cross-cut adhesion test.

Each of the remaining photovoltaic elements was processed into a photovoltaic element module by a conventional method. Thus, there were obtained a plurality of photovoltaic element modules.

COMPARATIVE EXAMPLE 5

The procedures of Example 8 were repeated, except that the formation of the n-type amorphous silicon semiconductor layer in the semiconductor layer-forming vacuum vessel 1211 was not conducted, to obtain a plurality of photovoltaic elements.

Some of the photovoltaic elements were reserved for subjecting to cross-cut adhesion test.

Each of the remaining photovoltaic elements was processed into a photovoltaic element module by a conventional method. Thus, there were obtained a plurality of photovoltaic element modules.

Evaluation

1. The photovoltaic elements obtained in Example 8 were subjected to lattice pattern cutting test (cut space interval: 1 mm, lattice number: 100), where each of them was examined with respect to adhesion state between the electrically conductive substrate and the layered semiconductor layer, and a survival number for all the photovoltaic elements was obtained. Similarly, the photovoltaic elements obtained In Comparative Example 5 were subjected to cross-cut adhesion test, where each of them was examined with respect to adhesion state between the base member and the layered semiconductor layer, and a survival number for all the photovoltaic elements was obtained.

The evaluated results are shown in Table 6 by normalizing the survival number of Example 8 at 1.

2. The photovoltaic element modules obtained in Example 8 respectively were subjected to evaluation of an initial photoelectric conversion efficiency using a solar simulator (AM 1.5, 100 mW/cm$^2$), And there was obtained an average initial photoelectric conversion efficiency for all the photovoltaic element modules. Similarly, the photovoltaic element modules obtained in Comparative Example 5 respectively were subjected to evaluation of an initial photoelectric conversion efficiency using the solar simulator. And there was obtained an average initial photoelectric conversion efficiency for all the photovoltaic element modules.

The average initial photoelectric conversion efficiency of Example 8 was compared with the average initial photoelectric conversion efficiency of Comparative Example 5 by normalizing the former average initial photoelectric conversion efficiency at 1. As a result, the value of the average initial photoelectric conversion efficiency of Comparative Example 5 relative to that of Example 8 was found to be 0.9. For the reason for this situation, it is considered to mainly depend upon short-circuit current .

The evaluated results obtained are shown in Table 6.

3. Each of some of the photovoltaic element modules of Example 8 having subjected to the evaluation in the above 2 was subjected to temperature-humidity cycle test where a cycle comprising a step (a) wherein the photovoltaic element module is maintained in a dark atmosphere with a temperature of 85° C./a humidity of 85% for 30 minutes, a step (b) wherein after the step (a), after the temperature of the atmosphere is lowered to −20° C. for 70 minutes, the photovoltaic element module is maintained in this atmosphere for 30 minutes, and a step (c) wherein the atmosphere is returned to have a temperature of 85° C./a humidity of 85% for 70 minutes is repeated 100 times. Each of the photovoltaic element modules thus endured was subjected to evaluation of a photoelectric conversion efficiency using the solar simulator. For each of the photovoltaic element modules, a change rate of the photoelectric conversion efficiency after the endurance to the initial photoelectric conversion efficiency was calculated. And there was obtained an average change rate for all the photovoltaic element modules involved.

In the same manner, for each of some of the photovoltaic element modules of Comparative Example 5 having subjected to the evaluation in the above 2, a change rate of the photoelectric conversion efficiency after the endurance to the initial photoelectric conversion efficiency was obtained. And there was obtained an average change rate for all the photovoltaic element modules involved.

The evaluated results are shown in Table 6 where the average change rate of Example 8 is normalized at 1.0.

4. Each of the remaining photovoltaic element modules of Example 8 having subjected to the evaluation in the above 2 was subjected to light degradation test where the photovoltaic element module is maintained in an atmosphere with a temperature of 50° C. while irradiating a pseudo sunlight with AM 1.5 and 100 mW/cm$^2$ thereto for 50 hours. Each of the photovoltaic element modules thus endured was subjected to evaluation of a photoelectric conversion efficiency, using the solar simulator. For each of the photovoltaic element modules, a change rate of the photoelectric conversion efficiency after the endurance to the initial photoelectric conversion efficiency was calculated. And there was obtained an average change rate for all the photovoltaic element modules involved.

In the same manner, for each of the remaining photovoltaic element modules of Comparative Example 5 having subjected to the evaluation in the above 2, a change rate of the photoelectric conversion efficiency after the endurance to the initial photoelectric conversion efficiency was obtained. And there was obtained an average change rate for all the photovoltaic element modules involved.

The evaluated results are shown in Table 6 where the average change rate of Example 8 is normalized at 1.0.

From the results shown in Table 6, it is understood that the photovoltaic element modules including the photovoltaic elements obtained in Example 8 are surpassing those obtained in Comparative Example 5 in terms of the adhesion, the initial photoelectric conversion efficiency, and the durability in both the temperature-humidity cycle test and the light degradation test. Thus, it is understood that according to the present invention, it is possible to mass-produce a p-i-n junction type photovoltaic element having excellent characteristics.

EXAMPLES 9-1 TO 9-6 AND COMPARATIVE EXAMPLES 6-1 AND 6-2

1. The procedures of Example 7 until the crystallization in the crystallization vacuum vessel 1221 were repeated except for the following point.

After forming an n-type amorphous silicon semiconductor layer having a thickness of 30 nm on the web substrate 1204 in the semiconductor layer-forming vacuum vessel 1211 and forming an i-type amorphous silicon semiconductor layer having a thickness of 30 nm on the n-type amorphous silicon semiconductor layer to form a two-layered structure on the web substrate, in the crystallization vacuum vessel 1221, the two-layered structure on the web substrate 1204 was subjected to a heat treatment by changing the substrate temperature by means of the lamp heater unit 1225 in four different ways, whereby four primary layer samples (Example 9-1, Example 9-2, Example 9-3, and Comparative Example 6-1) were obtained.

2. The procedures of Example 7 including the procedures described in the above 1 were repeated to sequentially form (a) a p-i-n junction type photovoltaic element containing a primary layer of Example 9-1, (b) a p-i-n type photovoltaic element containing a primary layer of Example 9-2, (c) a p-i-n type photovoltaic element containing a primary layer of Example 9-3, and (c) a p-i-n type photovoltaic element containing a primary layer of Comparative Example 6-1 on the web substrate 1204.

A portion of the web substrate having one of the p-i-n type photovoltaic elements was cut to obtain a plurality of photovoltaic elements having a size of 36 cm×22 cm. And each of the photovoltaic elements was processed into a photovoltaic element module by a conventional method.

In this way, there were obtain a sample group as Example 9-4, a sample group as Example 9-5, a sample group as Example 9-6, and a sample group as Comparative Example 6-2, respectively comprising a plurality of photovoltaic element modules.

Evaluation

1. For each of the four primary layer samples (Example 9-1, Example 9-2, Example 9-3, and Comparative Example 6-1), there was examined a Raman scattering intensity ratio between the amorphous component and the crystalline component of the primary layer.

The examined results are shown in Table 7 by normalizing the value of Example 9-1 at 1.0.

2. For each of the four sample groups (Example 9-4, Example 9-5, Example 9-6, and Comparative Example 6-2), there was evaluated an average photoelectric conversion efficiency using a solar simulator (AM 1.5, 100 mW/cm$^2$).

The evaluated results are shown in Table 7 by normalizing the average photoelectric conversion efficiency of Example 9-4 at 1.

Based on the results shown in Table 7, it is understood that a photovoltaic element module in which for the primary layer, the Raman scattering intensity based on the amorphous component is less than that based on the crystalline component exhibits a satisfactory photoelectric conversion efficiency. Thus, it is understood that according to the present invention, it is possible to mass-produce a p-i-n type photovoltaic element having excellent characteristics.

EXAMPLE 10

Figure 10:
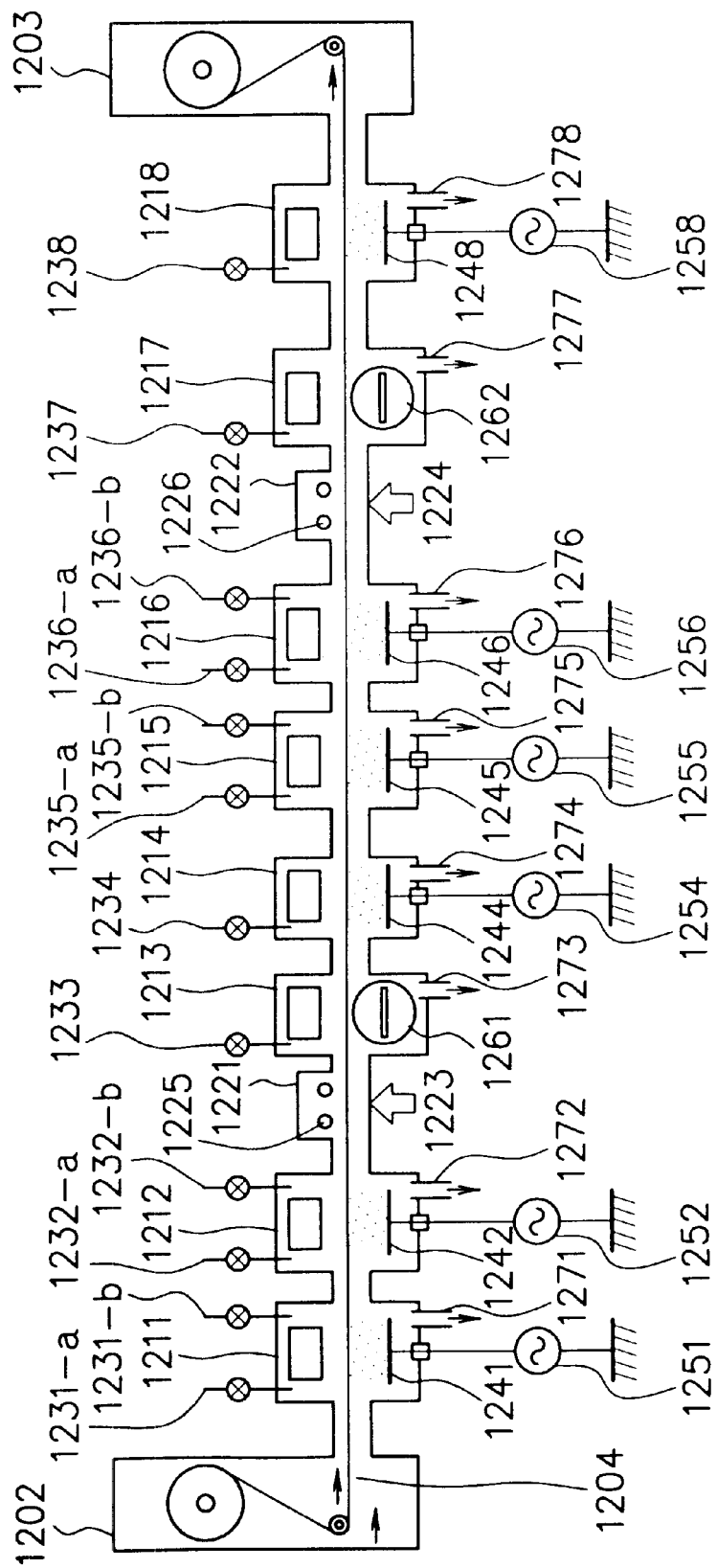
FIG. 10 is a schematic diagram illustrating a further example of a film-forming apparatus suitable for forming a semiconductor layer in the production of a photovoltaic element of the present invention.

In this example, there was prepared a photovoltaic element having a double cell structure having two p-i-n junctions shown in FIG. 11 using a roll-to-roll type film-forming apparatus shown in FIG. 10 which is a partial modification of the film-forming apparatus shown in FIG. 7 in that the high frequency power application means in the semiconductor layer-forming vacuum chamber 1213 of the apparatus shown FIG. 7 is replaced by a microwave power applicator 1261 which is connected to a microwave power source (not shown) and the high frequency power application means in the semiconductor layer-forming vacuum chamber 1217 of the apparatus shown in FIG. 7 is replaced by a microwave power applicator 1262 which is connected to a microwave power source (not shown).

The photovoltaic element shown in FIG. 11 is a modification of the photovoltaic element shown in FIG. 9 in that on the stacked semiconductor layer in FIG. 9 (which functions as a bottom cell in this example) comprising a primary layer 1102-1 (comprising an n-type amorphous semiconductor layer 1102-1A and a crystalline-phase containing n-type semiconductor layer 1102-1B stacked), a crystalline phase-containing i-type semiconductor layer 1102-2, and a microcrystalline p-type semiconductor layer 1102-3 stacked in this order, there is stacked a stacked semiconductor layer (as a top cell) comprising a primary layer 1102-4 (comprising an n-type amorphous semiconductor layer 1102-4A and a crystalline-phase containing n-type semiconductor layer 1102-4B stacked) a crystalline phase-containing i-type semiconductor layer 1102-5, and a microcrystalline p-type semiconductor layer 1102-6 stacked in this order.

In this example, the preparation of the photovoltaic element using the film-forming apparatus shown in FIG. 10 was conducted as will be described below.

In this example, each of the bottom cell and the top cell was formed under film-forming conditions shown in Table 4 except for changing the film-forming conditions for forming the i-type semiconductor (1102-2, 1102-5) in each of the bottom cell and the top cell in the semiconductor layer-forming vacuum vessel (1213, 1217) to film-forming conditions, i.e., raw material gas is SiF$_4$ gas at a flow rate of 50 sccm, dilution gas is H$_2$ gas at a flow rate of 300 sccm, substrate temperature is 400° C., and inner pressure is 100 mTorr.

As well as in Example 6-1, there was provided a bobbin having a web substrate 1204 (having a 100 nm thick Al film as a metal layer and a 1200 nm thick zinc oxide (ZnO) film as a transparent electrically conductive layer sequentially formed thereon) wound thereon in a roll form.

The bobbin was arranged in the substrate delivery vacuum vessel 1202 of the film-forming apparatus shown in FIG. 10. As well as in Example 6-1, from the bobbin (that is, the pay-out bobbin in the substrate delivery vacuum vessel 1202), the web substrate 1204 was paid out and delivered from the substrate delivery vacuum vessel 1202, followed by passing through the semiconductor layer-forming vacuum vessels 1211–1218, to enter in the substrate take-up vacuum vessel 1203 where the beginning portion of the web substrate 1204 was fixed to and wound on the take-up bobbin. And the transportation system of the web substrate 1204 was adjusted so that the web substrate could be continuously and smoothly transported from the substrate delivery vacuum vessel 1202 to the substrate take-up vacuum vessel 1203 without being distorted or warped.

Each of the substrate delivery vacuum vessel 1202, the semiconductor layer-forming vacuum vessels 1211–1218, the crystallization vacuum vessels 1221 and 1222, and the substrate take-up vacuum vessel 1203 was evacuated until the inner pressure reached to less than 5×10$^{-6}$ Torr by actuating the exhaustion system.

While continuing this evacuation, as well as in Example 7, prescribed raw material gas and dilution gas were Introduced into each of the semiconductor layer-forming vacuum vessels 1211–1218 through the gas introduction pipes 1231-*a* and 1231-*b* for the semiconductor layer-forming vacuum vessel 1211, the gas introduction pipes 1232-*a* and 1232-*b* for the semiconductor layer-forming vacuum vessel 1212, the gas introduction pipe 1233 for the semiconductor layer-forming vacuum vessel 1213, the gas introduction pipe 1234 for the semiconductor layer-forming vacuum vessel 1214, the gas introduction pipes 1235-*a* and 1235-*b* for the semiconductor layer-forming vacuum vessel 1215, the gas introduction pipes 1236-*a* and 1236-*b* for the semiconductor layer-forming vacuum vessel 1216, the gas introduction pipe 1237 for the semiconductor layer-forming vacuum vessel 1217, and the gas introduction pipe 1238 for the semiconductor layer-forming vacuum vessel 1218 under prescribed conditions shown. In this case, $H_2$ gas as a gate gas was flown into each gas gate at a flow rate of 500 sccm through a gate gas introduction pipe (not shown). While maintaining this state, the inner pressure of each of the semiconductor layer-forming vacuum vessels 1211–1218 was adjusted to and maintained at a prescribed pressure. In addition, the heating unit In each of the semiconductor layer-forming vacuum vessels 1211–1218 was regulated so that the web substrate 1204 became to have a prescribed substrate temperature therein. After the inner pressure of each of the semiconductor layer-forming vacuum vessels 1211–1218 became stable at aforesaid pressure, the web substrate 1204 was started moving from the substrate delivery vacuum vessel 1202 toward the substrate take-up vacuum vessel 1203.

Then, a high frequency power with a frequency of 13.56 MHz and having a wattage of 5 mW/cm$^3$ from the high frequency power source 1251 was introduced into the discharge space of the semiconductor layer-forming vacuum vessel 1211 through the high frequency power application electrode 1241 to generate glow discharge whereby forming an n-type amorphous silicon semiconductor layer having a thickness of 30 nm on the web substrate 1204, and a high frequency power with a frequency of 13.56 MHz and having a wattage of 5 mW/cm$^3$ from the high frequency power source 1252 was introduced into the discharge space of the semiconductor layer-forming vacuum vessel 1212 through the high frequency power application electrode 1242 to generate glow discharge thereby forming an i-type amorphous silicon semiconductor layer having a thickness of 30 nm on the n-type amorphous silicon semiconductor layer formed on the web substrate 1204, where a two-layered structure comprising the n-type amorphous silicon semiconductor layer and the i-type amorphous silicon semiconductor layer stacked in this order was formed on the web substrate 1204. In the crystallization vacuum vessel 1221, the two-layered structure formed on the web substrate 1204 was subjected to a crystallization treatment by means of XeCl excimer laser (pulse energy: 150 mJ/cm$^2$) to crystallize part of the two-layered structure on the web substrate to form a layered structure having an n-type semiconductor layer and a crystalline phase-containing n-type semiconductor layer sequentially stacked as a primary layer. Successively, in the semiconductor layer-forming vacuum vessel 1213, a high frequency power (a microwave power) with a frequency of 2.45 GHz and having a wattage of 50 mW/cm$^3$ was introduced into the discharge space of the semiconductor layer-forming vacuum vessel 1213 through the microwave power applicator 1261 to generate glow discharge whereby forming a crystalline phase-containing i-type semiconductor layer having a thickness of 2.0 µm on the primary layer on the web substrate 1204. In the semiconductor layer-forming vacuum vessel 1214, a high frequency power with a frequency of 13.56 MHz and having a wattage of 30 mW/cm$^3$ from the high frequency power source 1254 was introduced into the discharge space of the semiconductor layer-forming vacuum vessel through the high frequency power application electrode 1244 to generate glow discharge whereby forming a microcrystalline p-type semiconductor layer having a thickness of 10 nm on the crystalline phase-containing i-type semiconductor layer on the web substrate 1204 to form a bottom cell.

Successively, in the semiconductor layer-forming vacuum vessel 1215, a high frequency power with a frequency of 13.56 MHz and having a wattage of 5 mW/cm$^3$ from the high frequency power source 1255 was introduced into the discharge space of the semiconductor layer-forming vacuum vessel through the high frequency power application electrode 1245 to generate glow discharge whereby forming an n-type amorphous silicon semiconductor layer having a thickness of 30 nm on the microcrystalline p-type semiconductor layer of the bottom, cell, and a high frequency power with a frequency of 13.56 MHz and having a wattage of 5 mW/cm$^3$ from the high frequency power source 1256 was introduced into the discharge space of the semiconductor layer-forming vacuum vessel 1216 through the high frequency power application electrode 1246 to generate glow discharge thereby forming an i-type amorphous silicon semiconductor layer having a thickness of 30 nm on the n-type amorphous silicon semiconductor layer formed on the microcrystalline p-type semiconductor layer of the bottom cell, where there was formed a two-layered structure comprising the n-type amorphous silicon semiconductor layer and the i-type amorphous silicon semiconductor layer stacked in this order. In the crystallization vacuum vessel 1222, the two-layered structure was subjected to a crystallization treatment by means of XeCl excimer laser (pulse energy: 150 µmJ/cm$^2$) to crystallize part of the two-layered structure on the web substrate to form a layered structure having an n-type semiconductor layer, and a crystalline phase-containing n-type semiconductor layer sequentially stacked as a second primary layer. Successively, in the semiconductor layer-forming vacuum vessel 1217, a high frequency power (a microwave power) with a frequency of 2.45 GHz and having a wattage of 50 mW/cm$^3$ was introduced into the discharge space of the semiconductor layer-forming vacuum vessel 1217 through the microwave power applicator 1262 to generate glow discharge whereby forming a crystalline phase-containing i-type semiconductor layer having a thickness of 12 µm on the second primary layer on the web substrate 1204. In the semiconductor layer-forming vacuum vessel 1218, a high frequency power with a frequency of 13.56 MHz and having a wattage of 30 mW/cm$^3$ from the high frequency power source 1258 was introduced into the discharge space of the semiconductor layer-forming vacuum vessel through the high frequency power application electrode 1248 to generate glow discharge whereby forming a microcrystalline p-type semiconductor layer having a thickness of 10 nm on the crystalline phase-containing i-type semiconductor layer to form a top cell.

The web substrate 1204 thus treated was taken out from the apparatus, and an ITO film having a thickness of 70 nm as a second transparent electrically conductive layer was formed on the microcrystalline p-type semiconductor layer of the top cell by a conventional sputtering method.

Thus, a photovoltaic element having such layer constitution as shown in FIG. 11 (without having a collecting electrode) was formed on the web substrate 1204.

The web substrate having the photovoltaic element was cut to obtain a plurality of photovoltaic elements having a size of 36 cm×22 cm. Each of the photovoltaic elements was processed into a photovoltaic element module by a conventional method. Thus, there were obtained a plurality of photovoltaic element modules.

For the resultant photovoltaic element modules, there was evaluated an average photoelectric conversion efficiency using a solar simulator (AM 1.5, 100 mW/cm$^2$).

The average photoelectric conversion efficiency of the photovoltaic element modules obtained in this example was found to be 1.2 times that of the photovoltaic element modules obtained in Example 7.

Further, the photovoltaic elements and the photovoltaic element modules obtained in this example were evaluated in the same manner as in Example 8. As a result, it was found that the photovoltaic element modules including the photovoltaic elements obtained in this example are satisfactory in terms of the adhesion, the initial photoelectric conversion efficiency, and the durability in both the temperature-humidity cycle test and the light degradation test. Thus, it is understood that according to the present invention, it is possible to mass-produce a photovoltaic element having a double cell structure with two p-i-n junctions which has excellent characteristics.

Separately, in the above examples, there have been described n-type as the first conduction type and p-type as the second conduction type. This is not limitative. It is possible to use p-type as the first conduction type and n-type as the second conduction type.

As described in the above, according to the present invention, for a photovoltaic element whose semiconductor layer having a crystalline phase-containing semiconductor layer which is produced by means of a plasma CVD method using a high frequency power, by adopting a structure having a p-i-n junction which comprises a primary layer comprising an amorphous semiconductor layer having a first conduction type and a crystalline phase-containing semiconductor having a first conduction type sequentially stacked, a crystalline phase-containing i-type semiconductor layer, and a non-single crystal semiconductor layer having a second conduction type which are sequentially stacked wherein the crystalline phase-containing semiconductor layer of the primary layer contains crystalline phases (crystalline particles) such that their size magnitude is increased toward the crystalline phase-containing i-type semiconductor layer, there are provided pronounced advantages such that a semiconductor layer containing high quality crystalline phases (crystalline particles) can be formed without damaging said primary layer to be formed, said crystalline-phase i-type semiconductor layer can be formed so as to contains crystalline phases (crystalline particles) having a large size magnitude while diminishing a detect density, and the interface between the primary layer and the crystalline-phase i-type semiconductor layer can be made to have an improved property. Because of this, there can be attain a photovoltaic element having satisfactory photoelectric conversion characteristics and which excels In environmental resistance.

TABLE 1

| | laser power (mJ/cm$^2$) | open-circuit voltage | short circuit current | fill factor | photoelectric conversion efficiency |
|---|---|---|---|---|---|
| Comparative Example 1A | 0 | 1.00 | 1.00 | 1.00 | 1.00 |
| Example 1 | 150 | 0.96 | 1.16 | 0.99 | 1.11 |
| Example 2 | 200 | 0.95 | 1.13 | 1.00 | 1.08 |
| Comparative Example 1B | 300 | 0.85 | 0.96 | 0.80 | 0.65 |

TABLE 2

| | deposition time of the second semiconductor layer (sec.) | open-circuit voltage | short circuit current | fill factor | photoelectric conversion efficiency |
|---|---|---|---|---|---|
| Comparative Example 2A | 0 | 0.99 | 1.01 | 0.99 | 1.00 |
| Example 3 | 32 | 0.97 | 1.10 | 1.00 | 1.08 |
| Example 3 | 145 | 0.95 | 1.13 | 1.00 | 1.08 |
| Example 3 | 180 | 0.94 | 1.11 | 0.98 | 1.03 |
| Comparative Example 2B | 215 | 0.91 | 1.08 | 0.98 | 0.97 |

TABLE 3

| film-forming conditions | gas feed pipe | raw material gas and its flow rate |
|---|---|---|
| in the vacuum vessel 1211 (Example 6-1 and Comparative Example 3) | 1231-a | SiH$_4$: 10 sccm<br>H$_2$: 50 sccm<br>PH$_3$ (diluted to 2% by H$_2$): 15 sccm |
| | 1231-b | SiH$_4$: 10 sccm<br>H$_2$: 50 sccm<br>PH$_3$ (diluted to 2% by H$_2$): 15 sccm |
| | substrate temperature | 300° C. |
| | inner pressure | 1.0 Torr |
| film-forming conditions in the vacuum vessel 1211 (Example 6-2) | gas feed pipe 1231-a | raw material gas and its flow rate<br>SiH$_4$: 10 scccm<br>H$_2$: 50 sccm<br>PH$_3$ (diluted to 2% by H$_2$): 25 sccm |
| | 1231-b | SiH$_4$: 10 sccm<br>H$_2$: 50 sccm<br>PH$_3$ (diluted to 2% by H$_2$): 5 sccm |
| | substrate temperature | 300° C. |
| | inner pressure | 1.0 Torr |
| film-forming conditions in the vacuum vessel 1212 (Example 6-1 and Comparative Example 3) | gas feed pipe 1232-a | raw material gas and its flow rate<br>SiH$_4$: 20 sccm<br>H$_2$: 100 sccm |
| | 1232-b | SiH$_4$: 20 sccm<br>H$_2$: 100 sccm |
| | substrate temperature | 300° C. |
| | inner pressure | 1.0 Torr |
| film-forming conditions in the vacuum vessel 1212 (Example 6-2) | gas feed pipe 1232-a | raw material gas and its flow rate<br>SiH$_4$: 20 sccm<br>H$_2$: 100 sccm |
| | 1232-b | SiH$_4$: 20 sccm<br>H$_2$: 100 sccm |
| | substrate temperature | 300° C. |
| | inner pressure | 1.0 Torr |
| film-forming conditions in the vacuum vessel 1213 | raw material gas and its flow rate | SiH$_4$: 30 sccm<br>H$_2$: 1000 sccm |
| | substrate temperature | 300° C. |
| | inner pressure | 300 mTorr |

TABLE 4

| film-forming conditions in the vacuum vessel 1211 | gas feed pipe 1231-a | raw material gas and its flow rate SiH$_4$: 20 sccm H$_2$: 100 sccm PH$_3$ (diluted to 2% by H$_2$): 25 sccm |
| --- | --- | --- |
| | 1231-b | SiH$_4$: 20 sccm H$_2$: 100 sccm PH$_3$ (diluted to 2% by H$_2$): 5 sccm |
| | substrate temperature | 300° C. |
| | inner pressure | 1.0 Torr |
| film-forming conditions in the vacuum vessel 1212 | gas feed pipe 1232-a | raw material gas and its flow rate SiH$_4$: 10 sccm H$_2$: 50 sccm |
| | 1232-b | SiH$_4$: 10 sccm H$_2$: 50 sccm |
| | substrate temperature | 300° C. |
| | inner pressure | 1.0 Torr |
| film-forming conditions in the vacuum vessel 1213 | raw material gas and its flow rate | SiH$_4$: 30 sccm H$_2$: 1000 sccm |
| | substrate temperature | 300° C. |
| | inner pressure | 300 mTorr |
| film-forming conditions in the vacuum vessel 1214 | raw material gas and its flow rate | SiH$_4$: 10 sccm H$_2$: 800 sccm BF$_3$ (diluted to 2% by H$_2$): 100 sccm |
| | substrate temperature | 200° C. |
| | inner pressure | 1.2 Torr |

TABLE 5

| film-forming conditions in the vacuum vessel 1211 | gas feed pipe 1231-a | raw material gas and its flow rate SiH$_4$: 10 sccm H$_2$: 50 sccm PH$_3$ (diluted to 2% by H$_2$): 15 sccm |
| --- | --- | --- |
| | 1231-b | SiH$_4$: 10 sccm H$_2$: 50 sccm PH$_3$ (diluted to 2% by H$_2$): 15 sccm |
| | substrate temperature | 300° C. |
| | inner pressure | 1.0 Torr |
| film-forming conditions in the vacuum vessel 1212 | gas feed pipe 1232-a | raw material gas and its flow rate SiH$_4$: 5 sccm H$_2$: 500 sccm PH$_3$ (diluted to 2% by H$_2$): 25 sccm |
| | 1232-b | SiH$_4$: 5 sccm H$_2$: 500 sccm PH$_3$ (diluted to 2% by H$_2$): 5 sccm |
| | substrate temperature | 300° C. |
| | inner pressure | 200 mTorr |
| film-forming conditions in the vacuum vessel 1213 | raw material gas and its flow rate | SiH$_4$: 30 sccm H$_2$: 1000 sccm |
| | substrate temperature | 300° C. |
| | inner pressure | 300 mTorr |
| film-forming conditions in the vacuum vessel 1214 | raw material gas and its flow rate | SiH$_4$: 10 sccm H$_2$: 800 sccm BF$_3$ (diluted to 2% by H$_2$): 100 sccm |
| | substrate temperature | 200° C. |
| | inner pressure | 1.2 Torr |

TABLE 6

| | Example 8 | Comparative Example 5 |
| --- | --- | --- |
| initial photoelectric conversion efficiency | 1 | 0.9 |
| survival number in lattice pattern cutting test (the value in Example 8 is set at 1) | 1 | 0.95 |
| change of photoelectric conversion efficiency in temperature-humidity cycle test (the efficiency after endurance/the initial efficiency) | 1.0 | 0.95 |
| change of photoelectric conversion efficiency in light degradation test (the efficiency after endurance/the initial efficiency) | 1.0 | 0.95 |

TABLE 7

| | Example 9-1 | Example 9-2 | Example 9-3 | Comparative Example 6-1 |
| --- | --- | --- | --- | --- |
| Raman scattering intensity ratio (amorphous component/ crystalline component) | 1.0 | 1.5 | 2.0 | 0.5 |

| | Example 9-4 | Example 9-5 | Example 9-6 | Comparative Example 6-2 |
| --- | --- | --- | --- | --- |
| photoelectric conversion efficiency | 1 | 1.05 | 1.10 | 0.88 |

What is claimed is:

1. A photovoltaic element having a stacked structure comprising a first semiconductor layer containing no crystalline phase, a second semiconductor layer containing approximately spherical microcrystalline phases, and a third semiconductor layer containing pillar microcrystalline phases which are stacked in this order, wherein said spherical microcrystalline phases of said second semiconductor layer on the side of said third semiconductor layer have an average size which is greater than that of said spherical microcrystalline phases of said second semiconductor layer on the side of said first semiconductor layer.

2. A photovoltaic element according to claim 1, wherein each of said first semiconductor layer, said second semiconductor layer and said third semiconductor layer comprises a hydrogen-containing silicon material, a hydrogen-containing silicon-germanium material, a hydrogen-containing silicon carbide material, or a mixture of these as a main constituent.

3. A photovoltaic element having a stacked structure comprising a first semiconductor layer containing no crystalline phase, a second semiconductor layer containing approximately spherical microcrystalline phases, and a third semiconductor layer containing pillar microcrystalline phases which are stacked in this order, wherein said third semiconductor layer has a layer region containing approximately spherical microcrystalline phases mingled together with said pillar microcrystalline phases in the vicinity of said second semiconductor layer.

4. A photovoltaic element according to claim 3, wherein each of said first semiconductor layer, said second semiconductor layer and said third semiconductor layer comprises a hydrogen-containing silicon material, a hydrogen-containing silicon-germanium material, a hydrogen-containing silicon carbide material, or a mixture of these as a main constituent.

5. A process for producing a photovoltaic element, comprising the steps of:

(a) forming a first semiconductor layer containing no crystalline phase but containing a desired amount of a doping element on a substrate, (b) forming a second semiconductor layer containing no crystalline phase and containing no doping element or a trace amount of a doping element on said first semiconductor layer to obtain a layered product, (c) laser-annealing said layered product from the side of said second semiconductor layer side by way of irradiation of laser beam with a desired intensity to microcrystallize only said second semiconductor layer so as to contain approximately spherical microcrystalline phases such that said spherical microcrystalline phases situated on the laser-irradiated side have an average size which is greater than that of said spherical microcrystalline phases situated on the side of said first semiconductor layer, and (d) forming a third semiconductor layer containing pillar microcrystalline phases on said microcrystallized second semiconductor layer.

6. A process for producing a photovoltaic element according to claim 5, wherein said laser beam is irradiated at an intensity of 100 to 250 mJ/cm$^2$.

7. A process for producing a photovoltaic element according to claim 5, wherein said second semiconductor layer is formed at a deposition time of 30 to 200 seconds.

8. A process for producing a photovoltaic element, comprising the steps of:

(a) forming a first semiconductor layer containing no crystalline phase on a substrate, (b) forming a second semiconductor layer containing approximately spherical microcrystalline phases on said first semiconductor layer, and (c) forming a third semiconductor layer containing pillar microcrystalline phases on said second semiconductor layer, wherein in the course of forming said second semiconductor layer in the step (b), a dilution ratio of a film-forming raw material by a hydrogen gas is increased to form said spherical microcrystalline phases contained in said second semiconductor layer such that said spherical microcrystalline phases situated on the side of said third semiconductor layer have an average size which is greater than that of said spherical microcrystalline phases situated on the side of said first semiconductor layer.

9. A process for producing a photovoltaic element, comprising the steps of:

(a) forming a first semiconductor layer containing no crystalline phase on a substrate, (b) forming a second semiconductor layer containing approximately spherical microcrystalline phases on said first semiconductor layer, and (c) forming a third semiconductor layer containing pillar microcrystalline phases on said second semiconductor layer, wherein in the course of forming said second semiconductor layer in the step (b), a temperature of forming said second semiconductor layer is increased to form said spherical microcrystalline phases contained in said second semiconductor layer such that said spherical microcrystalline phases situated on the side of said third semiconductor layer have an average size which is greater than that of said spherical microcrystalline phases situated on the side of said first semiconductor layer.

10. A building material having a photovoltaic element defined in claim 1, characterized in that said photovoltaic element and a back face reinforcing member are integrally sealed.

11. A power generation apparatus comprising a photovoltaic element defined in claim 1 and a power converting means for converting a power generated by said photovoltaic element into a desired power.

12. A photovoltaic element comprising at least a first transparent electrically conductive layer formed on a substrate, a silicon series semiconductor layer having at least one p-i-n junction stacked on said first transparent electrically conductive layer, and a second transparent electrically conductive layer stacked on said silicon series semiconductor layer, characterized in that said silicon series semiconductor layer has a p-i-n junction structure which comprises a primary layer comprising an amorphous semiconductor layer having a first conduction type and a crystalline phase-containing semiconductor layer having a first conduction type sequentially stacked, a crystalline phase-containing i-type semiconductor layer, and a non-single crystal semiconductor layer having a second conduction type which are sequentially stacked, wherein said crystalline phase-containing semiconductor layer of said primary layer contains crystalline phases such that their size magnitude is increased toward said crystalline phase-containing i-type semiconductor layer.

13. A photovoltaic element according to claim 12, wherein said primary layer is formed by providing a stacked body comprising a doped amorphous layer and a non-doped amorphous layer sequentially stacked, and subjecting said stacked body to a crystallization treatment to crystallize part of said stacked body.

14. A photovoltaic element according to claim 13, wherein said crystallization treatment is a crystallization treatment by way of laser radiation.

15. A photovoltaic element according to claim 13, wherein said crystallization treatment is a crystallization treatment by way of heat treatment.

16. A photovoltaic element according to claim 12, wherein said primary layer has a Raman scattering intensity owing to an amorphous component constituting said primary layer which is smaller than that owing to a crystalline component constituting said primary layer.

17. A photovoltaic element according to claim 12, wherein said primary layer has a dopant concentration gradient which is decreased toward said crystalline phase-containing i-type semiconductor layer.

18. A photovoltaic element according to claim 12, wherein said silicon series semiconductor layer is formed by means of a plasma CVD method using a high frequency power.

19. A photovoltaic element according to claim 18, wherein said high frequency power is a high frequency power with a frequency in a range of 10 MHz to 10 GHz.

20. A photovoltaic element according to claim 12, wherein said substrate comprises an electrically conductive substrate.

21. A photovoltaic element according to claim 12, wherein when the thickness of said crystalline phase-containing semiconductor layer of said primary layer is made to be "d" and of crystalline phases contained in said crystalline phase-containing semiconductor layer, a crystalline phase portion having the longest length is made to be "r"; a value of r/d is less than 100.

22. A process for producing a photovoltaic element having at least a first transparent electrically conductive layer formed on a substrate, a silicon series semiconductor layer having at least one p-i-n junction stacked on said first transparent electrically conductive layer, and a second transparent electrically conductive layer stacked on said silicon series semiconductor layer, characterized in that said silicon series semiconductor layer is formed by a method comprising the steps of:

(a) forming a primary layer by sequentially forming an amorphous semiconductor layer having a first conduction type and a crystalline phase-containing semiconductor layer having a first conduction type, and (b) sequentially forming a crystalline phase-containing i-type semiconductor layer and a non-single crystal semiconductor layer having a second conduction type on said primary layer, wherein in said step (a), said crystalline phase-containing semiconductor layer having a first conduction type is formed to contain crystalline phases such that their size magnitude is increased toward said crystalline phase-containing i-type semiconductor layer.

23. The process according to claim 22, wherein said primary layer is formed by sequentially forming a doped amorphous layer and a non-doped amorphous layer to obtain a stacked body, and subjecting said stacked body to a crystallization treatment to crystallize part of said stacked body.

24. The process according to claim 23, wherein said crystallization treatment is a crystallization treatment by way of laser radiation.

25. The process according to claim 23, wherein said crystallization treatment is a crystallization treatment by way of heat treatment.

26. The process according to claim 22, wherein said primary layer is formed such that it has a Raman scattering intensity owing to an amorphous component constituting said primary layer which is smaller than that owing to a crystalline component constituting said primary layer.

27. The process according to claim 22, wherein said primary layer is formed such that it has a dopant concentration gradient which is decreased toward said crystalline phase-containing i-type semiconductor layer.

28. The process according to claim 22, wherein said silicon series semiconductor layer is formed by means of a plasma CVD method using a high frequency power.

29. The process according to claim 28, wherein said high frequency power is a high frequency power with a frequency in a range of 10 MHz to 10 GHz.

30. The process according to claim 22, wherein said substrate comprises an electrically conductive substrate.

31. The process according to claim 22, wherein when the thickness of said crystalline phase-containing semiconductor layer of said primary layer is made to be "d" and of crystalline phases contained in said crystalline phase-containing semiconductor layer, a crystalline phase portion having the longest length is made to be "r"; a value of r/d is less than 100.

* * * * *

UNITED STATES PATENT AND TRADEMARK OFFICE
CERTIFICATE OF CORRECTION

PATENT NO. : 6,472,248 B2
DATED : October 29, 2002
INVENTOR(S) : Atsushi Shiozaki et al.

It is certified that error appears in the above-identified patent and that said Letters Patent is hereby corrected as shown below:

Title page,
Item [30], Foreign Application Priority Data, "Jul. 4, 1999" should read
-- Jul. 14, 1999 --.

Column 1,
Line 15, "cells" should read -- cell, --;
Line 25, "using" should read -- used --;
Line 32, "conducting" should read -- conducted --;
Line 38, "carrying" should read -- carried --;
Lines 39 and 43, "meant" should be deleted;
Lines 58 and 62, "als.," should read -- al., --; and
Line 64, "there are described that" should read -- it is described how --.

Column 2,
Line 8, "element" should read -- element. --; and
Lines 14 and 61, "als.," should read -- al., --.

Column 3,
Line 57, "is stably" should read -- stably --; and
Line 58, "sever" should read -- severe --.

Column 5,
Line 55, "DESCRITION" should read -- DESCRIPTION --;
Line 63, "is stably" should read -- is stably --; and
Line 64, "sever" should read -- severe --.

Column 6,
Line 16, "comprises" should read -- comprise --;
Line 22, "element" should read -- element. --; and
Lines 52 and 65, "side has" should read -- side have --.

Column 8,
Line 21, "being provided with irregularities obtain" should read -- is provided with irregularities obtained --.

Column 9,
Line 8, "radial" should read -- radical --; and
Line 12, "until" should read -- to --.

Column 10,
Line 28, "a plasma" should read -- of a plasma --.

UNITED STATES PATENT AND TRADEMARK OFFICE
CERTIFICATE OF CORRECTION

PATENT NO. : 6,472,248 B2
DATED : October 29, 2002
INVENTOR(S) : Atsushi Shiozaki et al.

It is certified that error appears in the above-identified patent and that said Letters Patent is hereby corrected as shown below:

Column 11,
Line 30, "an uniform" should read -- a uniform --.

Column 12,
Line 20, "to" should read -- to describe --; and
Line 22, "is meant" should read -- means --.

Column 14,
Line 20, "such" should read -- to such a --.

Column 15,
Line 14, "cross-liking" should read -- cross-linking --;
Line 17, "element," should read -- element --; and "&" should be deleted;
Line 19, "being" should read -- is being --; and
Line 27, "to reach" should read -- that reaches --.

Column 16,
Line 60, "lords," should read -- loads, --; and
Line 63, "an D.C." should read -- a D.C. --.

Column 17,
Line 2, "an D.C." should read -- a D.C. --;
Line 28, "perform" should read -- performs --; and
Line 31, "whereby" should read -- thereby --.

Column 18,
Line 10, "have" should read -- has --;
Line 18, "layer" should read -- layer. --;
Line 52, "there" should read -- it --; and
Line 53, "it an effective manner" should read -- an effective manner --.

Column 19,
Line 2, "such" should read -- to be --;
Line 11, "becomes" should read -- comes --.

Column 20,
Line 6, "p-n" should read -- p-i-n --;
Line 10, "are" should read -- do not permit --;
Line 11, "prevented so that" should be deleted; and "is" should read -- to be --;
Line 12, "not" should be deleted; and
Line 31, "there is considered it" should read -- it is considered --.

UNITED STATES PATENT AND TRADEMARK OFFICE
CERTIFICATE OF CORRECTION

PATENT NO.    : 6,472,248 B2
DATED         : October 29, 2002
INVENTOR(S)   : Atsushi Shiozaki et al.

It is certified that error appears in the above-identified patent and that said Letters Patent is hereby corrected as shown below:

Column 21,
Line 20, "an doped" should read -- a doped --; and
Line 57, "Us" should be deleted.

Column 22,
Line 1, "dopent" should read -- dopant --;
Lines 9 and 29, "magnitude being" should read -- magnitude is --;
Line 43, "whereby" should read -- thereby --; and
Line 51, "surf ace" should read -- surface --.

Column 23,
Line 2, "can" should read -- can be --; and
Line 56, "such" should read -- with such a --; and "Junction" should read -- junction --.

Column 25,
Line 2, "therein whereby" should read -- therein, thereby --;
Line 13, "layer whereby" should read -- layer, thereby --; and
Line 39, "radial" should read -- radical --.

Column 27,
Line 19, "to designed" should read -- to be designed --,
Line 56, "Introduction" should read -- introduction --; and
Line 65, "comprises" should read -- comprise --.

Column 28,
Line 20, "formation" should read -- formation of --;
Line 27, "is preferred" should read -- are preferred --; and
Line 41, "layer" should read -- layer. --.

Column 29,
Line 10, "gradient is" should read -- gradient --;
Line 12, "being" should read -- is --;
Line 13, "direction" should read -- direction. --; and
Line 60, "the, like" should read -- the like --.

Column 30,
Lines 26 and 41, "Kw" should read -- kW --; and
Line 40, "to" should read -- to, and --.

Column 32,
Line 26, "to be" should be deleted.

UNITED STATES PATENT AND TRADEMARK OFFICE
CERTIFICATE OF CORRECTION

PATENT NO. : 6,472,248 B2
DATED : October 29, 2002
INVENTOR(S) : Atsushi Shiozaki et al.

It is certified that error appears in the above-identified patent and that said Letters Patent is hereby corrected as shown below:

Column 34,
Line 34, "way" should read -- was --.

Column 36,
Line 12, "plasma-processed" should read -- plasma-processed. --.

Column 37,
Line 8, "an" should be deleted;
Line 9, "a unit are" should read -- unit area --; and
Line 53, "having a thickness of" should be deleted.

Column 38,
Line 50, "having" should read -- having been --.

Column 39,
Line 63, "having" should read -- being --; and
Line 67, "for which" should read -- having --.

Column 40,
Line 1, "were formed until" should be deleted; and "was" should read -- formed thereon was --;
Line 8, "not" should be deleted;
Line 21, "having" should read -- being --;
Line 31, "for which were formed until" should read -- having --;
Line 32, "4E" should read -- 4E formed thereon --;
Line 36, "magnitude of" should read -- magnitude --;
Line 45, "with their" should read -- of their --;
Line 57, "having" should read -- being --; and
Line 61, "ate" should read -- are --.

Column 41,
Lines 7 and 21, "with their" should read -- of their --.

Column 42,
Line 46, "substrates for which were" should read -- substrate having --;
Line 47, "formed until" should be deleted; and "4B" should read -- 4B formed thereon was --;
Line 57, "for which" should read -- which have --;
Line 58, "were formed until" should be deleted; and "4B was" should read -- 4B formed thereon were --.

Column 43,
Line 41, "having" should read -- being --.

UNITED STATES PATENT AND TRADEMARK OFFICE
CERTIFICATE OF CORRECTION

PATENT NO. : 6,472,248 B2
DATED : October 29, 2002
INVENTOR(S) : Atsushi Shiozaki et al.

It is certified that error appears in the above-identified patent and that said Letters Patent is hereby corrected as shown below:

Column 44,
Line 55, "substrate for which were" should read -- substrate having --;
Line 56, "formed until" should be deleted; and "4B" should read -- 4B formed thereon was --; and
Line 67, "substrate for which" should read -- substrates which have --.

Column 45,
Line 1, "were formed until" should be deleted; and "4B was" should read -- 4B formed thereon were --;
Line 38, "with their" should read -- of their --;
Line 50, "having" should read -- having been --; and
Line 67, "period," should read -- period --.

Column 46,
Line 51, "gas whereby" should read -- gas, whereby --.

Column 47,
Line 31, "each" should read -- each of the --; and
Line 46, "Delivered" should read -- delivered --.

Column 48,
Line 31, "flown" should read -- made to flow --;
Line 32, "agate" should read -- a gate --; and
Line 54, "discharge whereby" should read -- discharge, thereby --.

Column 49,
Line 12, "mW/cm," should read -- $mW/cm^3$ --;
Line 16, "discharge whereby" should read -- discharge, thereby --;
Line 28, "that" should read -- than that --;
Line 44, "crystalline" should read -- crystallinity --; and
Line 66, "structured" should read -- structure --.

Column 50,
Line 6, "being" should read -- is --;
Line 13, "subjecting" should read -- being subjected --;
Line 38, "crystalline" should read -- crystallinity --; and "having" should read -- which have --; and
Line 56, "substrates" should read -- substrate, --.

Column 51,
Line 7, "below" should read -- below. ¶ --; and
Line 48, "flown" should read -- made to flow --.

UNITED STATES PATENT AND TRADEMARK OFFICE
CERTIFICATE OF CORRECTION

PATENT NO. : 6,472,248 B2
DATED : October 29, 2002
INVENTOR(S) : Atsushi Shiozaki et al.

It is certified that error appears in the above-identified patent and that said Letters Patent is hereby corrected as shown below:

Column 52,
Line 4, "discharge whereby" should read -- discharge, thereby --;
Line 34, "whereby" should read -- thereby --; and
Line 43, "whereby" should read -- thereby --.

Column 54,
Line 12, "flown" should read -- made to flow --;
Line 17, "5)" should read -- 5). --; and
Lines 49 and 59, "discharge whereby" should read -- discharge, thereby --.

Column 55,
Line 67, "having" should read -- that were --.

Column 56,
Line 1, "test where" should read -- test, with --;
Lines 11 and 34, "endured" should read -- endurance-tested --;
Lines 15, 22 and 38, "endurance" should read -- endurance test, relative --;
Lines 20, 29 and 43, "having" should read -- that were --; and
Line 46, "to" should read -- test, relative to --.

Column 57,
Line 28, "obtain" should read -- obtained --.

Column 58,
Line 1, "shown" should read -- shown in --; and
Line 65, "Intro-" should read -- intro- --.

Column 59,
Lines 34 and 62, "discharge whereby" should read -- discharge, thereby --.

Column 60,
Lines 4, 15 and 44, "discharge whereby" should read -- discharge, thereby --; and
Line 54, "whereby" should read -- thereby --.

UNITED STATES PATENT AND TRADEMARK OFFICE
CERTIFICATE OF CORRECTION

PATENT NO. : 6,472,248 B2
DATED : October 29, 2002
INVENTOR(S) : Atsushi Shiozaki et al.

It is certified that error appears in the above-identified patent and that said Letters Patent is hereby corrected as shown below:

Column 61,
Line 48, "contains" should read -- contain --;
Line 53, "attain" should read -- attained --; and
Line 55, "In" should read -- in --.

Signed and Sealed this

Fourth Day of November, 2003

JAMES E. ROGAN
*Director of the United States Patent and Trademark Office*